(12) United States Patent
Williams et al.

(10) Patent No.: US 7,825,488 B2
(45) Date of Patent: Nov. 2, 2010

(54) ISOLATION STRUCTURES FOR INTEGRATED CIRCUITS AND MODULAR METHODS OF FORMING THE SAME

(75) Inventors: Richard K. Williams, Cupertino, CA (US); Donald Ray Disney, Cupertino, CA (US); Wai Tien Chan, Hong Kong (CN)

(73) Assignees: Advanced Analogic Technologies, Inc., Santa Clara, CA (US); Advanced Analogic Technologies (Hong Kong) Limited, Hong Kong (CN)

( * ) Notice: Subject to any disclaimer, the term of this patent is extended or adjusted under 35 U.S.C. 154(b) by 744 days.

(21) Appl. No.: 11/444,102

(22) Filed: May 31, 2006

(65) Prior Publication Data

US 2007/0278612 A1     Dec. 6, 2007

(51) Int. Cl.
H01L 23/58     (2006.01)
(52) U.S. Cl. ...................................... 257/500; 438/400
(58) Field of Classification Search .................. 257/500
See application file for complete search history.

(56) References Cited

U.S. PATENT DOCUMENTS

| | | | |
|---|---|---|---|
| 4,269,636 A | 5/1981 | Rivoli et al. ................ 438/359 |
| 4,454,647 A | 6/1984 | Joy et al. ....................... 29/576 |
| 4,478,655 A | 10/1984 | Nagakubo et al. ........... 148/175 |
| 4,655,875 A | 4/1987 | Wada et al. ................... 438/514 |
| 4,819,052 A | 4/1989 | Hutter ......................... 257/378 |
| 4,980,747 A | 12/1990 | Hutter et al. ................... 357/50 |
| 5,324,973 A | 6/1994 | Sivan .......................... 257/330 |
| 5,374,569 A | 12/1994 | Yilmaz et al. .................. 437/34 |
| 5,386,136 A | 1/1995 | Williams et al. ............. 257/409 |
| 5,410,175 A | 4/1995 | Kyomasu et al. ............. 257/458 |
| 5,420,061 A | 5/1995 | Manning ..................... 438/218 |
| 5,485,027 A | 1/1996 | Williams et al. ............. 257/343 |
| 5,506,431 A | 4/1996 | Thomas ................. 365/185.15 |
| 5,525,824 A | 6/1996 | Himi et al. ................... 257/370 |
| 5,557,135 A | 9/1996 | Hashimoto ................... 257/308 |
| 5,668,397 A | 9/1997 | Davis et al. .................. 257/520 |

(Continued)

FOREIGN PATENT DOCUMENTS

EP      0 589 675 A2     3/1994

(Continued)

OTHER PUBLICATIONS

U.S. Appl. No. 11/890,940, filed Aug. 2007, Williams et al.

(Continued)

*Primary Examiner*—Thao X Le
*Assistant Examiner*—Tanika Warrior
(74) *Attorney, Agent, or Firm*—Patentability Associates

(57) ABSTRACT

A variety of isolation structures for semiconductor substrates include a trench formed in the substrate that is filled with a dielectric material or filled with a conductive material and lined with a dielectric layer along the walls of the trench. The trench may be used in combination with doped sidewall isolation regions. Both the trench and the sidewall isolation regions may be annular and enclose an isolated pocket of the substrate. The isolation structures are formed by modular implant and etch processes that do not include significant thermal processing or diffusion of dopants so that the resulting structures are compact and may be tightly packed in the surface of the substrate.

3 Claims, 39 Drawing Sheets

U.S. PATENT DOCUMENTS

| | | | | |
|---|---|---|---|---|
| 5,684,305 | A | 11/1997 | Pearce | 257/48 |
| 5,807,783 | A | 9/1998 | Gaul et al. | 438/406 |
| 5,883,413 | A | 3/1999 | Ludikhuize | 257/343 |
| 5,892,264 | A | 4/1999 | Davis et al. | 257/511 |
| 5,914,523 | A | 6/1999 | Bashir et al. | 257/520 |
| 5,986,863 | A * | 11/1999 | Oh | 361/56 |
| 6,013,936 | A | 1/2000 | Colt | 257/506 |
| 6,130,458 | A | 10/2000 | Takagi et al. | 257/351 |
| 6,144,086 | A | 11/2000 | Brown et al. | 257/510 |
| 6,163,052 | A | 12/2000 | Liu et al. | 257/334 |
| 6,316,336 | B1 * | 11/2001 | Blanchard | 438/478 |
| 6,383,892 | B1 | 5/2002 | Colt | 438/457 |
| 6,559,505 | B1 | 5/2003 | Fallica | 257/350 |
| 6,657,262 | B2 * | 12/2003 | Patti | 257/370 |
| 6,740,958 | B2 * | 5/2004 | Nakazato et al. | 257/550 |
| 6,855,985 | B2 | 2/2005 | Williams et al. | 257/338 |
| 6,900,091 | B2 | 5/2005 | Williams et al. | 438/228 |
| 6,943,426 | B2 | 9/2005 | Williams et al. | 257/500 |
| 7,009,271 | B1 | 3/2006 | Thurgate et al. | 257/510 |
| 7,049,663 | B2 * | 5/2006 | Wang | 257/355 |
| 7,176,548 | B2 | 2/2007 | Williams et al. | 257/500 |
| 7,183,610 | B2 | 2/2007 | Pattanayak et al. | 257/333 |
| 7,268,045 | B2 | 9/2007 | Hower et al. | 438/282 |
| 2001/0000288 | A1 | 4/2001 | Oh | 257/409 |
| 2001/0013636 | A1 | 8/2001 | Dunn et al. | 257/565 |
| 2001/0015459 | A1 | 8/2001 | Watanabe et al. | 257/341 |
| 2002/0008299 | A1 | 1/2002 | Leonardi | 257/520 |
| 2002/0084506 | A1 | 7/2002 | Voldman et al. | 257/511 |
| 2003/0057498 | A1 | 3/2003 | Yamashita | 257/369 |
| 2003/0107103 | A1 | 6/2003 | Iwata et al. | 257/506 |
| 2003/0168712 | A1 | 9/2003 | Shin et al. | 257/510 |
| 2004/0026746 | A1 | 2/2004 | Nakazawa et al. | 257/374 |
| 2004/0032005 | A1 | 2/2004 | Williams et al. | 257/510 |
| 2004/0033666 | A1 | 2/2004 | Williams et al. | 438/297 |
| 2004/0071030 | A1 | 4/2004 | Goda et al. | 365/222 |
| 2005/0014324 | A1 | 1/2005 | Williams et al. | 438/200 |
| 2005/0014329 | A1 | 1/2005 | Williams et al. | 438/318 |
| 2005/0087805 | A1 | 4/2005 | Ning | 257/350 |
| 2005/0142724 | A1 | 6/2005 | Williams et al. | 438/199 |
| 2005/0142791 | A1 | 6/2005 | Williams et al. | 438/369 |
| 2005/0142792 | A1 | 6/2005 | Williams et al. | 438/369 |
| 2005/0158939 | A1 | 7/2005 | Williams et al. | 438/199 |
| 2005/0179093 | A1 | 8/2005 | Morris | 257/371 |
| 2005/0179111 | A1 | 8/2005 | Chao | 257/510 |
| 2005/0189606 | A1 | 9/2005 | Nakagawa | 257/500 |
| 2005/0272207 | A1 | 12/2005 | Williams et al. | 438/261 |
| 2005/0272230 | A1 | 12/2005 | Williams et al. | 438/510 |
| 2005/0287765 | A1 | 12/2005 | Onai et al. | 438/438 |
| 2006/0076629 | A1 | 4/2006 | Yilmaz | 257/378 |
| 2006/0175635 | A1 | 8/2006 | Arai et al. | 257/197 |
| 2006/0223257 | A1 | 10/2006 | Williams et al. | 438/202 |
| 2007/0013021 | A1 * | 1/2007 | Zhang | 257/500 |
| 2007/0132056 | A1 | 6/2007 | Williams et al. | 257/510 |
| 2007/0158779 | A1 | 7/2007 | Cannon et al. | 257/500 |
| 2007/0241421 | A1 | 10/2007 | Liu et al. | 257/510 |
| 2007/0278568 | A1 | 12/2007 | Williams et al. | 257/335 |
| 2008/0191277 | A1 | 8/2008 | Disney et al. | 257/327 |
| 2008/0197408 | A1 | 8/2008 | Disney et al. | 257/335 |
| 2008/0197445 | A1 | 8/2008 | Disney et al. | 257/272 |
| 2008/0197446 | A1 | 8/2008 | Disney et al. | 257/499 |
| 2008/0210980 | A1 | 9/2008 | Disney et al. | 257/204 |
| 2008/0213972 | A1 | 9/2008 | Disney et al. | 438/430 |
| 2008/0217699 | A1 | 9/2008 | Disney et al. | 257/378 |
| 2008/0230812 | A1 | 9/2008 | Disney et al. | 257/272 |
| 2008/0237656 | A1 | 10/2008 | Williams et al. | 257/262 |
| 2008/0237704 | A1 | 10/2008 | Williams et al. | 257/374 |
| 2008/0237706 | A1 | 10/2008 | Williams et al. | 257/343 |
| 2008/0237782 | A1 | 10/2008 | Williams et al. | 257/499 |
| 2008/0237783 | A1 | 10/2008 | Williams et al. | 257/513 |
| 2008/0290449 | A1 | 11/2008 | Williams et al. | 257/513 |
| 2008/0290450 | A1 | 11/2008 | Williams et al. | 257/513 |
| 2008/0290451 | A1 | 11/2008 | Williams et al. | 257/513 |
| 2009/0020811 | A1 | 1/2009 | Voldman | 257/337 |
| 2009/0101937 | A1 | 4/2009 | Lee et al. | 257/137 |
| 2009/0236683 | A1 | 9/2009 | Williams et al. | 257/499 |

FOREIGN PATENT DOCUMENTS

| | | |
|---|---|---|
| EP | 1357598 A1 | 10/2003 |
| GB | 2 362 508 | 11/2001 |
| KR | 10-0456691 | 11/2008 |

OTHER PUBLICATIONS

U.S. Appl. No. 11/891,006, filed Aug. 2007, Williams et al.
U.S. Appl. No. 11/890,993, filed Aug. 2007, Williams et al.

* cited by examiner

ISOLATION STRUCTURES FOR INTEGRATED CIRCUITS AND MODULAR METHODS OF FORMING THE SAME

CROSS-REFERENCE TO RELATED APPLICATION

This application is related to application Ser. No. 10/262,567, filed Sep. 29, 2002, now U.S. Pat. No. 6,855,985, which is incorporated herein by

FIELD OF THE INVENTION

This invention relates to semiconductor chip fabrication and in particular to methods of fabricating and electrically isolating bipolar, CMOS and DMOS transistors and passive components in a semiconductor chip monolithically at high densities without the need for epitaxial layers or high temperature fabrication processing steps.

BACKGROUND OF THE INVENTION

In the fabrication of semiconductor integrated circuit (IC) chips, it is frequently necessary to electrically isolate devices that are formed on the surface of the chip. There are various ways of doing this. A way is by using the well-known LOCOS (Local Oxidation Of Silicon) process, wherein the surface of the chip is masked with a relatively hard material such as silicon nitride and a thick oxide layer is grown thermally in an opening in the mask. Another way is to etch a trench in the silicon and then fill the trench with a dielectric material such as silicon oxide, also known as trench isolation. While both LOCOS and trench isolation can prevent unwanted surface conduction between devices, they do not facilitate complete electrical isolation.

Complete electrical isolation is necessary to integrate certain types of transistors including bipolar junction transistors and various metal-oxide-semiconductor (MOS) transistors including power DMOS transistors. Complete isolation is also needed to allow CMOS control circuitry to float to potentials well above the substrate potential during operation. Complete isolation is especially important in the fabrication of analog, power, and mixed signal integrated circuits.

Non-Isolated CMOS Fabrication and Construction

Conventional CMOS wafer fabrication, while offering high density transistor integration, does not facilitate compete electrical isolation of its fabricated devices. FIG. 1A for example illustrates a simplified cross sectional view of a prior-art twin-well CMOS 1. FIG. 1A illustrates the formation of N-well (NW) regions 4A and 4B and P-well (PW) regions 3A and 3B in P-type substrate 2 prior to transistor fabrication.

FIG. 1B illustrates a CMOS structure 10 after transistor formation including N-channel MOSFETs fabricated within P-well 3A, P-channel MOSFETs formed within N-well 4B, separated by intervening LOCOS field oxide layer 11. The combination of P-channel and N-channel MOSFETS, together constitute complementary MOS transistors, otherwise referred to as CMOS.

Within PW region 3A, N-channel MOSFETs are formed comprising shallow N+ source-drain implanted region 14 with lightly doped drain (LDD) 15, polysilicon gate 19, and P+ to PW contact region 13. Within NW region 4B, P-channel MOSFETs are formed comprising shallow P+ source-drain implanted region 17 with LDD 18, polysilicon gate 19, and N+ to NW contact region 12. The NW and PW regions are ion implanted, generally with a subsequent high-temperature diffusion to drive the dopant into the substrate to a greater depth than the implant. The depth of the wells is generally greater for higher-voltage devices, e.g. 12V, than for lower voltage CMOS, especially at 3.3V or lower.

The transistor packing density of CMOS structure 10 is largely limited by the area wasted by LOCOS oxide 11, which cannot be reduced to deep submicron dimensions without encountering numerous problems. Another limitation of CMOS structure 10 is its gate construction comprising doped polysilicon 19 without any overlying shunting metal. As transistors are scaled to smaller dimensions, the gate resistance contributes to slower switching speeds and increased propagation delays. The impact of this gate resistance practically limits CMOS scaling to gate dimensions in the 0.8 to 0.6 micron range.

In analog circuitry another major limitation of CMOS 10 is its lack of complete electrical isolation. As shown, PW region 3A is shorted to substrate 2. Since P-well 3A electrically forms the body (or back gate) of the NMOS transistors, and since P-type substrate 2 is necessarily biased to the most negative on-chip potential (herein referred to as "ground"), then the body connection of every N-channel transistor is biased to ground, limiting their useful operating voltage range and subjecting the N-channel MOSFETs to unwanted substrate noise.

For CMOS transistors with gate lengths of 0.35 microns or smaller, structure 80 shown in FIG. 2A represents a common prior art realization of CMOS. In this structure, LOCOS field oxide layer 11 has been replaced with dielectrically filled shallow trenches 81 having dimensions one half the minimum LOCOS size or less. The polysilicon gate includes a metal silicide (such as platinum-silicide) to reduce gate resistance. The metal strapped polysilicon sandwich is sometimes referred to as a polycide layer, a concatenation of polysilicon and silicide. Note that in CMOS structure 80, despite its capability for smaller devices and high integration densities, P-well 3A is still electrically shorted to P-type substrate 2.

N-channel MOSFET 25, shown in FIG. 1C in cross section, is one of the non-isolated N-channel devices of LOCOS type CMOS structure 10, including P-well 27 formed in P-type substrate 26, N+ implant region 33, gate-oxide 36 located above PW channel region 35, topped with polysilicon gate 38 and gate silicide 39. Lightly doped drain extension 34 is self-aligned to gate 38 while N+ region 33 is self-aligned to sidewall spacer 37. Also in MOSFET 25, a single layer of metal interconnection 41 is also included for illustration purposes, although an integrated circuit may utilize from 2- to 10-layers of metal interconnection. Interconnect metal 41, typically an aluminum-copper or aluminum-copper-silicon alloy, contacts N+ region 33 through contact openings in inter-level dielectric (ILD) 32 and through thin barrier metal 40. The barrier metal, typically comprising titanium, platinum, or tungsten is introduced to prevent metal spikes (i.e. filaments) from alloying through the N+ to P-well junction during processing and shorting out the transistor's junctions.

Note the unique shaped oxide 31 has the appearance of a bird's head and extended beak, where the oxide thickness is graduated over a distance of several tenths of a micrometer. This shape results from stress existing between the silicon and an overlying silicon nitride layer used to locally prevent oxidation in the active device regions. As the field oxidation progresses, oxygen diffuses under the nitride mask lifting its edges to produce the uniquely characteristic shape. The bird's beak has several unfortunate effects for smaller transistors, affecting the transistor's threshold and gain, and wasting usable real estate. In some processes a P-type field dopant PFD 29 is introduced prior to LOCOS field oxidation to raise the field threshold and suppress surface leakage between any two adjacent N-type regions. An N-type field dopant NFD 30 may also be introduced in the field areas over N-well regions 28 to prevent parasitic leakages between adjacent P-type regions. The problem with both NFD and PFD regions is they diffuse too deep during field oxidation and can adversely impact a transistor's electrical characteristics, especially for deep submicron devices.

Another characteristic of P-well 27 is its non-Gaussian doping profile, especially in channel region 35. One possible doping profile along the vertical section line A-A' is shown in dopant concentration graph 50 in FIG. 1D. As shown, the dopant concentration of PW 27, shown as curve 52, follows a Gaussian profile intersecting with the constant doping concentration of substrate 26, shown as horizontal line 51. Since both PW 27 and substrate 26 are P-type, no P-N junction exists where they meet, and the P-well is not isolated from the substrate. Peaks 53, 54, and 55 represent implanted P-type dopant located in the channel region to prevent bulk punchthrough breakdown, to prevent sub-surface leakage, and to set the threshold voltage of the device respectively. The graph shown, however, represents an ideal one-dimensional doping profile and ignores the impact of lateral intrusion under the gate by field dopant or field oxide, both of which alter the two-dimensional and even three-dimensional doping profiles, often in adverse ways. Scaling the LOCOS to smaller dimensions of thinner final thicknesses is problematic since the shape of the bird's beak becomes sensitive to slight process variations.

N-channel MOSFET 100 shown in the cross section of FIG. 2B avoids the aforementioned LOCOS issues by replacing the field oxidation process with a dielectric filled trench 104. Methods for forming dielectrically-filled trench isolation regions are discussed in a related application Ser. No. 11/298,075, filed Dec. 9, 2005, titled "Isolation Structures for Semiconductor Integrated Circuit Substrates and Methods of Forming the same" by Richard K. Williams, which is incorporated herein by reference in its entirety. Without LOCOS, no bird's beak is present to encroach on polysilicon gate 113 or impact the doping of channel region 112, and device 100 can be scaled to smaller dimensions. Like its predecessors, N-channel MOSFET 100 is formed in P-well 102 which is electrically shorted to P-substrate 101 and does not provide electrical isolation.

FIG. 3A illustrates several common prior art process flows for fabricating non-isolated CMOS using LOCOS or trench isolation. Shown as a series of cards, those cards having square corners are mandatory processing steps while those with clipped corners (such as NFD implant) represent optional process steps.

FIG. 3B illustrates a schematic representation of a CMOS pair 130 comprising P-channel MOSFET 132 and N-channel MOSFET 131 and fabricated using either of the prior art fabrication sequences described. Each transistor includes four terminals—a source S, a drain D, a gate G and a body or back-gate B. In the case of P-channel MOSFET 132, its source-to-body junction is schematically represented as P-N diode 136, and its drain-to-body junction is illustrated by P-N diode 137. Resistance of the N-well region is illustrated as a lumped-circuit-element resistance 138, but in reality is spatially distributed across the device, especially for large area power devices.

One weakness of P-channel 132 is that it inherently includes a substrate-PNP 139, parasitic to the device's construction. As shown, with the source acting as an emitter injecting holes into the N-well base, some fraction of those holes may penetrate the N-well base without recombining and may ultimately be collected by the substrate as hole current. If the gain of the parasitic PNP 139 is too high, especially in the case of lightly-doped shallow N-wells, bipolar snapback breakdown (also known as BVceo or BVcer breakdown) may result and the device may be damaged or destroyed. Without isolation, it is difficult to control the characteristics of parasitic PNP 139 without affecting the other characteristics of MOSFET 132, such as its threshold voltage.

N-channel MOSFET 131, with its source-to-body junction schematically represented by P-N diode 133; and drain-to-body junction represented by P-N diode 134, has its body shorted to the substrate, represented here by the ground symbol, and therefore is not isolated. Resistance of the P-well and surrounding P-type substrate region is illustrated as a lumped-circuit-element resistance 135, which in reality is spatially distributed across the device and the substrate, especially for large area power devices. Aside from the circuit implications of a grounded body connection, the forward biasing of drain diode 134 injects electrons into the P-type substrate which may travel considerable distances across an integrated circuit (chip) before recombining or being collected. Such parasitic ground currents can adversely impact other devices and impair proper circuit operation.

Since most CMOS pairs are used in digital circuits as logic gates (like inverter 150 in FIG. 3C) parasitic diodes 154 and 153 remain reverse biased for all operating conditions of N-channel 151 and P-channel 152 normally encountered. If the same inverter, however, were used to drive an inductor in a Buck switching regulator, diode 153 will become forward-biased whenever P-channel 152 turns off, injecting current into the substrate and potentially causing unwanted phenomena to occur.

A similar problem occurs when using non-isolated CMOS for implementing cascode clamped output driver 160 shown in FIG. 3D. In this circuit, the output voltage of the inverter comprising N-channel 161 and P-channel 163 is clamped to some maximum positive voltage by the N-channel follower 162 which limits the output voltage to one threshold voltage $V_{TN}(162)$ below its gate bias $V_{bias}$. Through its cascode action the inverter is able to reduce, i.e. "level shift", its output to a smaller voltage range than the supply voltage Vcc. Diodes 164, 165, 166, and 167 all remain reverse biased during normal operation. The problem is that since diode 166 is reverse-biased to a voltage equal to Vout, the threshold of N-channel 162 increases in proportion to the output voltage and thereby limits the circuit's maximum output voltage. If N-channel MOSFET 162 were isolated, its source and body could be shorted to the output, so that diode 166 would never be reverse-biased and its threshold voltage would remain constant.

Junction-Isolated CMOS Fabrication and Construction

The need for electrically isolated CMOS is further exemplified in circuit 150 of FIG. 4A, where a pair of N-channel MOSFETs 151 and 152 are connected in a totem pole configuration and driven out of phase by break-before-make (BBM) circuit 155. To achieve a low on-resistance independent of its operating condition, high side N-channel MOSFET 152 requires a source-body short (so that $V_{SB}=0$ at all times). Floating bootstrap capacitor 157 powers floating gate drive circuitry 156 to provide adequate gate bias $V_{GS}$ for MOSFET 152, even when the high-side device is on and Vout is approximately equal to Vcc. To implement the bootstrap drive, both floating circuit 156 and high-side MOSFET 152 must be electrically isolated from the IC's substrate (i.e. ground).

Another circumstance requiring isolation is illustrated in Buck converter 170 of FIG. 4B, where a push-pull CMOS pair including a low-side MOSFET 171 and a high-side MOSFET 172 controls the current in inductor 177 and in closed loop operation, regulates a constant voltage across output capacitor 178. While diode 173 anti-parallel to high-side MOSFET 172 remains reverse-biased during normal operation, drain-to-body diode 174 of low-side MOSFET 171 does not remained reverse-biased. Each time high-side MOSFET 172 is turned off; inductor 177 drives the inverter output voltage Vx below ground forward-biasing diode 174. If conduction current in the MOSFET's body is sufficient to develop a voltage drop across resistance 175, electrons may be injected deep into the substrate via the bipolar transistor action of parasitic NPN 176 and may be collected by any other N region 179. The resulting substrate current can adversely affect efficiency, and cause circuit malfunction. If the low-side MOSFET 175 were isolated, the diode current could be collected without becoming unwanted substrate current.

The most common form of complete electrical isolation is junction isolation. While not as ideal as dielectric isolation where oxide surrounds each device or circuit, junction isolation has to date offered the best compromise between manufacturing cost and isolation performance. As shown in FIG. 5A, the prior art CMOS isolation requires a complex structure comprising N-type epitaxial layer 203 grown atop a P-type substrate 201 and surrounded by an annular ring of deep P-type isolation $P_{ISO}$ 204 electrically connecting to the P-type substrate to completely isolate an N-type epitaxial island by P-type material below and on all sides. Growth of epitaxial layer 203 is also slow and time consuming, representing the single most expensive step in semiconductor wafer fabrication. The isolation diffusion is also expensive, formed using high temperature diffusion for extended durations (up to 18 hours). To be able to suppress parasitic devices, a heavily doped N-type buried layer NBL 202 must also be masked and selectively introduced prior to epitaxial growth.

To minimize up-diffusion during epitaxial growth and isolation diffusion, a slow diffuser such as arsenic (As) or antimony (Sb) is chosen to form NBL 202. Prior to epitaxial growth however, this NBL layer must be diffused sufficiently deep to reduce its surface concentration, or otherwise the concentration control of the epitaxial growth will be adversely impacted. Because the NBL layer is comprised of a slow diffuser, this pre-epitaxy diffusion process can take more than ten hours.

Once isolation is complete CMOS fabrication can commence in a manner similar to the aforementioned discussion. Referring again to FIG. 5A, P-well 205 and N-well 206 are implanted and diffused to facilitate N-channel and P-channel fabrication. Since they are formed in an isolated epitaxial pocket of N-type silicon however, they advantageously are completely isolated from the substrate.

Since junction isolation fabrication methods rely on high temperature processing to form deep diffused junctions and to grow epitaxial layers, these high temperature processes are expensive and difficult to manufacture, and are incompatible with large diameter wafer manufacturing, exhibiting substantial variation in device electrical performance and preventing high transistor integration densities. The complexity of junction isolation is illustrated in flowchart 220 of FIG. 5B. After all the steps shown are performed, the wafer must proceed to the formation of a field oxide layer, and only then may the extensive CMOS manufacturing portion of the flow begin.

Another disadvantage of junction isolation is the area wasted by the isolation structures and otherwise not available for fabricating active transistors or circuitry. In FIG. 5C, the area needed to satisfy certain minimum design rules is illustrated for a buried layer 212, P-type diffused junction isolation 213, and a diffused heavily doped N-type sinker 214 (overlapping onto NBL 212B). As a further complication, with junction isolation the design rules (and the wasted area) depend on the maximum voltage of the isolated devices. For an epitaxial layer grown to a thickness $x_{epi}$, the actual thickness supporting voltage $x_{net}$ is less since the depth of P+ junction 216 and the up-diffusion of NBL 212A must be subtracted from the total thickness to determined the voltage capability of the isolated devices.

Common epitaxial thicknesses range from 4 microns to 12 microns. The required opening for the isolation region implant depends on the epitaxial thickness being isolated. The $P_{ISO}$ mask opening must be sufficiently large to avoid starved diffusion effects. A starved diffusion occurs when two-dimensional (or three-dimensional) diffusion reduces the dopant concentration gradient and slows the vertical diffusion rate. In fact unless the $P_{ISO}$ opening is sufficient, the isolation may not even reach the substrate. As a general rule of thumb to avoid starved diffusion, the opening for the isolation implantation should have a dimension $y_1$ approximately equal to the epitaxial thickness $x_{epi}$.

Ignoring two-dimensional effects, during the isolation drive-in cycle, lateral diffusion occurs at a rate approximately 80% that of the vertical (per side). So the actual surface width of a diffused isolation $y_2$ is approximately equal to $[x_{epi}+2 \cdot (0.8 \cdot x_{epi})]=2.6 \cdot x_{epi}$ Using this guideline, isolating a 7 micron epitaxial layer requires an 18 micrometer wide isolation ring. Further spacing $y_6$ must be included to prevent avalanche breakdown between the bottom of isolation 213 and NBL 212A.

Similar design rules must be considered for fabricating a diffused low-resistance sinker 214 for connecting NBL layer 212B to the surface. The $N_{sinker}$ mask opening must have a dimension $y_3$ approximately equal to its depth xnet. This results in a sinker surface width $y_4$ equal to $[x_{net}+2 \cdot (0.8 \cdot x_{net})]=2.6 \cdot x_{net}$. Assuming that $x_{net}=5$ microns (for a 7 micron epitaxial layer), then the sinker ring has a surface width of 13 micrometers. Allowing 2 micrometers of space $y_5$ between the isolation and sinker rings means the surface area required for a sinker and an adjacent isolation is $[y_2+y_5+y_4]=[18+2+13]$ or 33 micrometers. Obviously, conventional epitaxial junction isolation, despite its electrical benefits, is too area wasteful to remain a viable technology option for mixed signal and power integrated circuits.

An Epiless Fully-Isolated BCD Process with Contouring Implants

As disclosed in U.S. Pat. No. 6,855,985, issued Feb. 15, 2005, entitled "Modular Bipolar-CMOS-DMOS Analog Integrated Circuit & Power Transistor Technology," by Richard K. Williams, et. al., incorporated herein by reference, a fully-isolated process integrating CMOS, bipolar and DMOS transistors can be achieved without the need for high temperature diffusions or epitaxy. As illustrated in the multi-voltage CMOS 250 of FIG. 6, the principal of the previously disclosed modular BCD process relies on high-energy (MeV) ion implantation through contoured oxides to produce self-forming isolation structures with virtually no high temperature processing required. This low-thermal budget process benefits from "as-implanted" dopant profiles that undergo little or no dopant redistribution since no high temperature processes are employed.

In the structure shown, deep N-type layers (DN) 253A and 253B, implanted through LOCOS field oxide layer 255, form a conformal isolation structure that encloses multi-voltage CMOS. For example, DN layer 253A contains 5V CMOS wells comprising a surface P-well 255 (PW1) with a more highly concentrated buried P-well 254 (PW1B), and a surface N-well 253 (NW1) with a more highly concentrated buried N-well 252 (NW1B), with doping profiles optimized for 5V N-channel and P-channel MOSFETs. In another region on the same die DN layer 253B contains 12V CMOS wells comprising a surface P-well 259 (PW2) with a more highly concentrated buried P-well 258 (PW2B), and a surface N-well 257 (NW2) with a more highly concentrated buried N-well 256 (NW2B), with doping profiles optimized for 12V N-channel and P-channel MOSFETs. The same process is able to integrated bipolar transistors, and a variety of power devices, all tailored using conformal and chained ion implantations of differing dose and energy. (Note: As used herein, the term "conformal" refers to a region or layer of dopant (a) that is formed by implantation through a layer (often an oxide layer) at the surface of the semiconductor material, and (b) whose vertical thickness and/or depth in the semiconductor material vary in accordance with the thickness and/or other features of the surface layer, including any openings formed in the surface layer.)

While this "epi-less" low thermal budget technique has many advantages over non-isolated and epitaxial junction isolated processes, its reliance on LOCOS imposes certain limitations on its ability to scale to smaller dimensions and higher transistor densities. The principal of conformal ion implantation in the LOCOS based modular BCD process is the concept that by implanting through a thicker oxide layer dopant atoms will be located closer to the silicon surface and by implanting through a thinner oxide layer, the implanted atoms will be located deeper in the silicon, away from the surface.

The scaling problem of conformal implantation is illustrated in FIG. 7. With LOCOS 282 as shown in FIG. 7A, the natural slope of the bird's beak region creates a smooth continuous gradation in oxide thickness that is mirrored by a smooth continuous gradation 285 in the depth of the implanted DN layer. The floor isolation region 284 sets the one-dimensional device characteristics, but the isolation sidewall is self forming, tapering toward the surface to the right of line 287 as the oxide thickness 286 increases. No implant is introduced through photoresist mask layer 283.

But to improve CMOS transistor integration density, the bird's beak taper must be reduced into a more vertical structure so that the devices can placed more closely for higher packing densities. For example, in FIG. 7B, the bird's beak region 296 to the right of line 297 is much steeper. The result is a greater portion of the implant is uniformly touching the bottom of LOCOS 292, and the transition 295 between the deep portion 294 and the field area 298 is more vertical and more abrupt. As a result, the width of the isolation for sidewall portion 295 is narrowed and the isolation quality is sacrificed.

To make the point more extreme, FIG. 7C illustrates a nearly vertical oxide profile for LOCOS 302, where the graded portion 306 to the right of line 307 is very is very short. The resulting implant profile shows a very thin abrupt transition 305 between the deep isolation 304 and the surface doping 308. Hence, there is a conflict. Region 305 is too narrow to provide good isolation yet only by making a steeper oxide can more transistors be packed into the same real estate.

What is needed is a new isolation structure that provides complete electrical isolation and high density integration without the use of epitaxial layers or long, high-temperature processes.

SUMMARY OF THE INVENTION

In accordance with this invention, a variety of isolation structures overcome the above-referenced problems. These new isolation structures are formed in a substrate with no epitaxial layer, and include a deep floor isolation layer that is formed by high-energy implantation of a dopant of opposite conductivity to the substrate. In one group of embodiments a dielectric-filled trench is used as at least a portion of a sidewall of the isolation structure. The dielectric-filled trench may extend into the deep floor isolation region. The dielectric-filled trenches may extend through and some distance below the deep floor isolation region.

In an alternative embodiment, the dielectric-filled trench extends only part of the distance to the deep floor isolation region, and a doped sidewall region of opposite conductivity type to the substrate extends between the bottom of the trench and the deep floor isolation region. Advantageously, the doped sidewall region is formed by implanting dopant through the floor of the trench before the trench is filled with a dielectric.

In another embodiment, a stack of chain-implanted sidewall dopant regions extends from the surface of the substrate to the deep floor isolation region and dielectric-filled trenches are formed within or adjacent to the sidewall dopant regions.

In most of the embodiments described above, the trench may be filled with a conductive material such as doped polysilicon and lined with a dielectric layer such as oxide. This allows electrical contact to be made with the deep floor isolation region from the surface of the substrate, either directly via the trench or via the trench and the doped sidewall regions.

The trenches and doped sidewall regions may be in an annular shape so that they enclose an isolated pocket of the substrate. (Note: As used herein, the term "annular" refers to a structure that laterally encloses or surrounds a region of the substrate, regardless of the shape of the structure. In different embodiments the annular structure may be, for example, circular, rectangular, polygonal or some other shape.)

In yet another group of embodiments, a mask layer is formed on the surface of the substrate and an opening is formed in the mask layer. The edges of the mask layer that surround the opening are sloped. A dopant is implanted through the opening in the mask layer to form a saucer-shaped isolation region with sidewalls underlying the sloped edges of the mask layer. The isolation region encloses an isolated pocket of the substrate.

When isolated pockets are formed in accordance with the invention, shallow dielectric-filled trenches may also be formed within the pocket to provide surface isolation among devices in the same pocket. Moreover, additional dielectric-filled trenches, which may extend to a level below the deep floor isolation region, may be formed between the isolated pockets to provide additional isolation between the pockets. The shallow trenches inside the isolated pockets and trenches between the isolated pockets may also be used with conventional isolation structures, such as structure having chained-implant sidewalls and a deep implanted floor region.

The invention also includes implanting a region of the same conductivity type as the substrate between the isolated pockets to help prevent punch-through between adjacent pockets.

The invention also comprises methods of fabricating the above-referenced isolation structures. The methods are generally modular in the sense that many of the process steps may be performed at different stages of the overall process sequence without significantly affecting the nature of the resulting isolation structure. Moreover, the processes generally do not involve the growth of an epitaxial layer or other processes having significant thermal cycles, which means that the dopant regions remain in an "as implanted" configuration, with minimal lateral and vertical expansion. This permits an increased packing density of the semiconductor devices and conserves valuable real estate on the surface of the semiconductor chip. The methods also include techniques for sharing processing steps in the formation of the various trenches incorporated in the isolation structures, including deep trenches, shallow trenches, dielectric-filled trenches, and trenches filled with conductive material.

BRIEF DESCRIPTION OF THE DRAWINGS

FIG. 1A shows the structure after complementary-well formation. FIG. 1B shows the structure after device fabrication before metallization and interconnection.

FIG. 2A shows the structure after device formation before metallization and interconnection. FIG. 2B is a detailed cross-sectional view of sidewall spacer N-channel MOSFET surrounded by oxide filled trenches

FIG. 4A is a schematic representation of a push-pull driver implemented using totem-pole N-channel MOSFETs. FIG. 4B is a schematic representation of a Buck topology switching regulator.

FIGS. 11A-11C illustrate a fabrication sequence for an implanted floor isolation prior to the trench isolation fabrication sequence.

DESCRIPTION OF THE INVENTION

Figure 6:
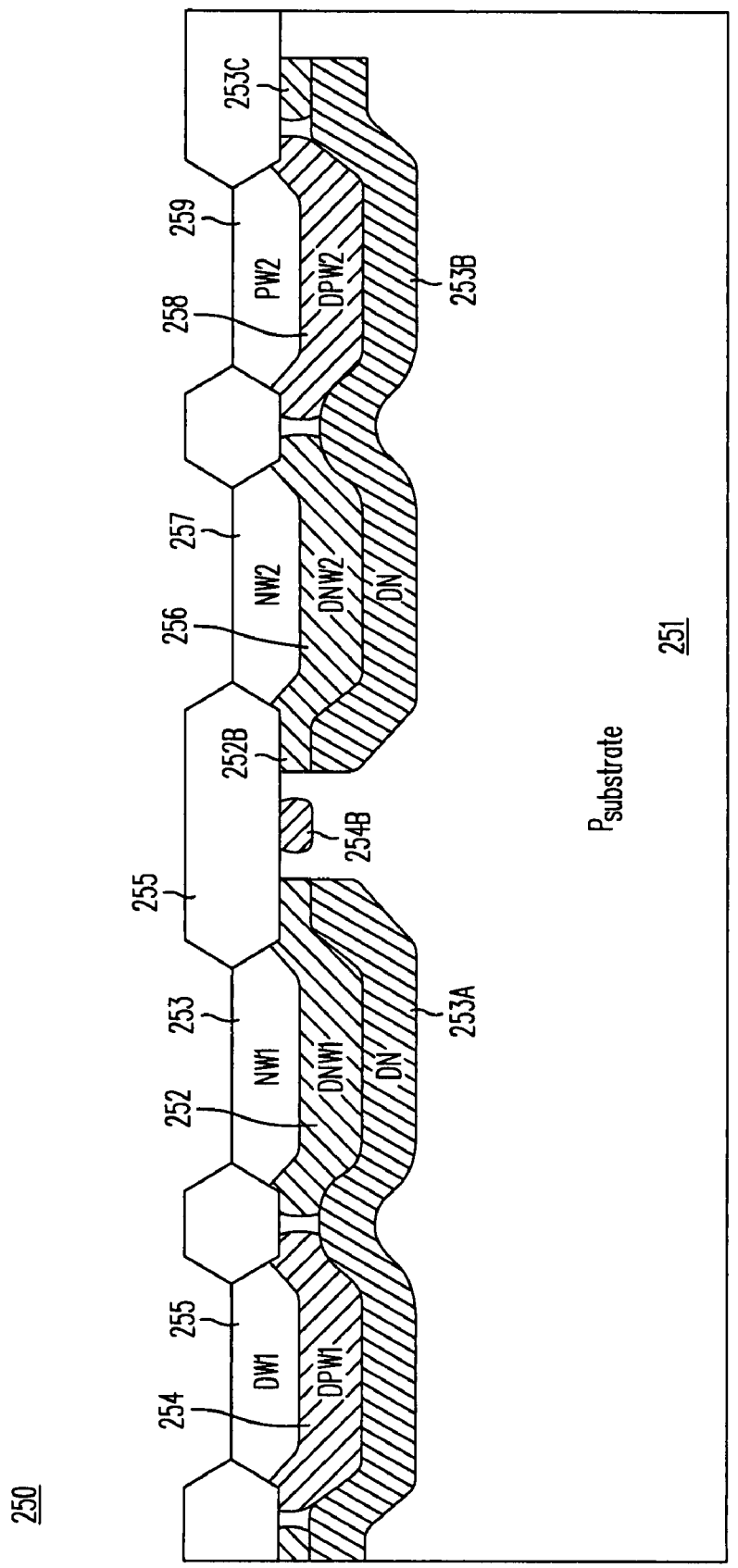
FIG. 6 is a cross-sectional view of an epi-less low-thermal budget, fully-isolated CMOS using a LOCOS oxide layer and contoured isolation implants.
Figure 7:
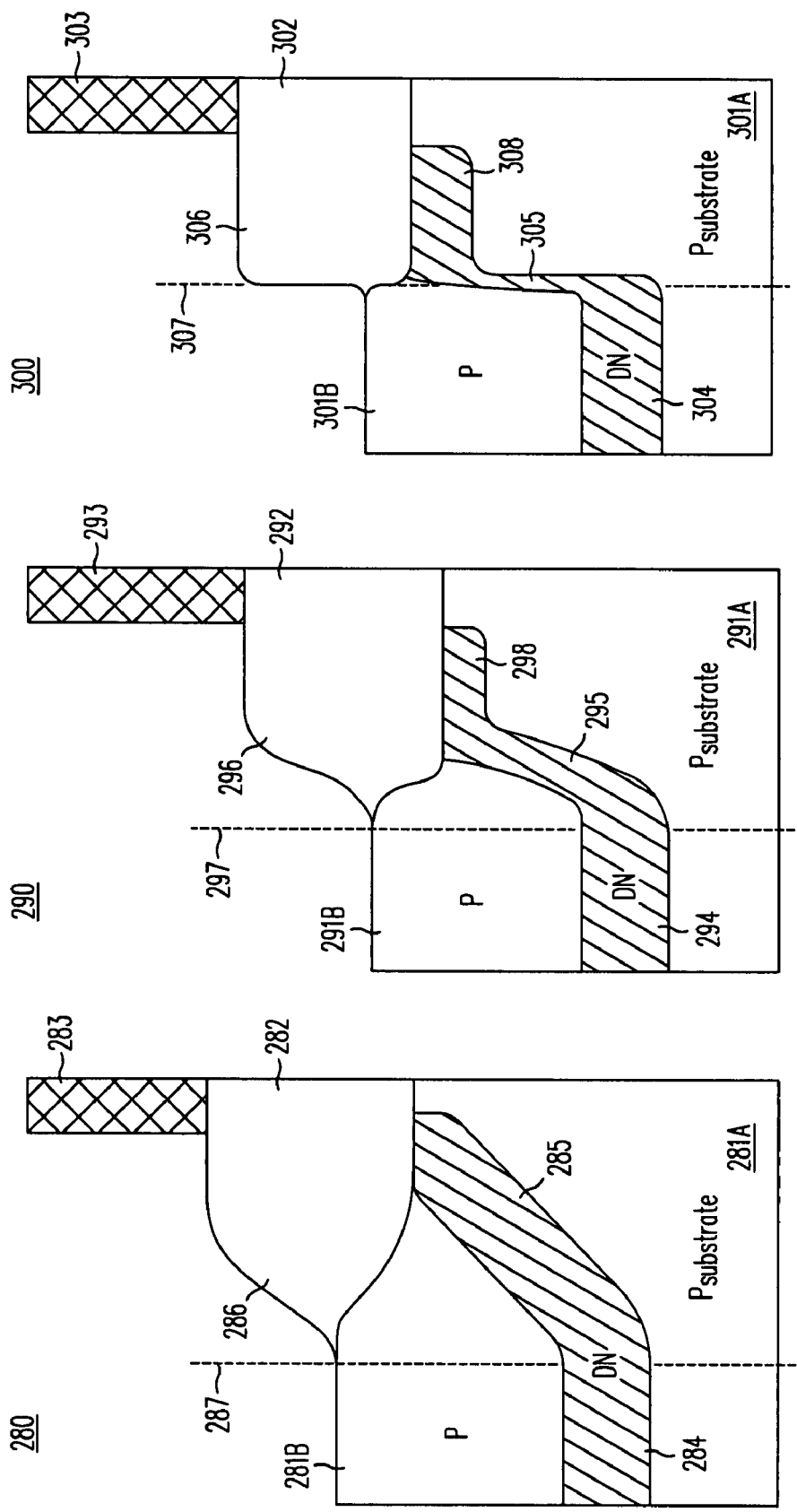
FIGS. 7A-7C illustrate the limitations imposed by the profiles of LOCOS oxide layers on contoured isolation implantation

The low-temperature isolation process used to fabricate the devices shown in FIG. 6 utilizes high-energy implantation contoured by a LOCOS field oxide layer to achieve the sidewall and floor isolation surrounding each isolated pocket and device. The scaling limitation of such technology and the maximum transistor density, is however, limited by how small a LOCOS field oxide region can be realized. At dimensions much larger than photolithographic limitations, the practical implementation of the LOCOS process becomes manifest. Such adverse effects include distorted field oxide shapes, excessive oxide thinning, high stress, high surface state charge, poor quality gate dielectrics and others. Moreover, as discussed with regard to FIG. 7, small LOCOS dimensions lead to thinning of the implant sidewall isolation regions and a corresponding degradation in the quality of device isolation.

To eliminate the LOCOS size limitation in scaling ICs, an alternative approach is to utilize an alternative process manufacturing flow to accommodate shallow or medium depth trench isolated regions (referred to as "STI") instead of LOCOS. These dielectrically-filled trenches can then be combined with high-energy and chained ion implantations to form floor isolation and potentially to enhance sidewall isolation voltage capability.

The novel combination of STI for sidewall isolation and high energy implanted floor isolation represent in various forms, novel methods and apparatus for integrating and isolating devices at high densities, without the need for long high-temperature diffusion or expensive epitaxial deposition. The isolation structures produced in this manner can be divided into six categories or "types", which are herein defined as follows:

Type-I isolation: a combination of deep high-energy ion implanted floor isolation and a dielectrically-filled trench sidewall isolation, with the option for deep and/or shallow trench isolation not associated with the sidewall isolation a Type-II isolation: a combination of a deep high-energy ion implanted floor isolation and dielectrically-filled trench sidewall isolation with additional isolation implants connecting the bottom of the trench to the floor isolation.

Figure 8:
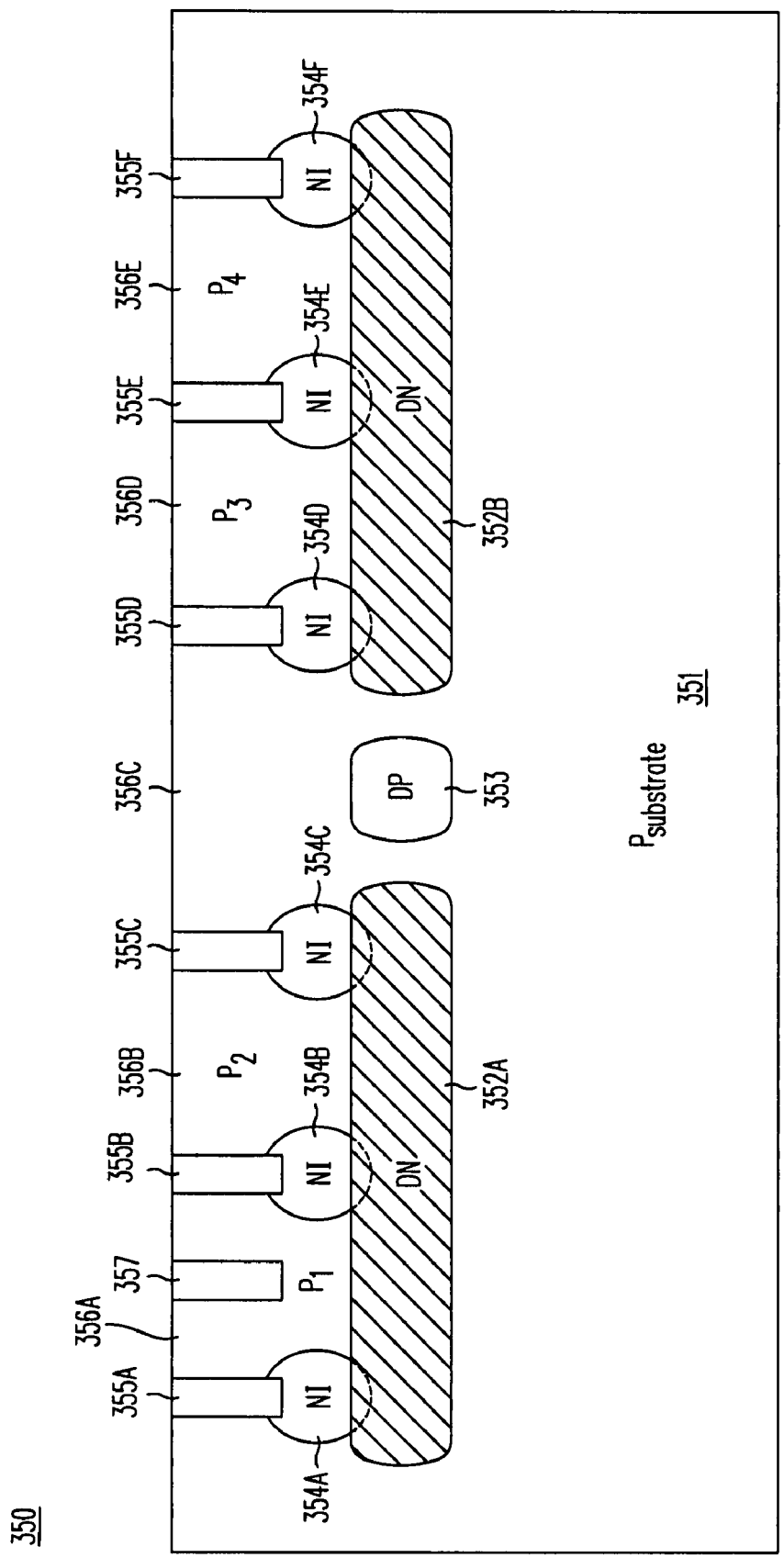
FIG. 8 is a cross-sectional view of a Type II trench isolation process with implanted floor and trench-bottom isolation capable of fully isolated device integration.

Type-III isolation: a combination of deep high-energy ion implanted floor isolation, and chained implant junction sidewall isolation, with the option for deep and/or shallow trench isolation not associated with the sidewall isolation Type-IV isolation: a combination of deep high-energy ion implanted floor isolation, and conductive/dielectric filled trench sidewall isolation, with the option for shallow trench isolation not associated with the sidewall isolation Type-V Isolation: a combination of a deep high-energy ion implanted floor isolation and conductive/dielectric filled trench sidewall isolation with additional isolation implants connecting the bottom of the trench to the floor isolation Type-VI isolation: a combination of a deep high-energy ion implanted floor isolation and conformal implant junction sidewall isolation, with the option for deep and/or shallow trench isolation not associated with the sidewall isolation Type-II Epiless Isolation The device structure 350 of Type II epiless isolation shown in the cross-sectional view of FIG. 8 comprises deep N-type (DN) floor isolation regions 352A and 352B formed in P-type substrate 351 with dielectric filled trenches 355A through 355F and N-type doped sidewall isolation regions 354A through 354F formed at the bottom of the dielectrically filled trenches. Optional deep P-type region (DP) 353 is formed in P-type substrate 351 at a depth shallower than, deeper than, or equal to DN regions 352A and 352B. The result is the formation of electrically isolated P-type pockets $P_1$ through $P_4$, also designated as regions 356A, 356B, 356D, and 356E, the pockets $P_1$ through $P_4$ electrically isolated from P-type substrate 351 by a combination of junction isolation at the bottom of the pocket and dielectric filled trenches along the pocket's sidewalls.

Figure 1A:
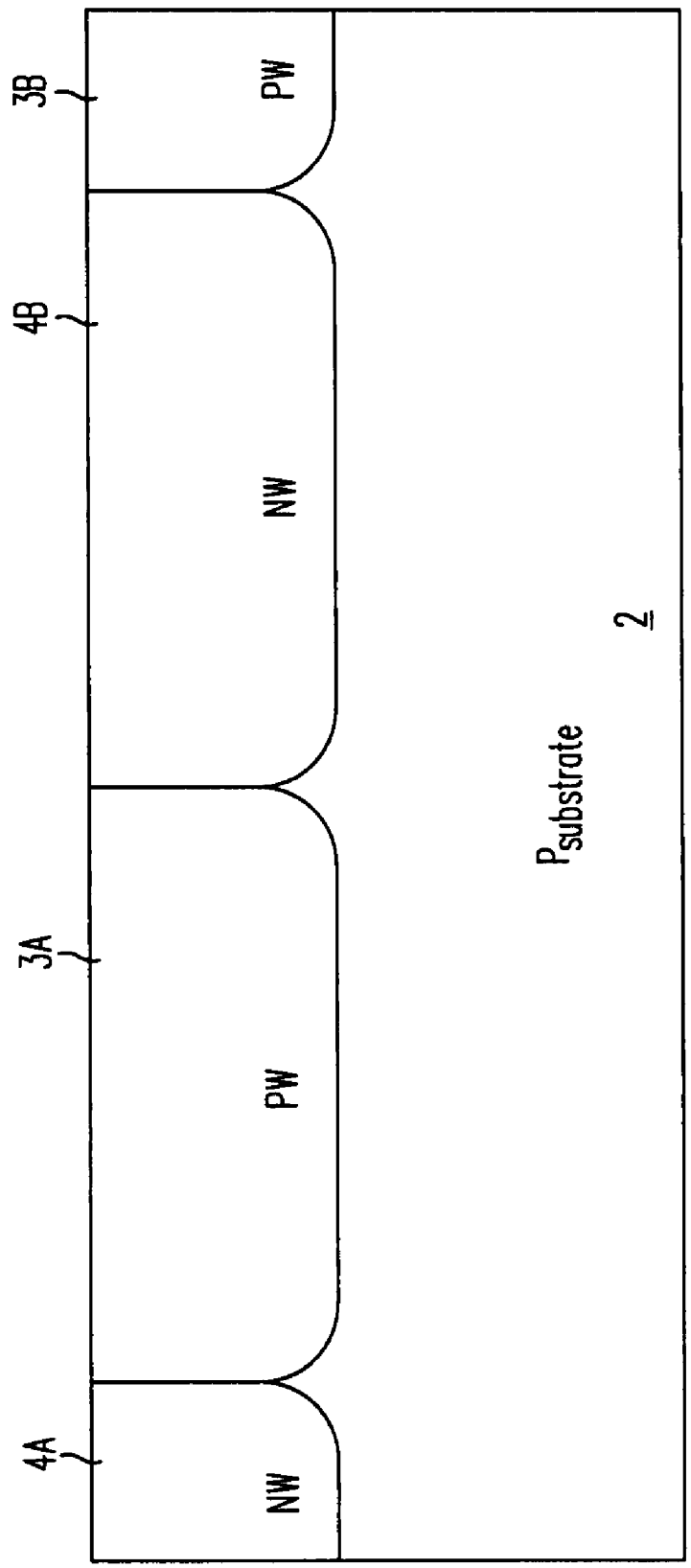
FIGS. 1A and 1B are cross-sectional views of a prior art non-isolated complementary-well CMOS process with LOCOS field oxidation.
Figure 1B:
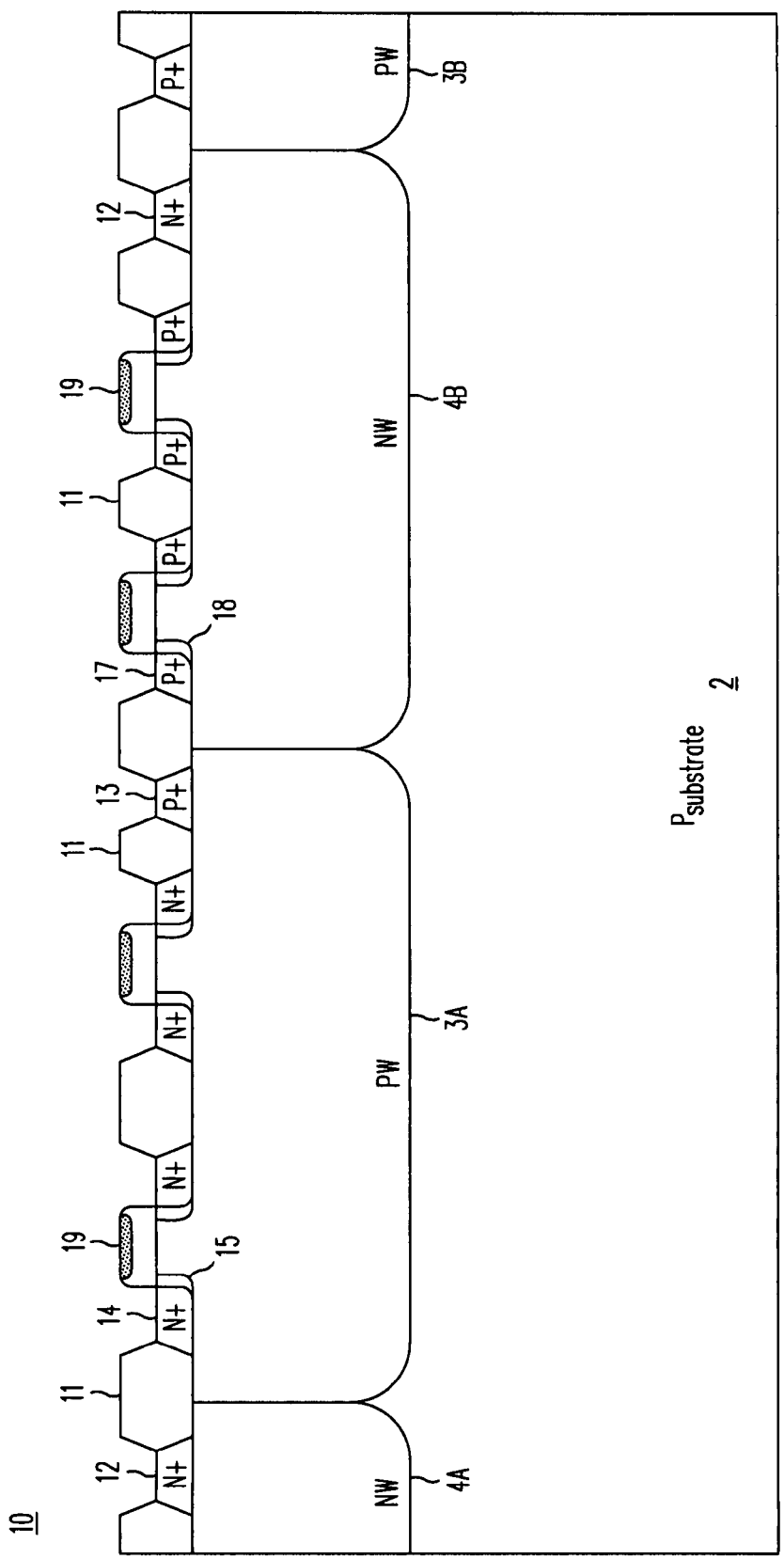
Figure 1C:
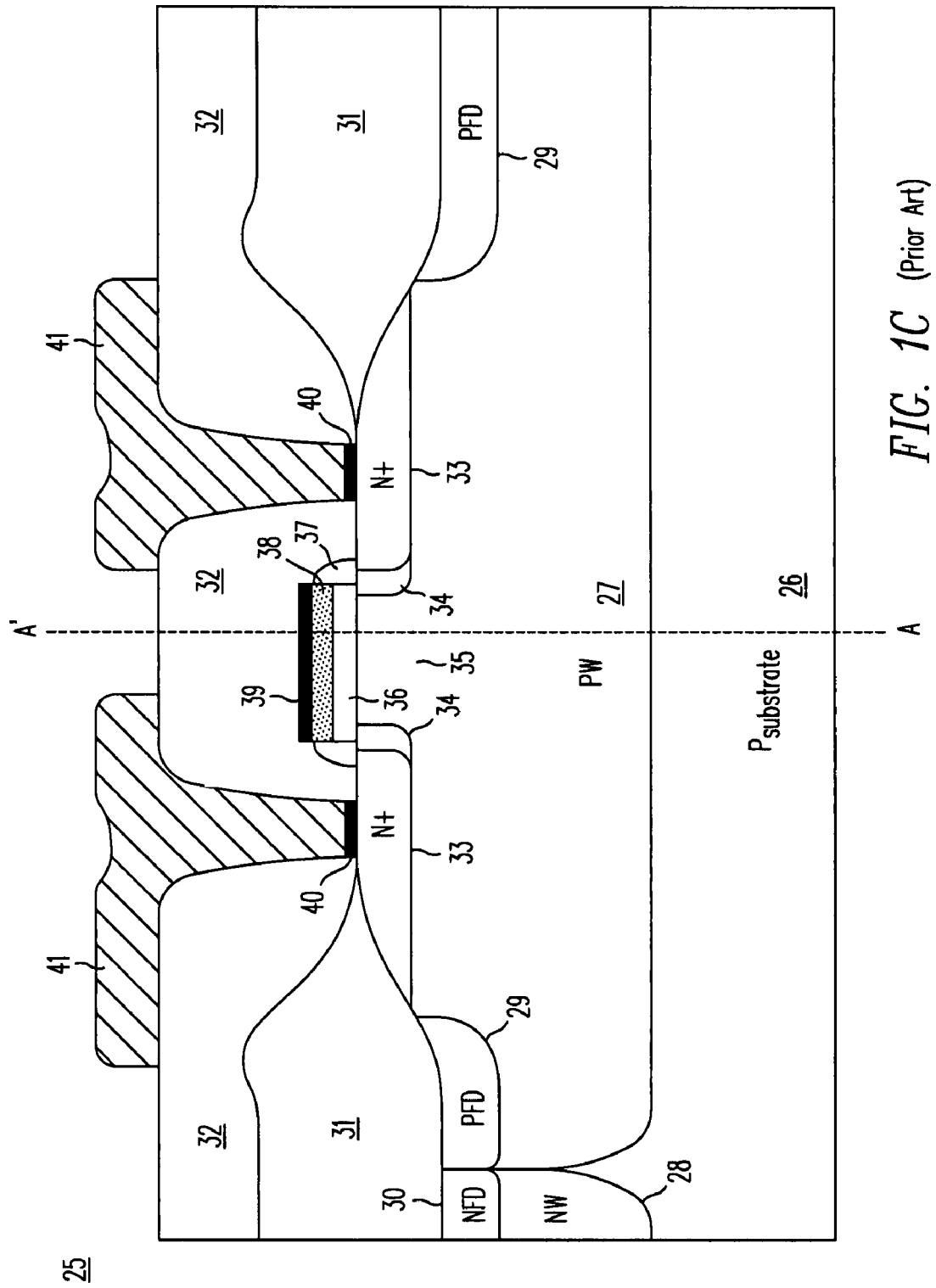
FIG. 1C is a detailed cross-sectional view of sidewall spacer N-channel MOSFET surrounded by LOCOS field oxide.
Figure 1D:
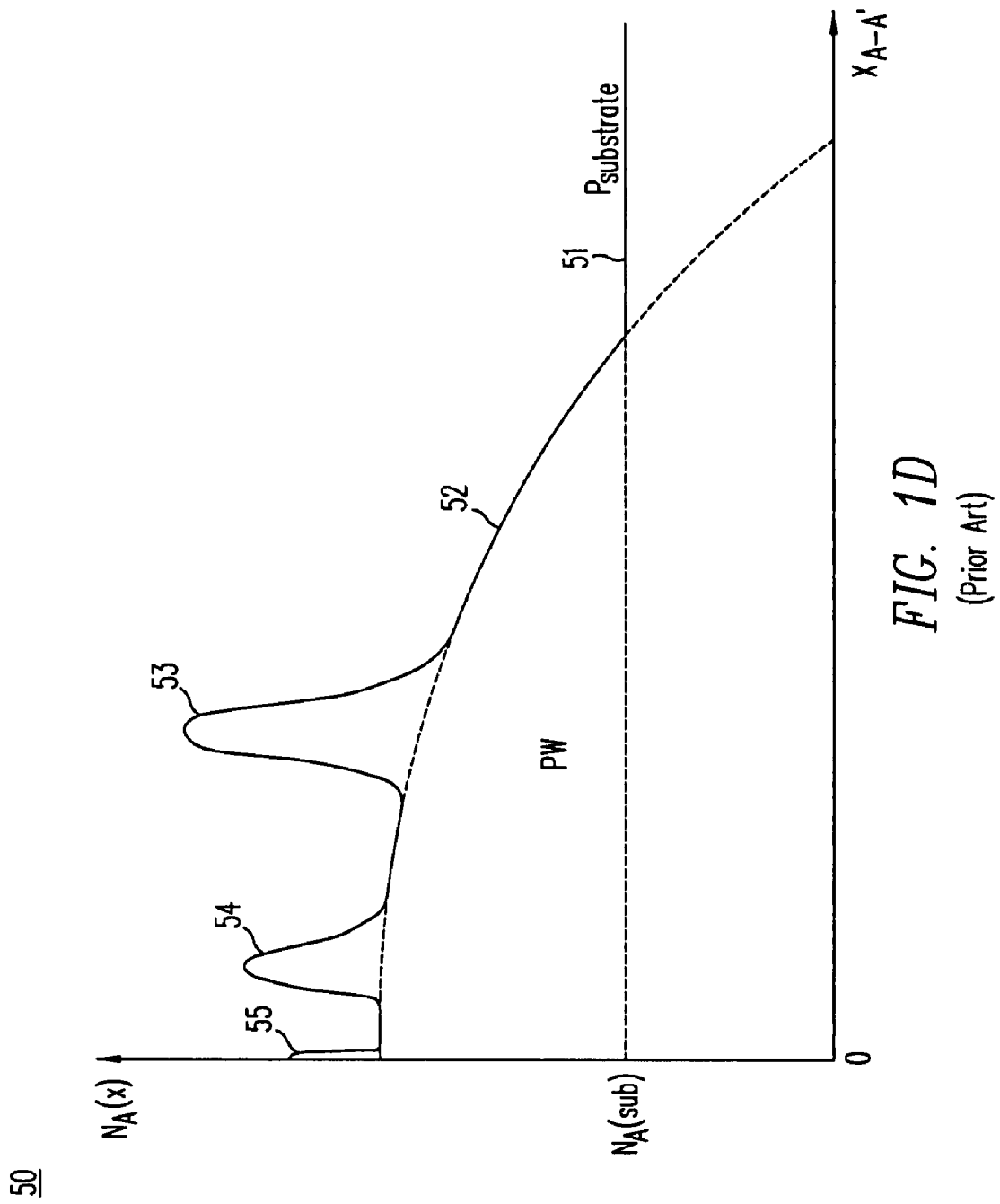
FIG. 1D shows the doping profile of the P-well region under N-channel MOSFET gate.
Figure 2A:
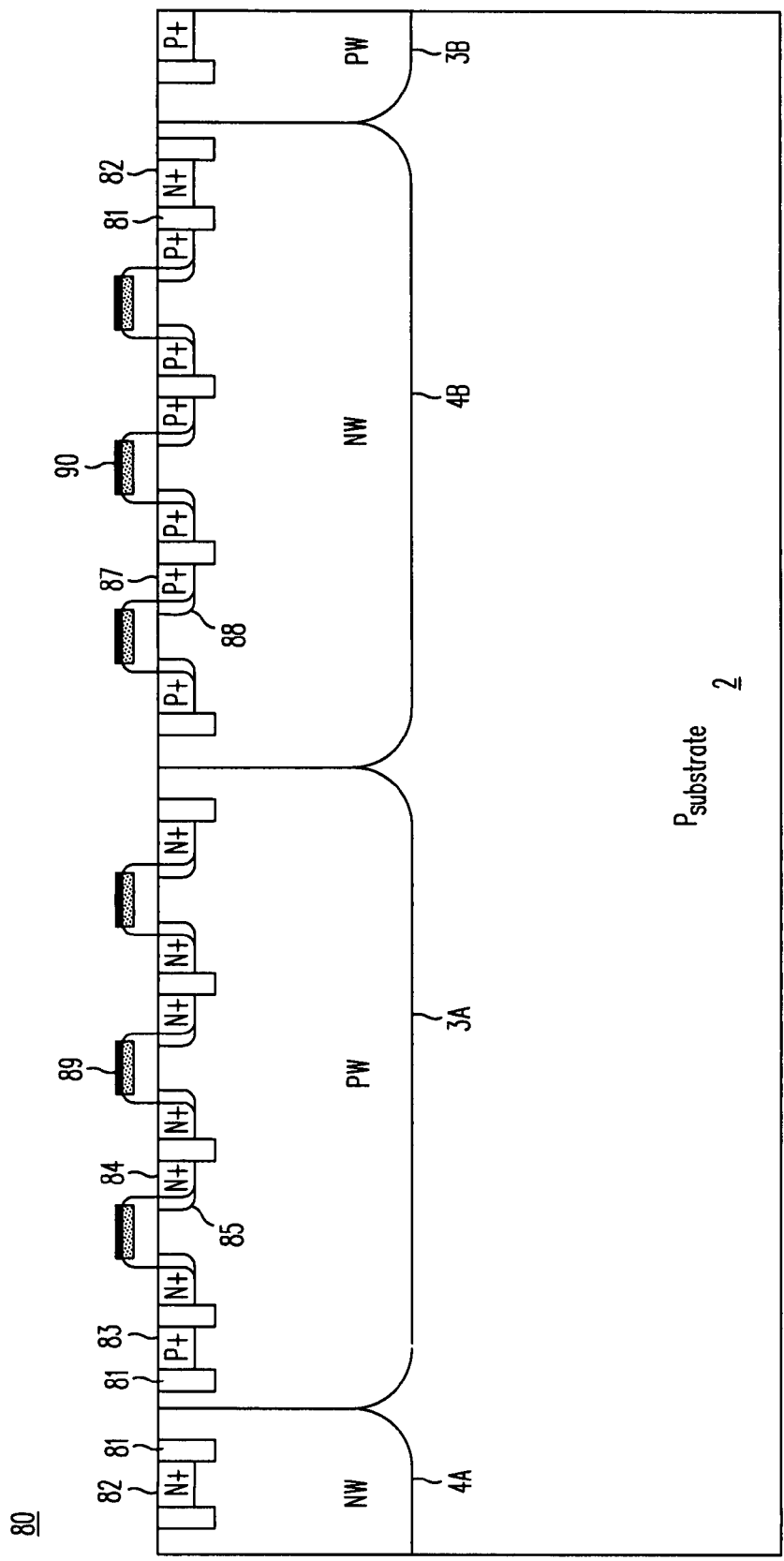
FIGS. 2A and 2B are cross-sectional views of a prior art non-isolated complementary-well CMOS process with shallow oxide filled trenches.
Figure 2B:
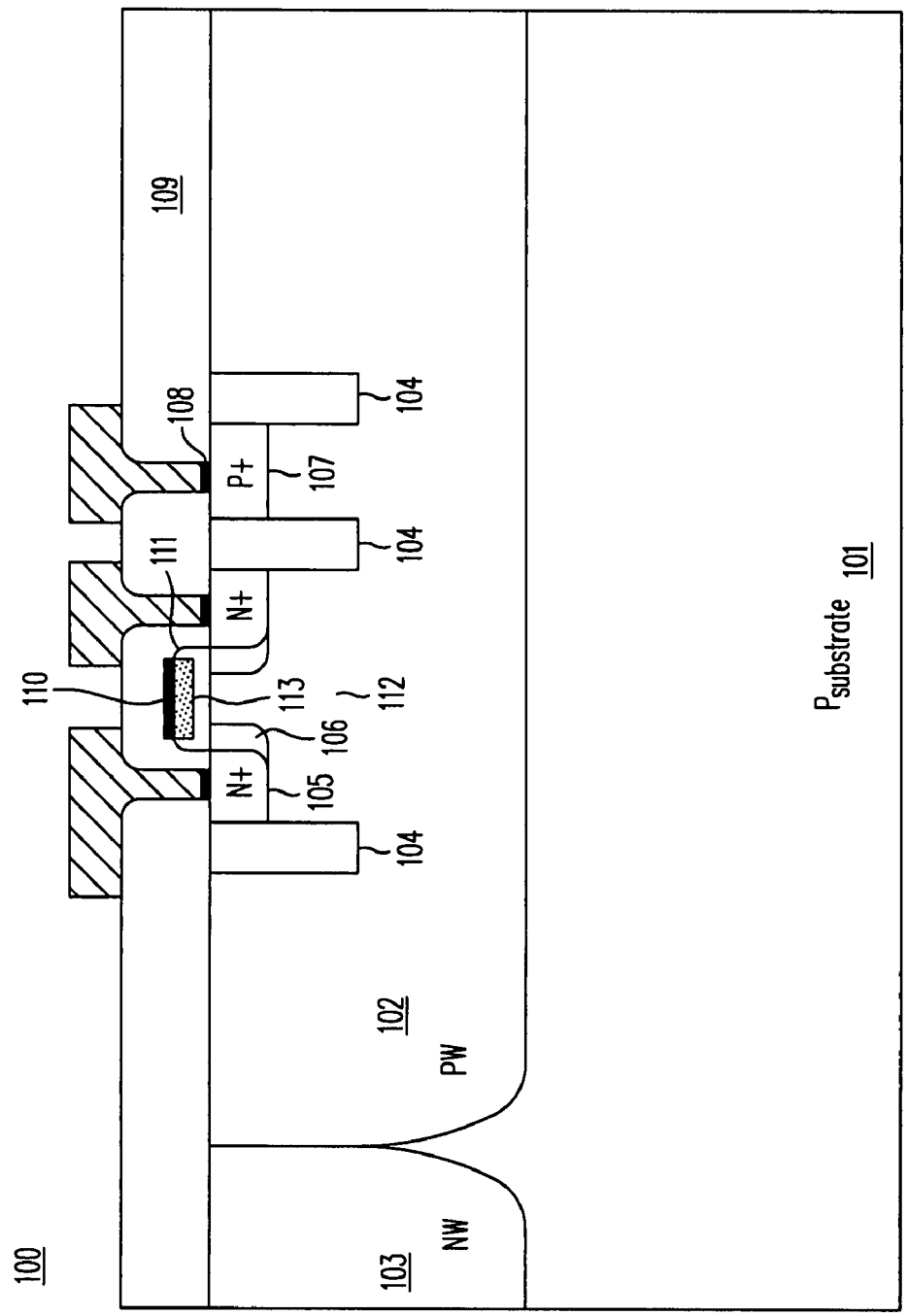
Figure 3A:
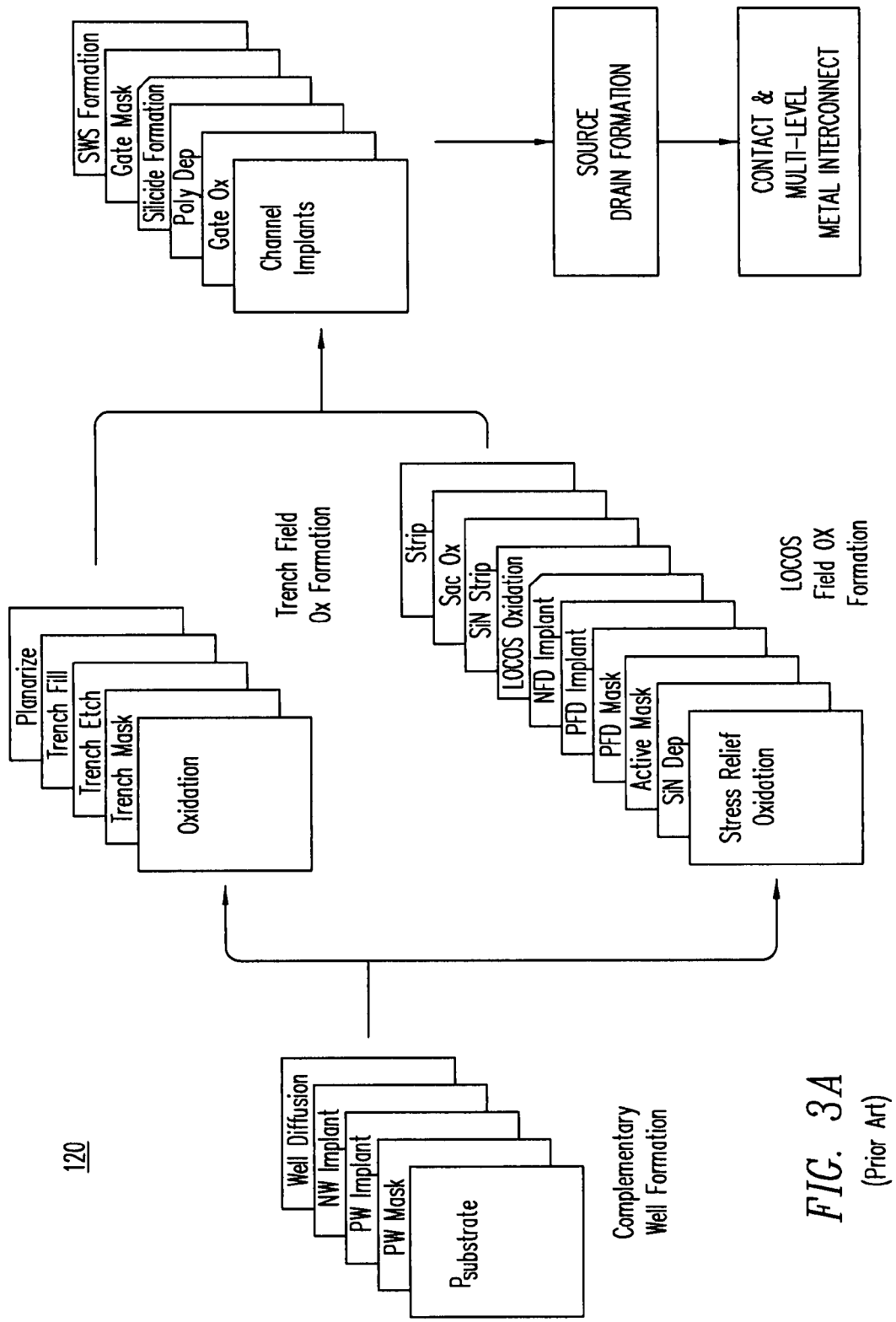
FIG. 3A shows a prior art process flow for fabricating a prior art trench and LOCOS field oxide complementary-well CMOS.
Figure 3B:
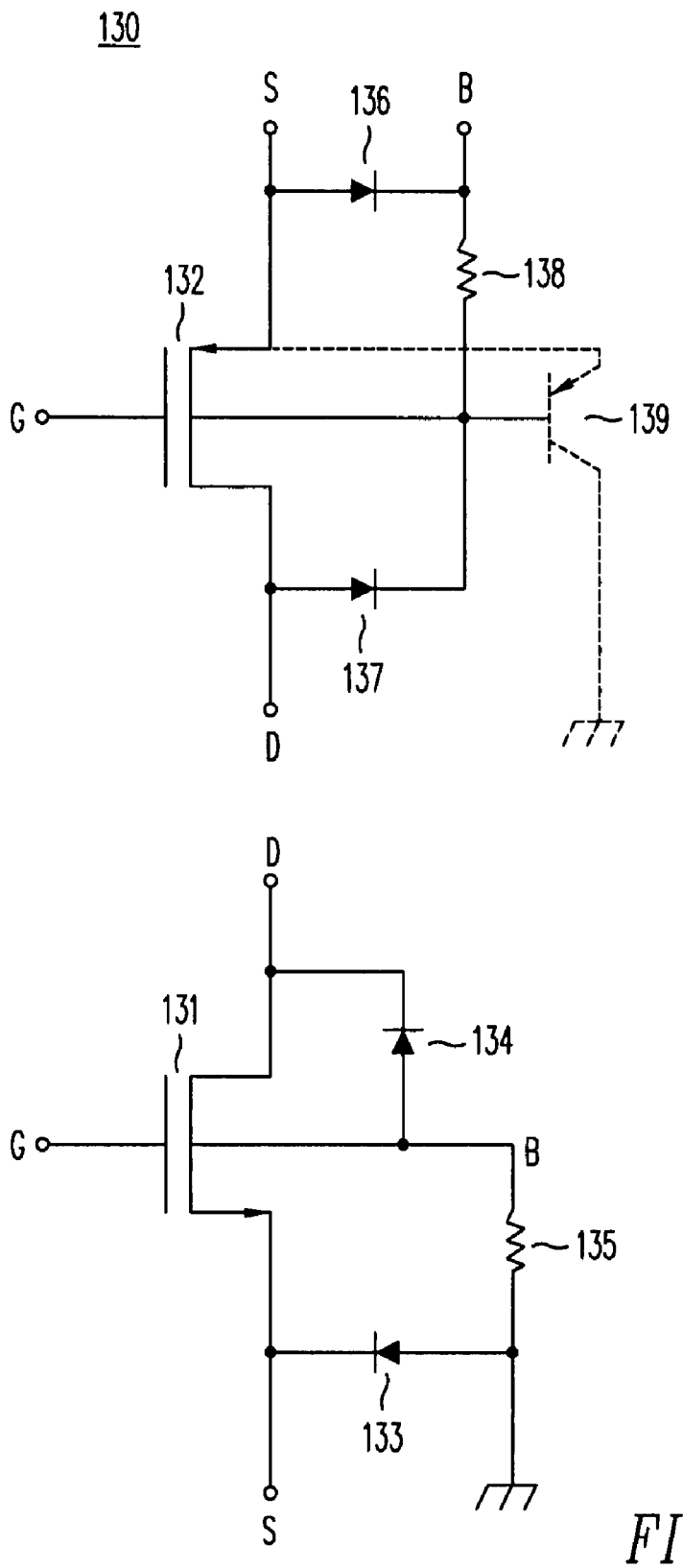
FIG. 3B is a schematic representation of CMOS devices.
Figure 3D:
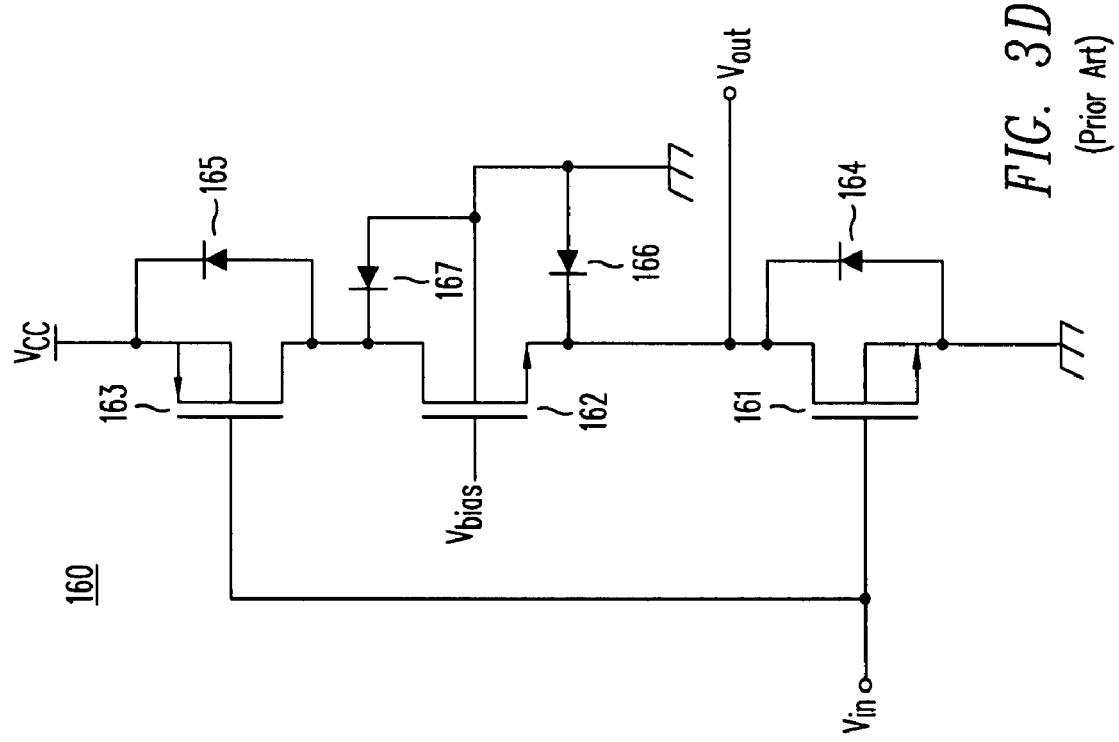
FIG. 3D is a schematic representation of a CMOS cascode clamped push-pull driver.
Figure 3C:
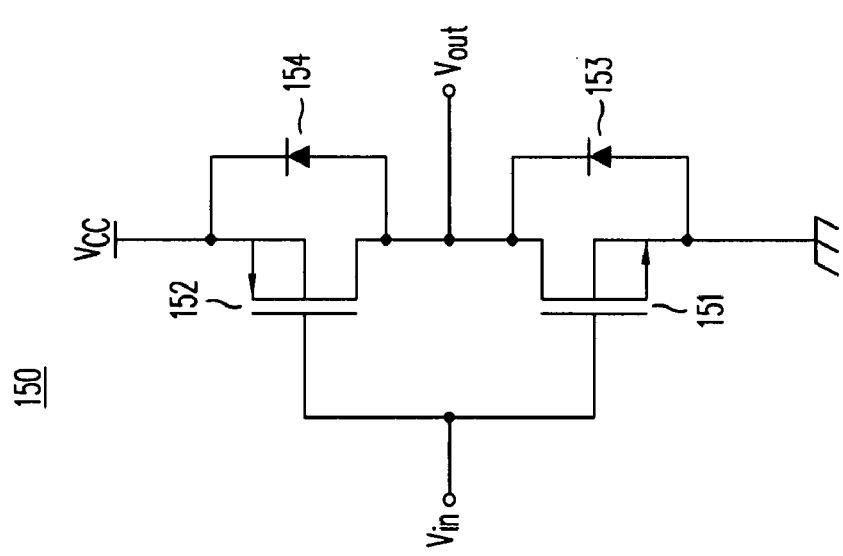
FIG. 3C is a schematic representation of a CMOS push-pull driver or inverter.
Figures 4A, 4B:
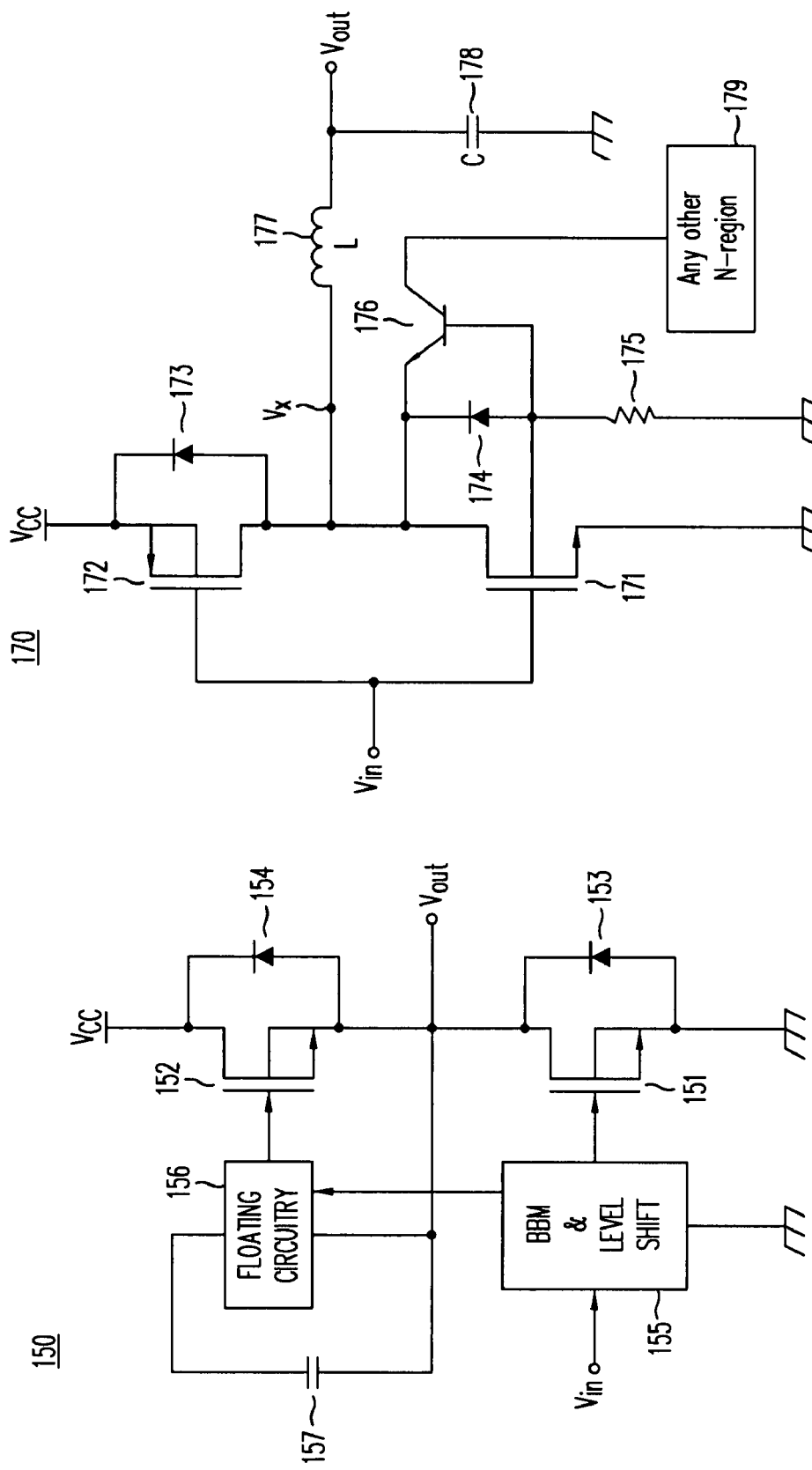
FIGS. 4A and 4B illustrate several circuits that can benefit from electrical isolation.
Figure 5A:
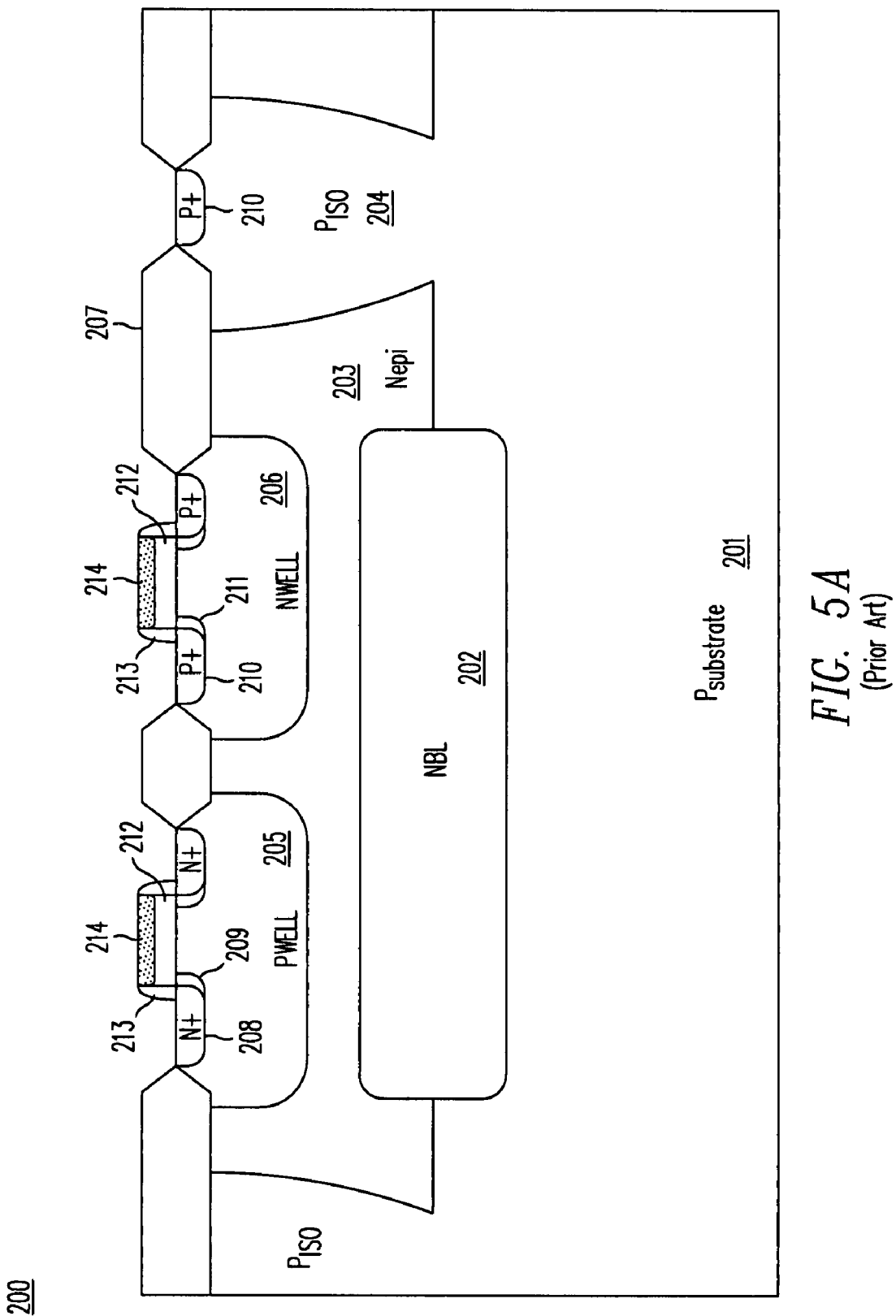
FIG. 5A is a cross-sectional view of a prior art high-temperature junction-isolated CMOS including an epitaxial layer before metallization and interconnection.
Figure 5B:
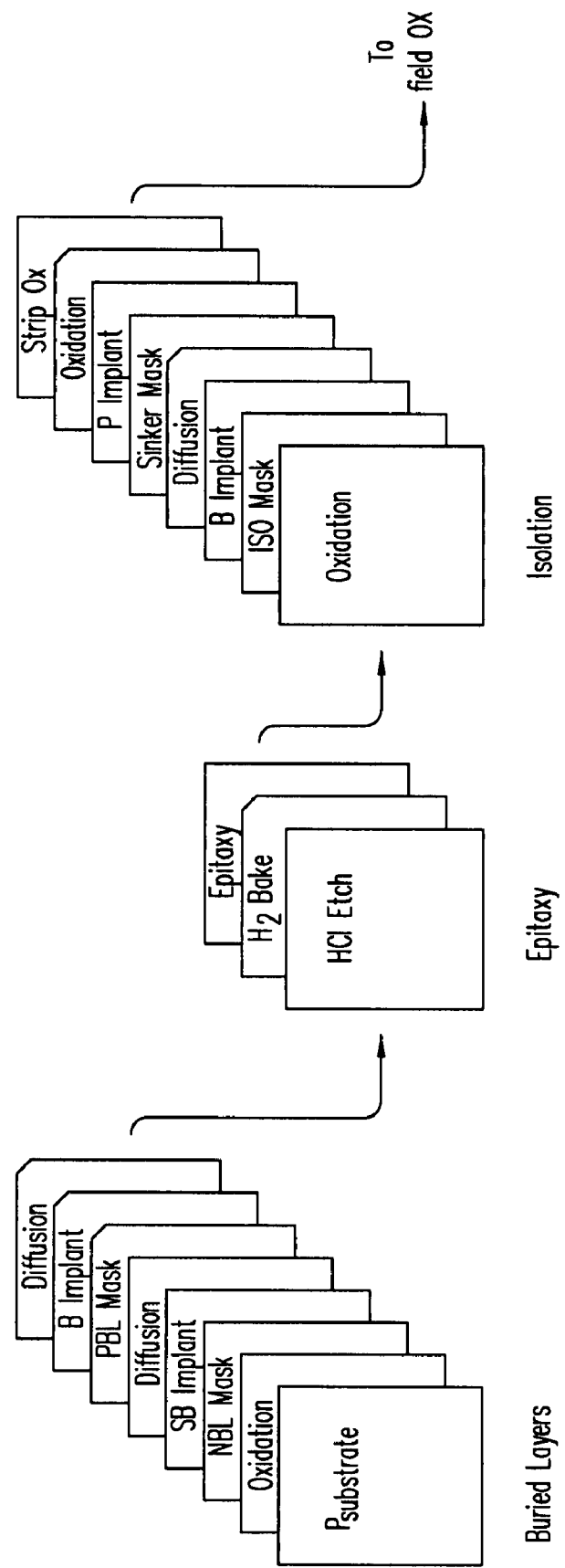
FIG. 5B shows a process flow for the CMOS of FIG. 5A.
Figure 5C:
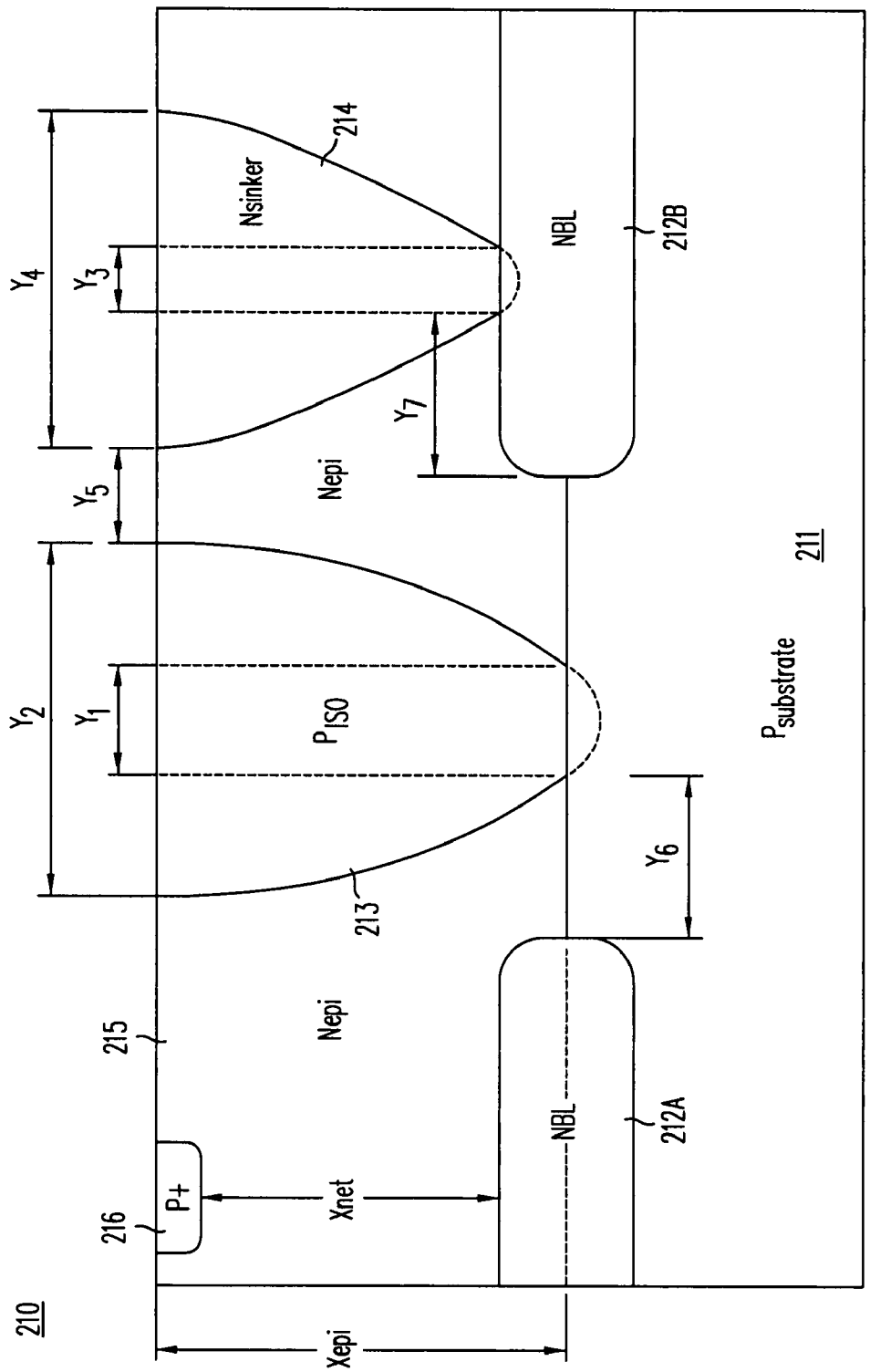
FIG. 5C illustrates several design rules related to isolation and sinker diffusions.

In a preferred embodiment of this invention, deep N regions 352A and 352B are formed by implanting phosphorus at high-energies without any significant high temperature processing after implantation. We refer to such deep N-type layers, herein, by the nomenclature "DN", an acronym for deep N-type region. Since P-type substrate 351 has no epitaxial layer grown atop it, DN layers 352A and 352B are not the same as buried layers formed using high temperature processing in conventional epitaxial processes (such as region 202 in prior art device 200 shown in FIG. 5A) despite their similar appearance.

The peak concentration and total vertical width of a conventional buried layer is affected by substantial diffusion unavoidably occurring in high temperature fabrication before, during, and after epitaxial growth. The problem of variability in diffused and epitaxial processes occurs because slight changes in temperature can cause large deviations in dopant profiles, a consequence of the exponential dependence of diffusivity on temperature.

In the all low-temperature processes disclosed herein, the implanted DN regions 352A and 352B, in contrast, are affected only by the implant energy (or energies in the case of multiple implants). The resulting profile is "as-implanted", and not subject to variability associated with thermal processing. In a relative sense, DN region formation should generally comprise the highest energy implantation in the process, in the range of 1 MeV (one million-electron-volts) to over 3MeV. Practically speaking, energies of 1.5 MeV to 2.3 MeV allow deep implants to be achieved in reasonable times using single- and double-ionized dopants. Triple-ionized dopant species having a high charge state can be implanted to a greater depth, but at correspondingly lower beam currents. The result is slower implantations. Phosphorus implant doses for the DN region may range from $1E12$ cm$^{-2}$ to $1E14$ cm$^{-2}$ but typically comprise doses in the 1-5 $E13$ cm$^{-2}$ range.

Deep P-type region 353, having the acronym "DP", may in a preferred embodiment be formed using a high-energy implantation of boron, at any depth, but generally at a depth equal to or shallower than the DN regions 352A and 352B. The implantation of boron to any given depth requires a lower energy than phosphorus, e.g. from 0.8 MeV to 1.5 MeV, since boron is a smaller, less massive atom than phosphorus. Boron implant doses for the DP region 353 may also range from $1E12$ cm$^{-2}$ to $1E14$ cm$^{-2}$ but may typically comprise doses in the $5E12$ cm$^{-2}$ to $1E13$ cm$^{-2}$ range, slightly lighter than the phosphorus DN implants.

The formation of the N-type isolation (NI) regions 354A through 354F is also accomplished using medium- to high-energy ion implantation into the bottom of trenches 355A through 355F, before the trench is filled with any dielectric material. The NI regions 354A-354F overlap onto DN regions 352A and 352B, completing the isolation in the region beneath the trenches and above DN regions 352A and 352B, allowing a shallower trench to be used to perform sidewall isolation. Shallower trenches are easier to manufacture, i.e. to etch, and to fill.

In device structure 350, four isolated pockets $P_1$, $P_2$, $P_3$ and $P_4$ (i.e. 356A, 356B, 356D, and 356E, respectively) are formed using two DN floor isolation regions 352A and 352B. While the DN regions could be electrically floating, in general they are biased to a potential more positive than the substrate, and therefore form a permanently reverse biased P-N junction to their surroundings. The reverse bias present on each DN region may be the same or different, and may be a fixed potential or vary with time. For example pockets $P_1$ and $P_2$, isolated from the substrate by common floor isolation 352A and trenches 355A and 355C; and from one another by trench 355B may contain 5V circuitry. Adjacent pockets $P_3$ and $P_4$, isolated from the substrate by common floor isolation 352B and trenches 355D and 355F; and from one another by trench 355E may contain 12V circuitry, operating without regard to the 5V circuitry sharing the same P-type substrate 351.

Inside an isolation region, each isolated P-type pocket may contain devices biased at any potential equal to or more negative than the pocket's corresponding DN bias potential. For example if DN region 352A is biased to 5V, devices inside the isolation pockets $P_1$ and $P_2$ may operate up to 5V and as negative as junction breakdowns of an isolated device may allow, potentially even more negative than the potential of P-type substrate 351 itself. The isolated pockets may likewise include additional P-type or N-type doped regions introduced either prior or subsequent to isolation formation. Each pocket may also include one or more shallow isolation trenches such as shallow isolation trench 357, shown in pocket $P_1$, to provide surface isolation among devices in the same pocket. The shallow trench 357 may be formed by a second trench etch and refill, or preferably may share the same etch and refill steps with trenches 355A-355F, with an additional mask during the implantation of NI regions 354A-354F to prevent the NI regions 354A-354F from being implanted under the shallow trench 357.

Type-I Epiless Isolation

Figure 9:
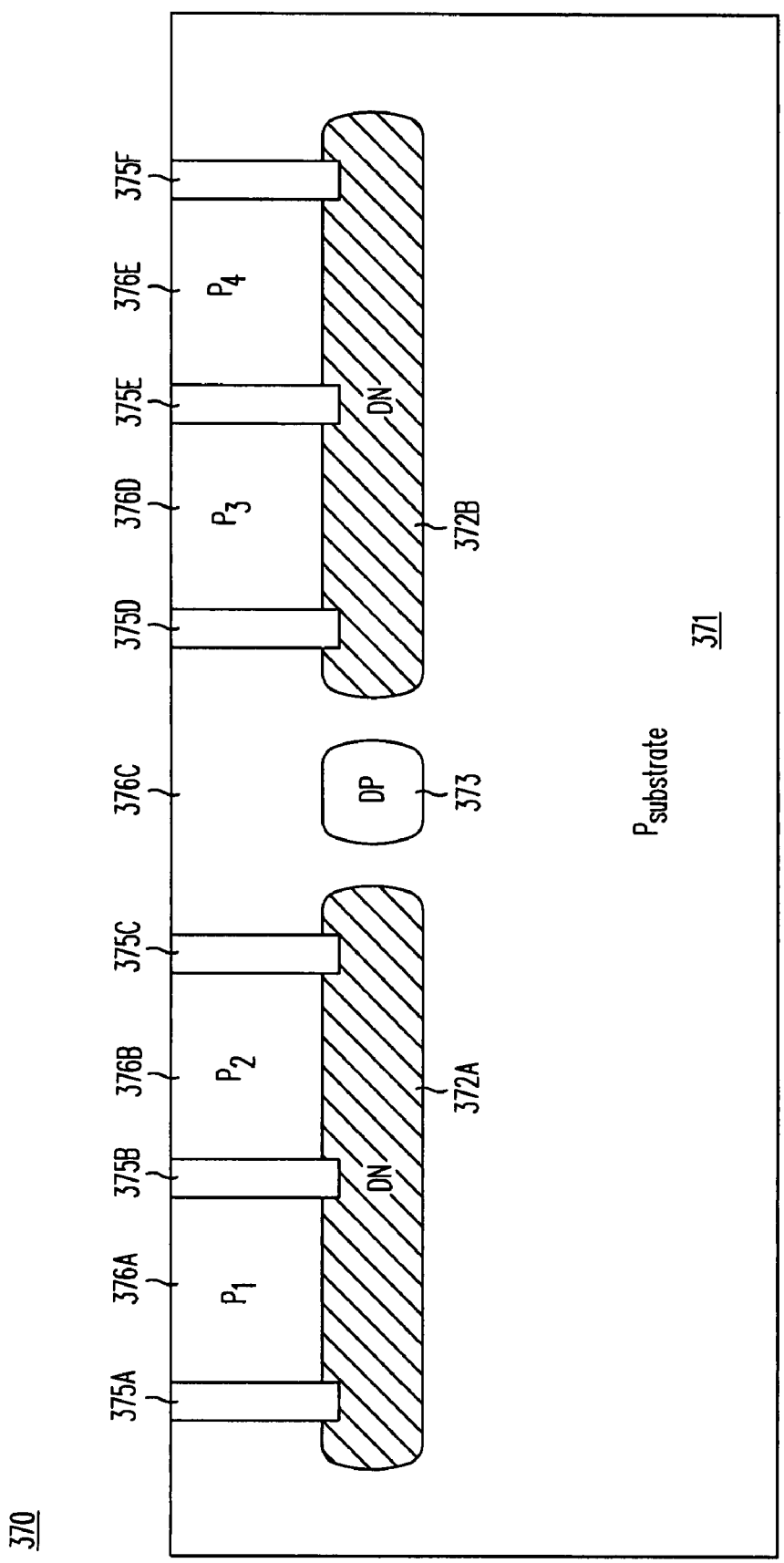
FIG. 9 is a cross-sectional view of a Type I trench isolation process with implanted floor isolation capable of fully isolated device integration.

The device structure 370 of Type I epiless isolation shown in FIG. 9 comprises DN floor isolation regions 372A and 372B formed in P-type substrate 371 with dielectric filled trenches 375A through 375F overlapping onto the floor isolation regions 372. Optional DP region 373 is formed in P-type substrate 371 at a depth that may be shallower than, deeper than, or equal to DN regions 372A and 372B. P-type pockets $P_1$ through $P_4$, i.e. regions 376A, 376B, 376D, and 376E, are electrically isolated from P-type substrate 371 by a combination of dielectric filled trenches 375A-375F circumscribing the regions 376 A, 376B, 376D, and 376E and overlapping onto the floor isolation regions 372A and 372B. P-type surface region 376C located between trenches 375C and 375D is not isolated because no DN layer is present in that region, and is therefore electrically shorted to substrate 371.

In a preferred embodiment of this invention, DN regions 372A and 372B are formed by implanting phosphorus at high-energies without any significant high temperature processing after implantation. Similarly, DP region 373, may be formed using the high-energy implantation of boron.

Unlike Type II isolation, Type I isolation has no N-type dopant implanted into the trench bottom. By eliminating the N-type material at the trench bottom, wafer fabrication requires fewer steps and this may reduce the manufacturing cost. Moreover, without the NI implant, electrical interactions between the electrical operation of an isolated device and the NI layer can be neglected. In Type I isolation, trenches must be etched sufficiently deep to overlap directly onto the DN floor isolation regions to perform sidewall isolation. As a result, the trench depth needed for Type I isolation using any given depth of the DN regions is deeper than that needed for Type II isolation. Deeper trenches, however, may be more difficult to manufacture, especially to etch, fill, and planarize. In addition, etching deeper trenches may require a wider trench width to allow the etchant and byproduct gasses to uniformly flow during the etching process. Wider trenches, if required, will cause lower device packing densities than narrower shallower trenches.

Figure 18:
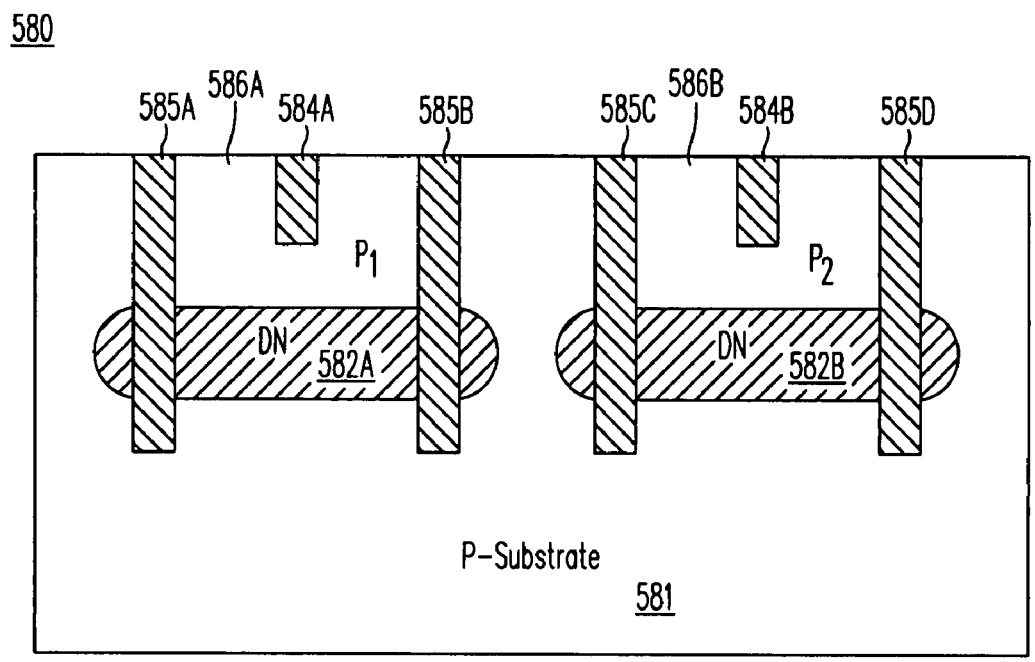
FIG. 18 is a cross-sectional view of a structure produced using a Type-I trench isolation process with implanted floor isolation, and dielectric trench sidewall isolation, including shallow and deep dielectric trench isolation.

One way of avoiding the tradeoff between trench width and depth is to utilize trenches with two different depths that are masked and etched separately, as shown in structure 580 of FIG. 18. Trenches 584A and 584B are relatively shallow and narrow for dense device integration. These shallow trenches are preferably the same or similar to the existing STI used in a given CMOS technology node, and are used to provide surface isolation, i.e. field threshold control, but not complete isolation, between devices in a given isolated P-type pocket. The deeper trenches 585A, 585B, 585C, and 585D are at least as deep as the DN floor isolation regions 582A and 582B (or deeper as shown in FIG. 18) to provide complete electrical isolation among P-type pockets 586A and 586B, and substrate 581. The dual-trench process is somewhat more complex than the single trench process of FIG. 9, but it is possible to share the refill and planarization steps, as described more fully below.

Type-III Epiless Isolation

Figure 10:
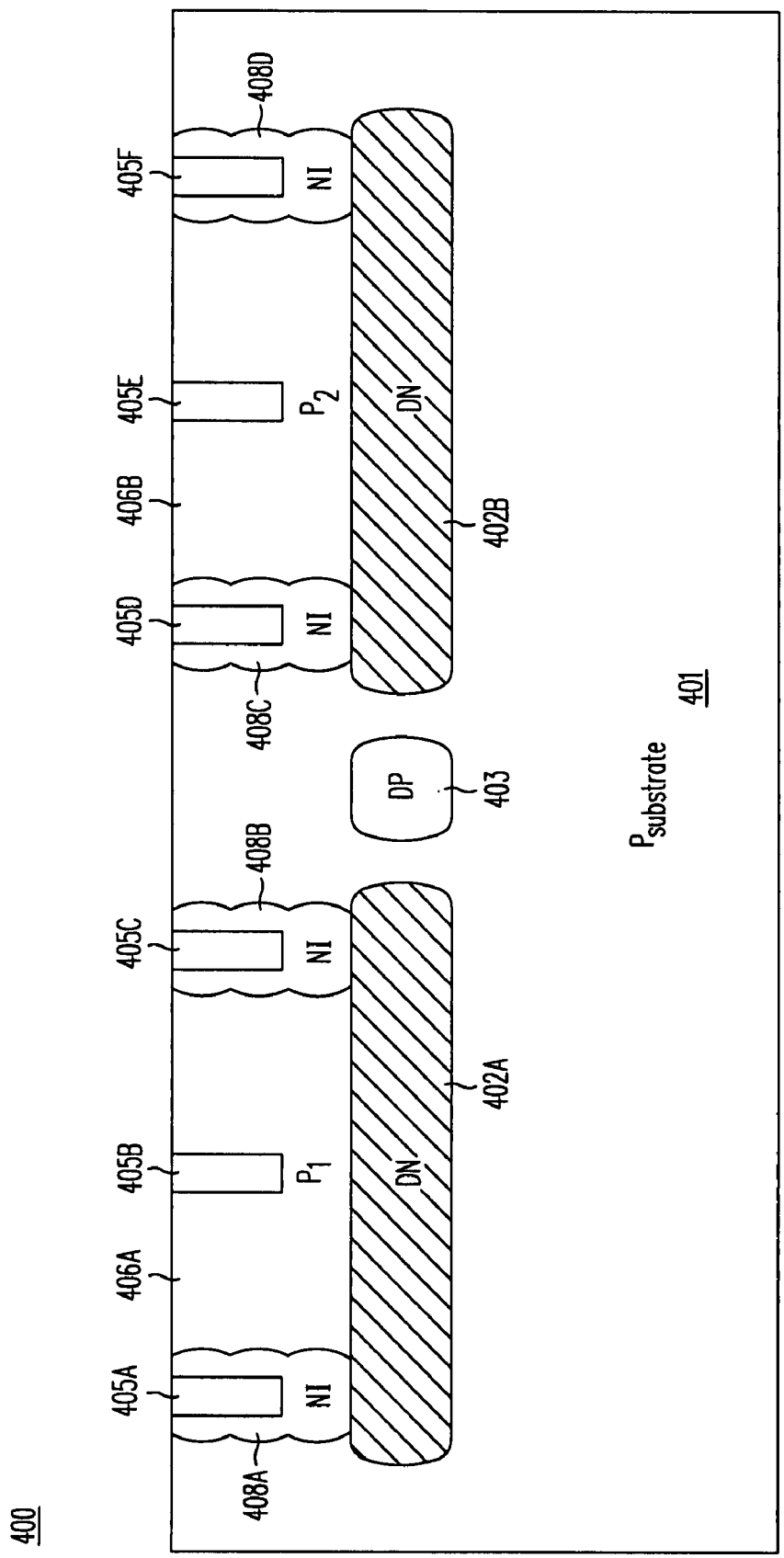
FIG. 10 is a cross-sectional view of a Type-III process capable of fully isolated device integration using implanted floor and sidewall isolation and non-implanted trench regions.

Type III isolation combines a DN region with a chain implanted sidewall isolation region, which may optionally be combined with a dielectrically filled trench for enhanced isolation capability. For example, device structure 400 of FIG. 10 shows two isolated P-type pockets $P_1$, and $P_2$ (i.e. 406A, and 406B, respectively) formed using two high-energy implanted DN floor isolation regions 402A and 402B combined with chain-implanted sidewall isolation regions (NI) 408A, 408B, 408C, and 408D. These implanted sidewall isolation regions are formed using a series of implants of differing energies to vary the depth of the each particular implant, the deepest of which overlaps onto the DN floor isolation regions 402A and 402B and the shallowest of which reaches the surface of the P-type substrate 401. Dielectric filled trenches 405A, 405C, 405D and 405F may optionally be included within or adjacent the implanted sidewall isolation regions 408A, 408B, 408C and 408D to improve isolation. Optional DP region 403 may be used to suppress punch-through between adjacent DN regions 402A and 402B.

Sequentially forming a series of phosphorus implants results in a continuous N-type sidewall isolation region as shown. For example, NI regions 408A and 408B may have an annular or other closed geometric shape, and overlap onto DN region 402A to create P-type region 406A, electrically isolated from substrate 401. Similarly, NI regions 408C and 408D may have an annular or other closed geometric shape, and overlap onto DN region 402B to create P-type region 406B, electrically isolated from substrate 401 and from region 406A.

In Type III isolation, the implant used to form sidewall isolation is unrelated to the process of trench formation, so that the trench may be formed inside an NI sidewall isolation region, such as trenches 405A, 405C, 405D, or 405F, or may be formed inside an isolated pocket such as 405B and 405E. Since the trench in Type III isolation does not have to be deep enough to overlap onto the DN layer, its use within floating pockets 406A and 406B does not subdivide the pocket into regions isolated from one another, i.e. all the devices in pocket $P_1$ share the common potential of P-type region 406A. These shallow trenches are preferably the same or similar to the existing STI used in a given CMOS technology node, and are used to provide surface isolation, i.e. field threshold control, but not complete isolation, between devices in a given isolated P-type pocket.

Figure 17:
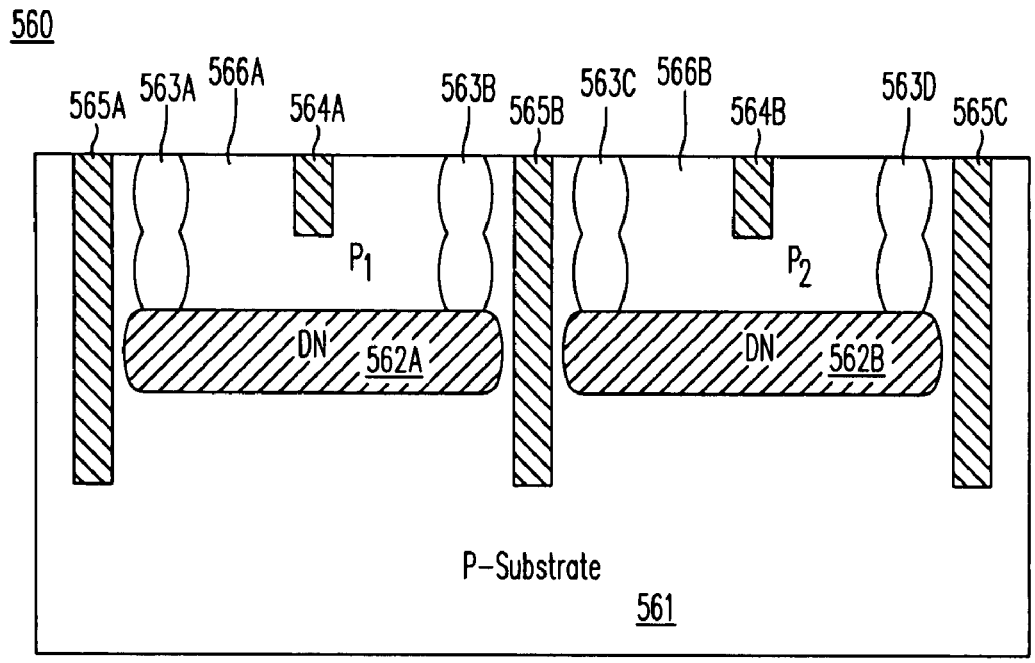
FIG. 17 is a cross-sectional view of a structure produced using a Type-III trench isolation process with implanted floor isolation, implanted sidewall isolation, shallow and deep dielectric trench isolation.

An alternative embodiment of Type III isolation is shown in device structure 560 of FIG. 17. Trenches 564A and 564B are equivalent to trenches 405B and 405E of FIG. 10. Deep trenches 565A, 565B, and 565C replace shallow trenches 405A, 405C, 405D, and 405F of FIG. 10. The deep trenches 565A, 565B, and 565C are placed between adjacent DN regions 562A and 562B to prevent punch-through, in lieu of DP region 403 of FIG. 10. This dual-trench process is somewhat more complex than the single trench process of FIG. 10, but it is possible to share the refill and planarization steps, as described more fully below.

Type-IV Epiless Isolation

Figure 20:
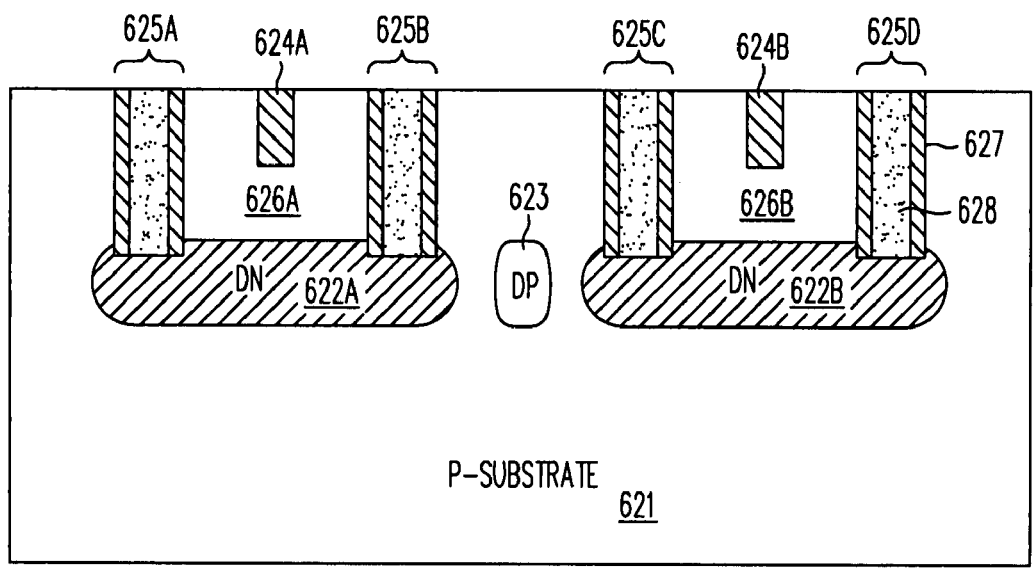
FIG. 20 is a cross-sectional view of a structure produced using a Type-IV trench isolation process with implanted floor isolation, and conductive/dielectric trench sidewall isolation, including shallow trench isolation.

An example of Type IV epiless isolation is shown in device structure 620 of FIG. 20. DN floor isolation regions 622A and 622B are formed in P-type substrate 621. Trenches 625A through 625D overlap onto DN regions 622A and 622B. Optional DP region 623 is formed between adjacent DN regions 622A and 622B. P-type pockets 626A and 626B are electrically isolated from substrate 621 by a combination of trenches 625A-625D circumscribing the pockets 626A and 626B and overlapping onto the floor isolation regions 622A and 622B. Optional trenches 624A and 624B are preferably the same or similar to the existing STI used in a given CMOS technology node. Trenches 624A and 624B are used to provide surface isolation between devices in a given isolated P-type pocket. Trenches 625A-625D will generally be wider and deeper than trenches 624A and 624B.

Unlike Type I isolation, in which the trenches are completely filled with a dielectric, the trenches 625 of Type IV isolation include a conductive material 628, such as doped polysilicon, that is used to provide electrical connection to the DN regions 622. The conductive material 628 in each of trenches 625A-625D is surrounded by dielectric material 627, such as deposited oxide, which isolates conductive material 628 from the P-type pockets 626A and 626B and the substrate 621. In Type IV isolation, trenches 625A-625B are etched at the proper depth to provide good electrical contact between the conductive layer 628 and the DN 622. Although formation of the conductive/dielectric trench fill for Type IV isolation is somewhat more complex than the dielectric-only process of Type I isolation, it provides for a very dense and low-resistance connection to the DN regions. Moreover, it is possible to share some of the refill and planarization steps with the shallow trenches, as described more fully below.

Type-V Epiless Isolation

Figure 21:
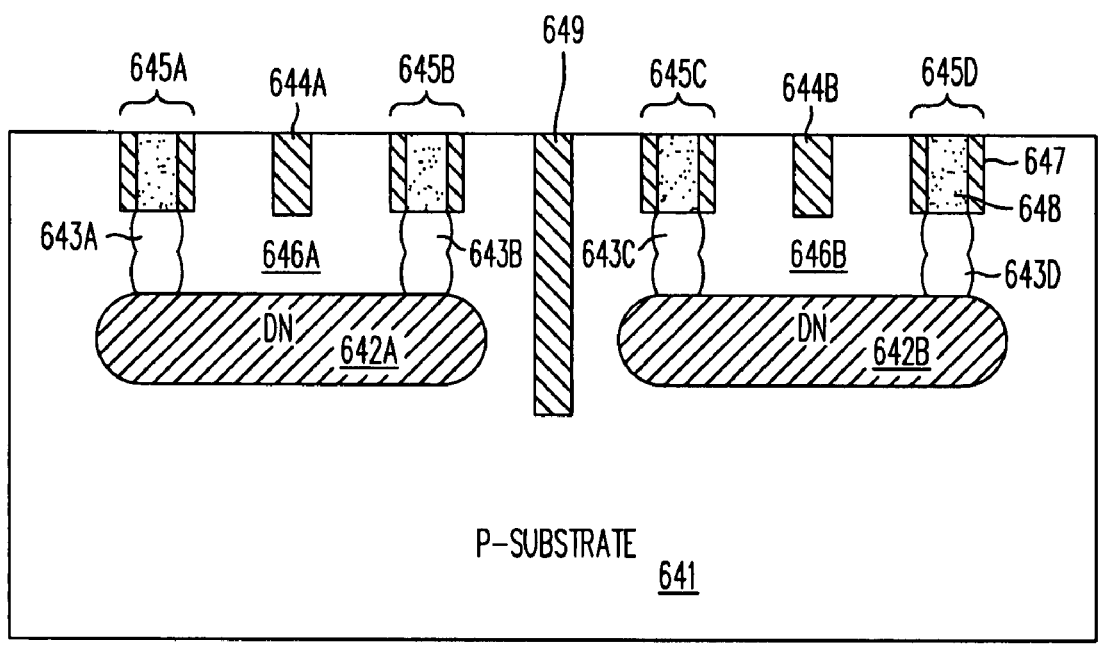
FIG. 21 is a cross-sectional view of a structure produced using a Type-V trench isolation process with implanted floor isolation, conductive/dielectric trench plus implanted sidewall isolation, including deep and shallow trench isolation.

An example of Type V epiless isolation is shown in device structure 640 of FIG. 21. DN floor isolation regions 642A and 642B are formed in P-type substrate 641. Trenches 645A through 645D are etched above portions of DN regions 642A and 642B. Unlike Type IV isolation, trenches 645A-645D are not deep enough to contact DN regions 642A and 642B directly. Instead, NI regions 643A through 643D are used to connect the trenches 645A-645D to the DN regions 642A and 642B. Thus, isolated P-type pockets 646A and 646B are isolated by DN floor isolation regions 642A and 642B below and a combination of trenches 645A-645D and NI regions 643A-643D on the sides.

Trenches 645A-645D of Type V isolation include a conductive material 648, such as doped polysilicon, that is used to provide electrical connection to the DN regions 642A and 642B. The conductive material 648 in each trench 645A-645D is surrounded by dielectric material 647, such as deposited oxide, which isolates conductive material 648 from the P-type pockets 646A and 646B and the substrate 641. The conductive material 648 makes electrical contact through NI regions 643A-643D to DN regions 642A and 642B. NI regions 643A-643D are preferably formed by ion implantation into the bottom of trenches 645A-645D before the trench refill is completed, such that the NI regions 643A-643D are self-aligned to trenches 645A-645D. The trenches 645A-645D be shallower than those used in Type IV isolation, and may preferably be formed by the same etching step used for the optional shallow trenches 644A and 644B. An optional deep trench 649 may be formed between adjacent DN regions 642A and 642B. It is possible for trench 649 to share some of the refill and planarization steps with the shallow trenches 644A, 644B and 645A-645D, as described more fully below.

Type-VI Epiless Isolation

Figure 19:
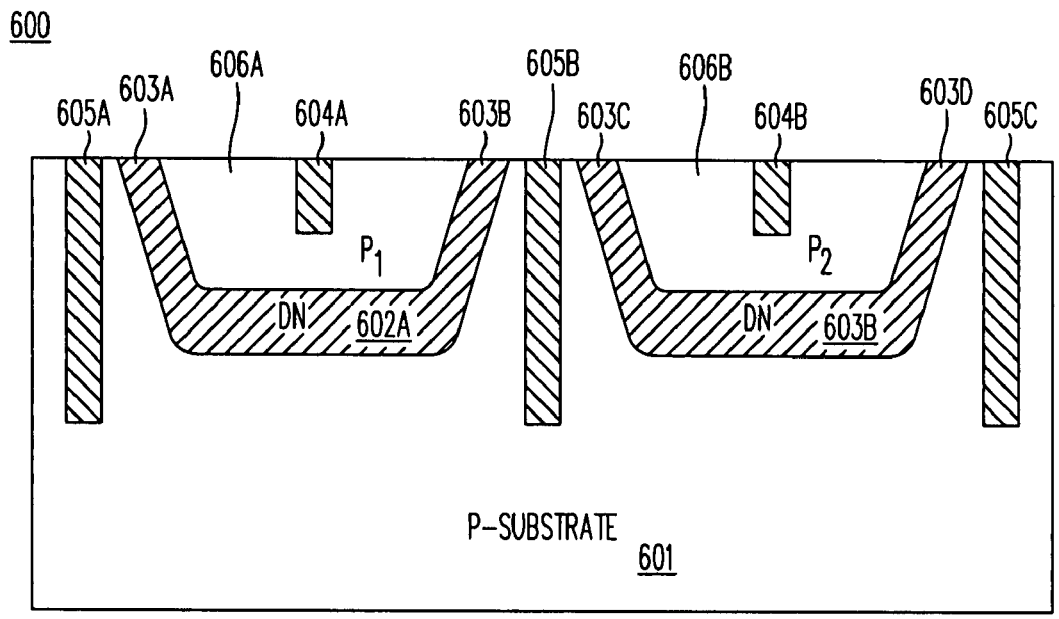
FIG. 19 is a cross-sectional view of a structure produced using a Type-VI trench isolation process with implanted floor isolation and conformal implanted sidewall isolation, combined with shallow and deep dielectric trench isolation.

An example of Type VI epiless isolation is shown in device structure 600 of FIG. 19. DN floor isolation regions 602A and 602B are formed in P-type substrate 601. DN regions include sidewall portions 603A-603D, which are formed by implantation of the high-energy DN regions 602A and 602B through a suitable mask to bring the implant range up to the surface of the substrate over an appropriate distance. This may be accomplished, for example, by forming a mask layer over the substrate with sidewalls of a fairly shallow angle, such as 45-75 degrees. This is similar to the prior art isolation technique shown in FIG. 6, which uses a LOCOS field oxide layer for the masking layer, but in the present invention the masking layer does not remain on the wafer, but is removed. This sacrificial mask layer may be an etched oxide, photoresist, or other material. After implantation of DN regions 602A and 602B through the sacrificial mask layer, P-type pockets 606A and 606B are completely isolated by the DN regions 602A and 602B and sidewall portions 603A-603D. The sidewall portions 603A-603D also provide electrical contact to the DN regions 602A and 602B. Optional shallow trenches 604A and 604B may be formed within the P-type pockets 606A and 606B to provide surface isolation among the devices therein, and optional deep trenches 605A-605C may be formed between adjacent DN regions 602A and 602B to alleviate punch-through.

Isolation Fabrication & Process Sequences

In principle, because there are no high temperatures required to achieve electrical isolation used the disclosed techniques, the formation of the NI sidewall isolation regions, the dielectric filled trenches, and the DN floor isolation regions can be performed in any order without adversely impacting the electrical isolation of integrated devices. In practice, however, some fabrication sequences are preferred since they simplify wafer processing. For example it is easier to implant into the bottom of an etched trench prior to filling the trench since only a low energy implant is needed, and it is possible to self-align the implant to the trench. Implanting after the trench filling process requires high energies to penetrate to the same depth.

Figures 11A, 11B, 11C:
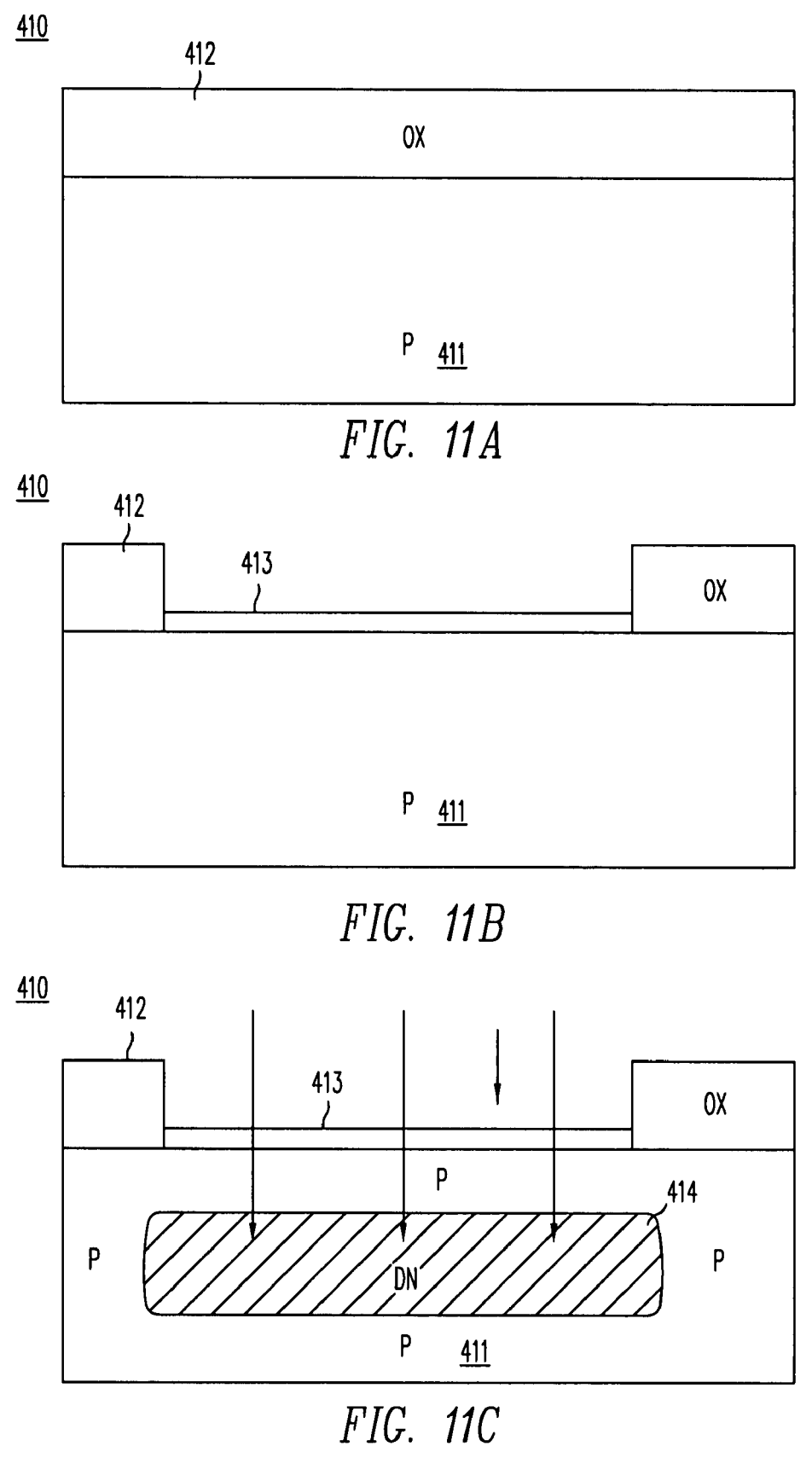

FIGS. 11A-11C illustrate one method to form the DN floor isolation region using high energy ion implantation without the need for high temperature processing or epitaxy. In FIG. 11A, a mask layer 412 is formed sufficiently thick to block the high energy DN implant. This masking material is preferably photoresist, but may also be an oxide or other suitable material. In FIG. 11B, the wafer is patterned by removing the mask layer 412 in areas where the DN region is to be implanted. A pre-implant oxide layer 413 may be thermally grown or deposited before or after to the masking step, or etching of the mask layer 412 can be interrupted before it is completely removed, leaving oxide layer 413 in the areas to be implanted. In FIG. 11C, high energy implantation, preferably a phosphorous implant in the range of 1.5 MeV to 4.5 MeV at a relative high dose, preferably in the range of 1 to 5E13 cm−3 is used to form DN floor isolation region 414 in P-type substrate 411 beneath thin oxide layer 413 but not beneath mask layer 412. In a preferred embodiment no trenches are present in the substrate at this time.

FIGS. 12A-12E illustrate the formation of Type II isolation structures. As shown in the cross-sectional view of FIG. 12A, a P-type substrate 421 containing DN region 424 has mask layer 425 formed and patterned to form openings 426. Mask 425 is preferably a deposited oxide hardmask, in the range of 3000-8000Å thick, but alternative materials such as photoresist may also be used. An optional second layer 433 may be formed and patterned between mask layer 425 and substrate 421. This layer may be, for example, silicon nitride or other suitable material for use as an etch-stop layer for subsequent planarization.

Figure 12A:
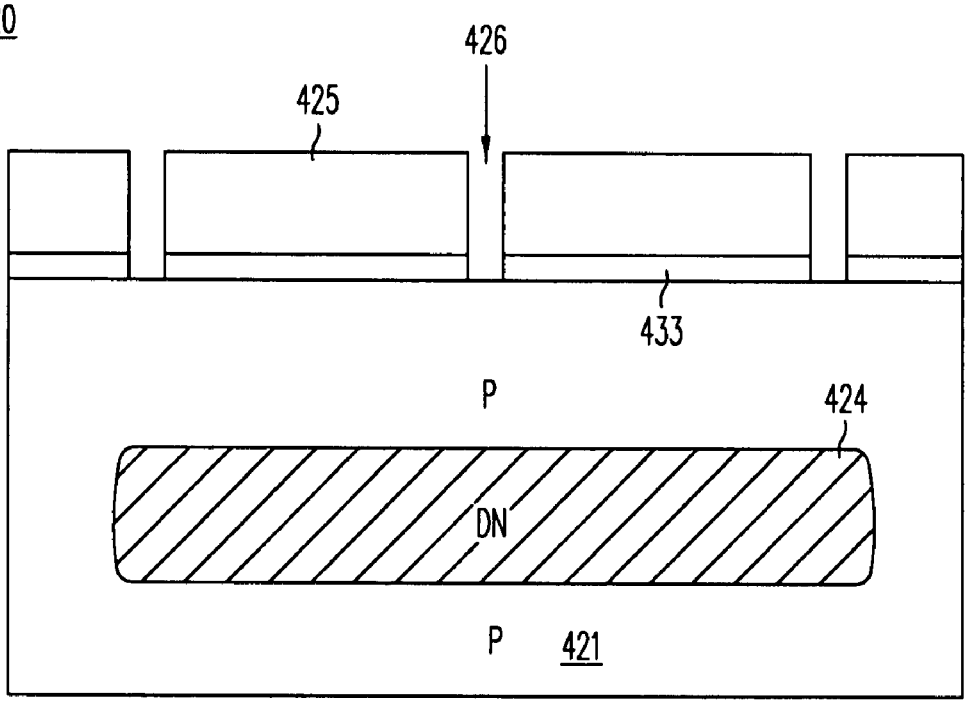
FIGS. 12A-12E illustrate a Type-II trench isolation process with implanted floor and trench-bottom isolation.
Figure 12B:
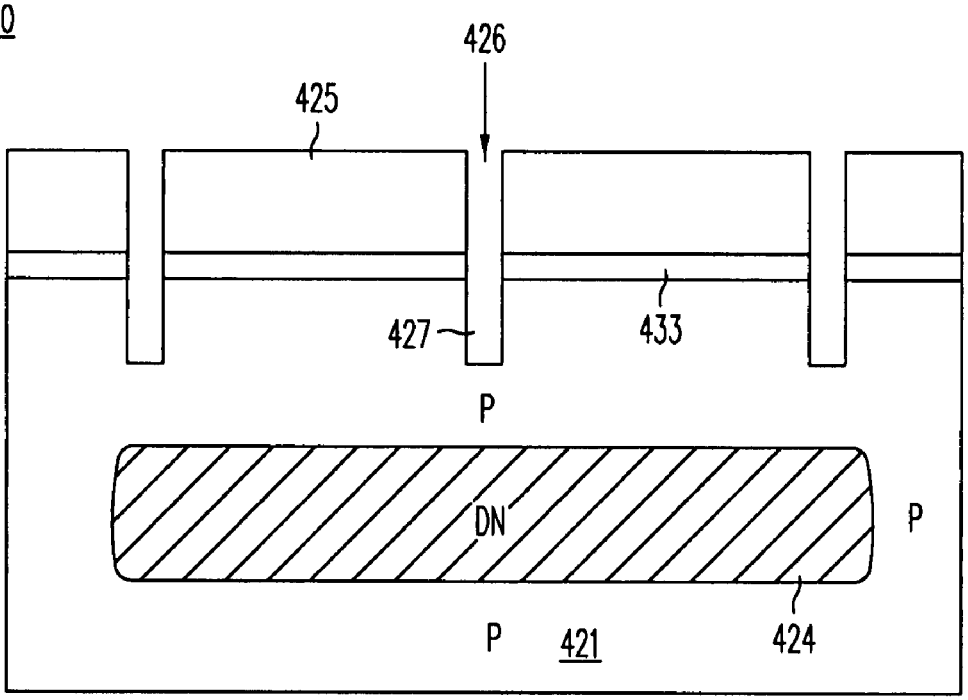
Figure 12C:
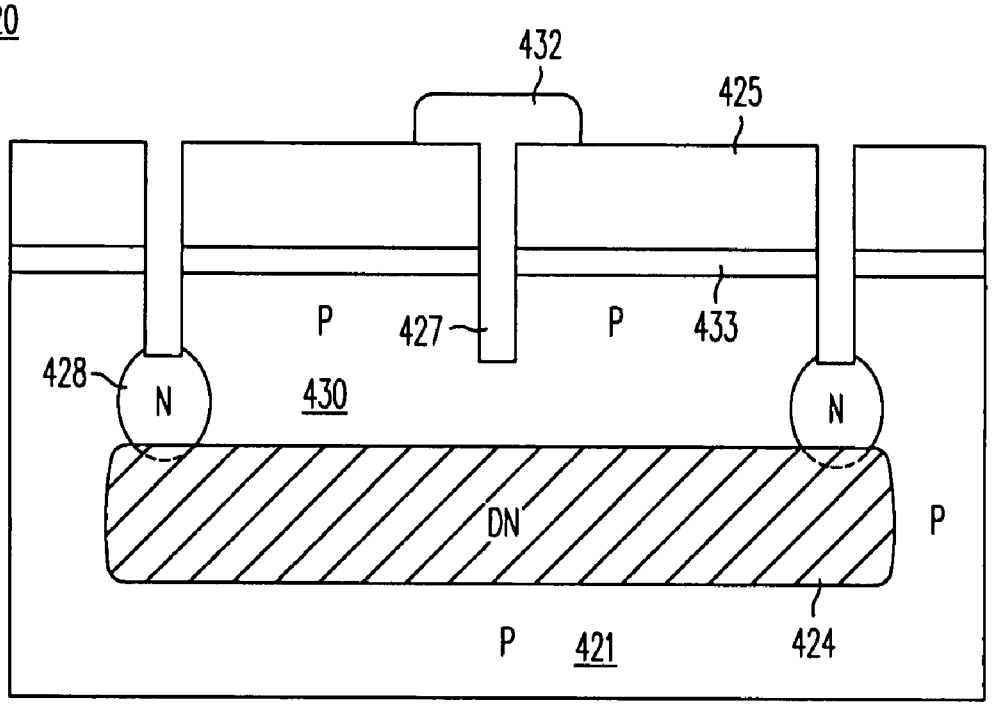
Figure 12D:
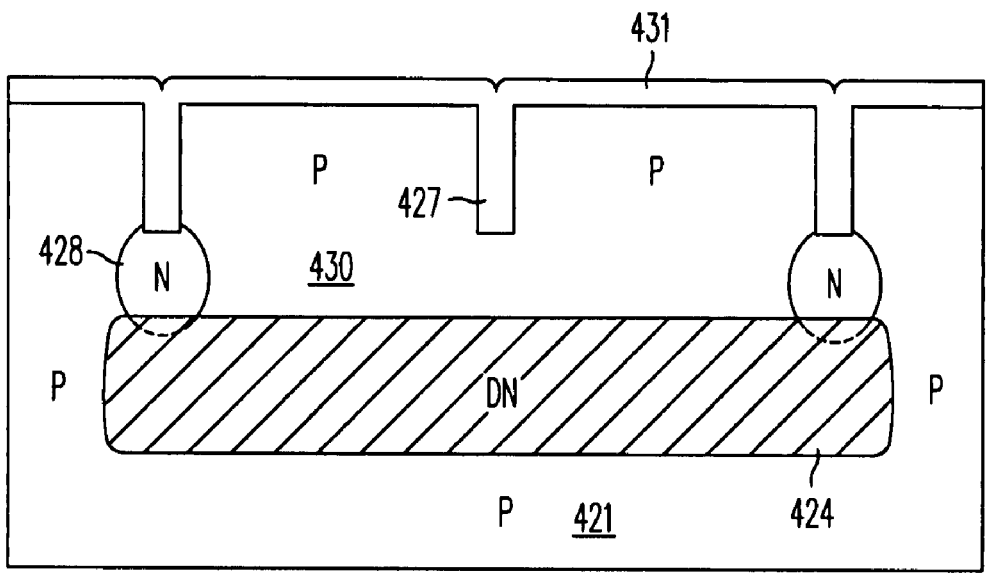
Figure 12E:
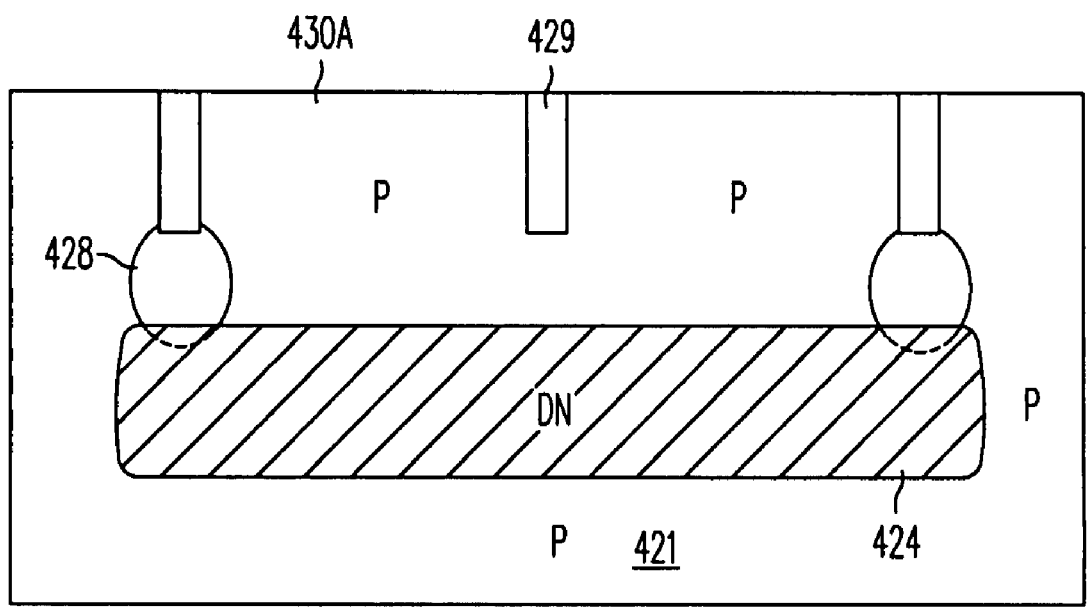

In FIG. 12B, trenches 427 are etched into substrate 421 to a depth that is less than the depth of DN region 424, and preferably the same depth as used to form STI in the given CMOS technology, using well-known plasma or reactive ion etch techniques. FIG. 12C illustrates the formation of NI regions 428 by an implant into the bottom of the trenches 427 to complete electrical isolation of floating P-type region 430. Mask layer 425 used for trench etching is preferably used for this implantation, advantageously providing self-alignment of NI regions 428 to trenches 427. An optional second mask layer 432 may be deposited and patterned to prevent the NI implant from forming in trenches 427 that will provide surface isolation among devices within floating P-type region 430. FIG. 12D shows the structure after mask layer 425 is removed and the trenches 427 are filled by a dielectric material 431, for example a deposited oxide. The structure is planarized by CMP or other techniques resulting in planarized structure 420 shown in FIG. 12E, which includes filled trenches 429, DN floor isolation region 424, and NI isolation regions 428, which together isolate floating P-type region 430 from P-type substrate 421.

Figure 22A:
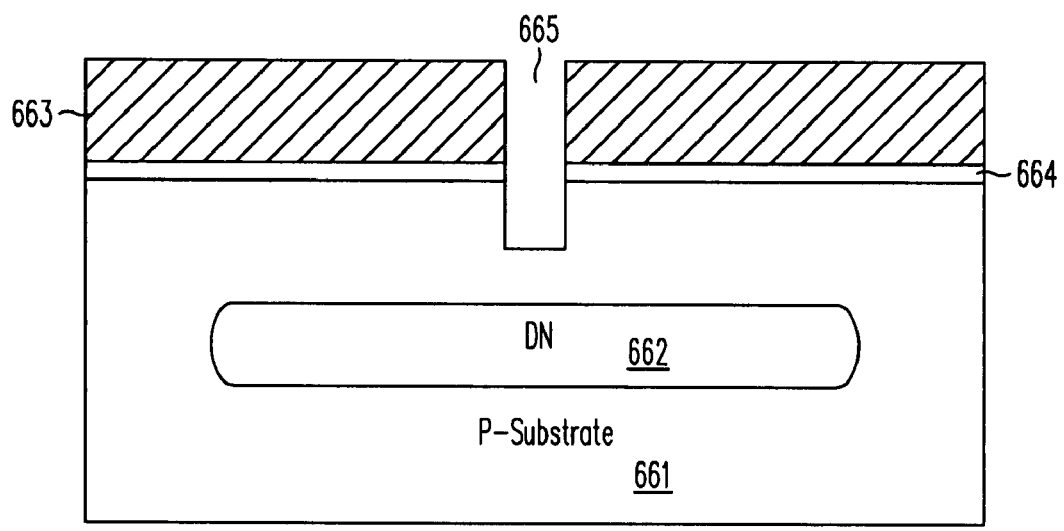
FIGS. 22A-22C show a Type-I trench isolation process including shallow and deep dielectric trench isolation.
Figure 22B:
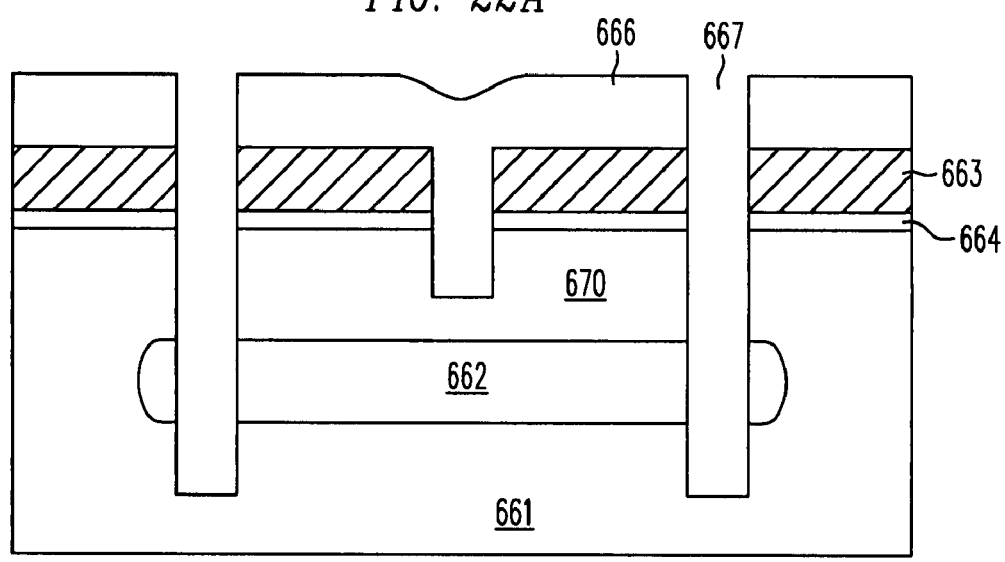
Figure 22C:
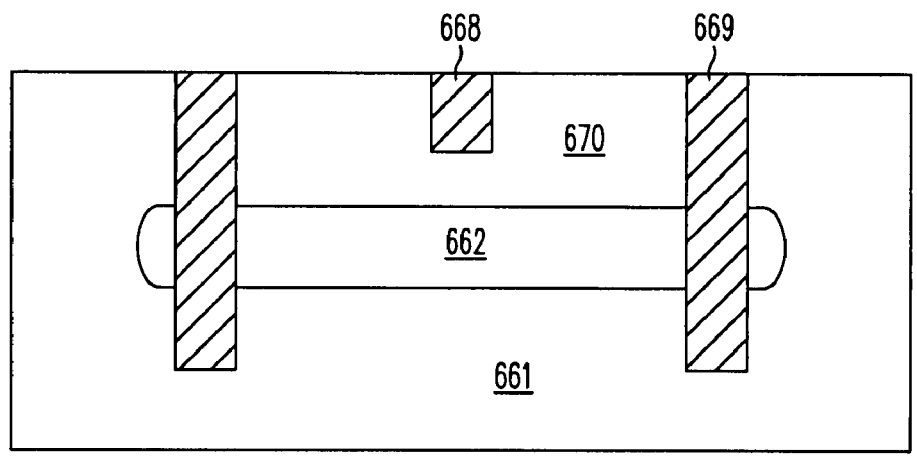

FIGS. 22A-22C illustrate the formation of Type I isolation structures. FIG. 22A shows the isolation structure after formation of DN floor isolation region 662, formation of mask layers 663 and 664, and etching of shallow trenches 665, using the same process as described in FIG. 12, above. FIG. 22B shows the structure after deposition and patterning of optional second mask layer 666. In a preferred embodiment, mask layer 664 is nitride or other layer suitable for etch-stop during planarization, mask layer 663 is a hard mask material such as deposited oxide, and mask layer 666 is a photoresist or similar material. Deeper trenches 667 are etched through the openings in mask layer 666. After the removal of mask layers 663, 664 and 666, the deep trenches 667 and optional shallow trenches 665 are refilled simultaneously by dielectric deposition. The structure is then planarized by CMP or other techniques, resulting in the planarized structure shown in FIG. 22C, which includes dielectric filled deep trenches 669 and DN floor isolation 662 region, which together isolate floating P-type region 670 from P-type substrate 661. Optional dielectric filled shallow trenches 668 provide surface isolation among devices formed in P-type region 670.

Figure 13A:
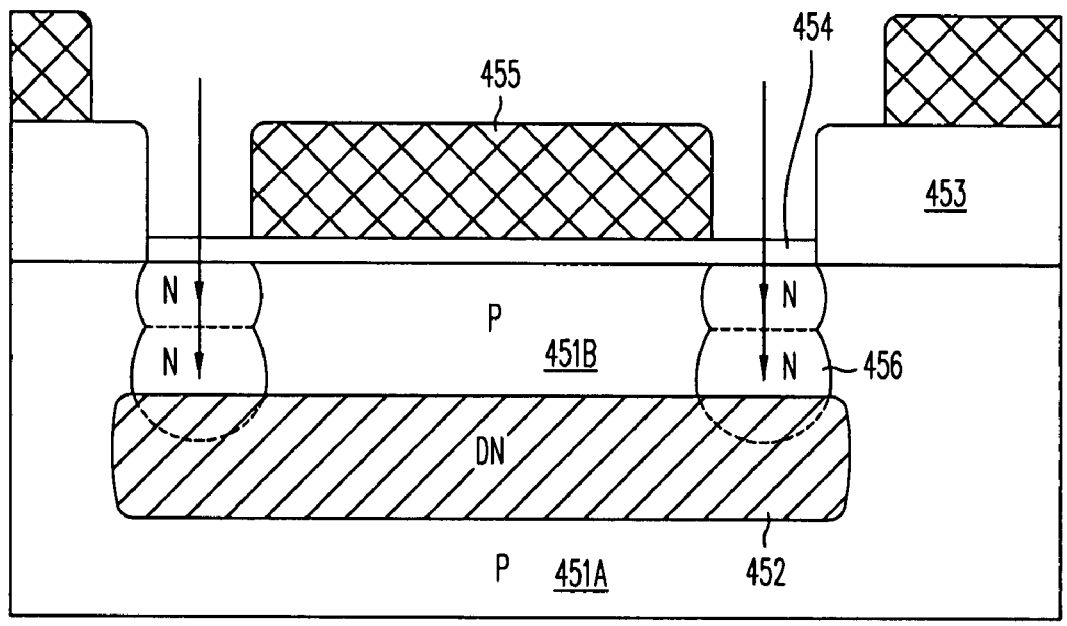
FIGS. 13A-13D illustrate a Type-III trench isolation process with implanted floor and sidewall isolation.

Fabrication of Type III isolation is illustrated in FIGS. 13A-13D. FIG. 13A shows the isolation structure 450 after formation of DN region 452, which is implanted at high-energy through first mask layer 453, which is preferably a deposited and etched hard mask material such as oxide. Second mask layer 455, preferably photoresist, is then deposited and patterned. A chain-implant of phosphorus is then used to form sidewall junction isolation regions 456 extending from the surface and overlapping onto DN floor isolation region 452. Using Type III isolation, floating pocket 451B is completely enclosed by N-type junction isolation on all sides, isolating it from surrounding P-type substrate 451A.

In this preferred embodiment, mask layer 453, used to define the lateral extent of DN region 452, is also used to define the outer edge of sidewall isolation regions 456, thus providing self-alignment between regions 452 and 456. To accomplish this, mask 455 layer is defined on top of (but not overlapping the edge of) mask layer 453 and also on top of the exposed surface of substrate 451A, which may be covered with a thin oxide 454. Thus, the phosphorus chain implant may not penetrate either mask layer 455 or mask layer 453. Thin pre-implant oxide 454 may be a remnant of prior process steps, or may be grown prior to implanting sidewall isolation regions 456. Using, for example, the process sequence illustrated in FIGS. 11A-11C, oxide layer 453 defines the outer edge of both DN floor isolation region 452 and sidewall isolation regions 456.

Figure 13B:
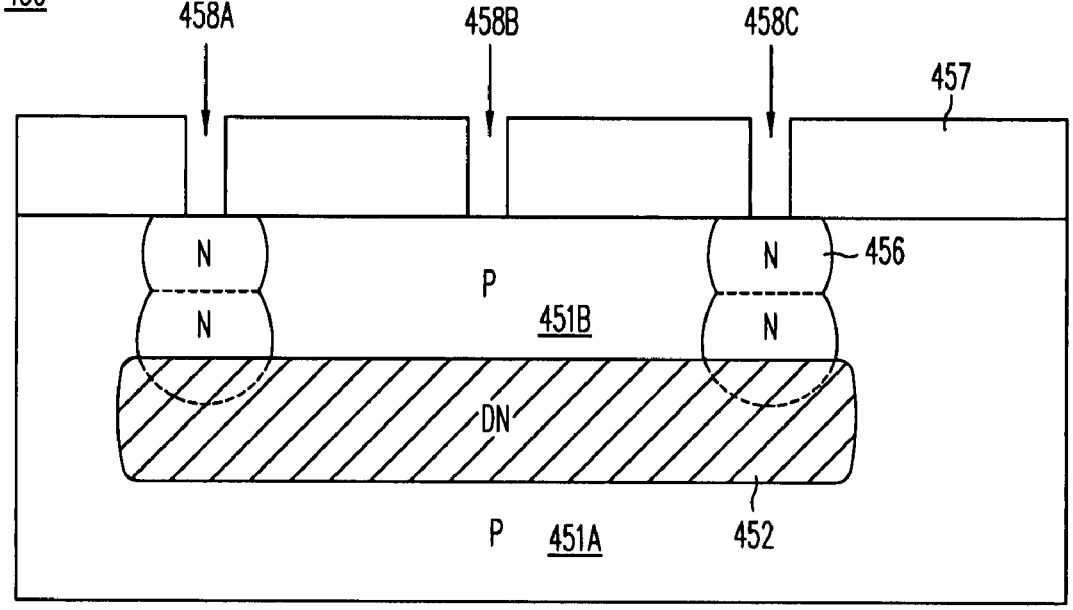

In subsequent processing shown in FIG. 13B, the surface oxide layers 453 and 454 and mask layer 455 are removed and a new mask layer 457 is defined using low temperature techniques to avoid diffusion of DN region 452. Windows 458A and 458C are defined in the mask layer 457 atop or adjacent sidewall isolation regions 456. Optional windows 458B, not overlapping the isolation regions 456, may also be formed.

Figure 13C:
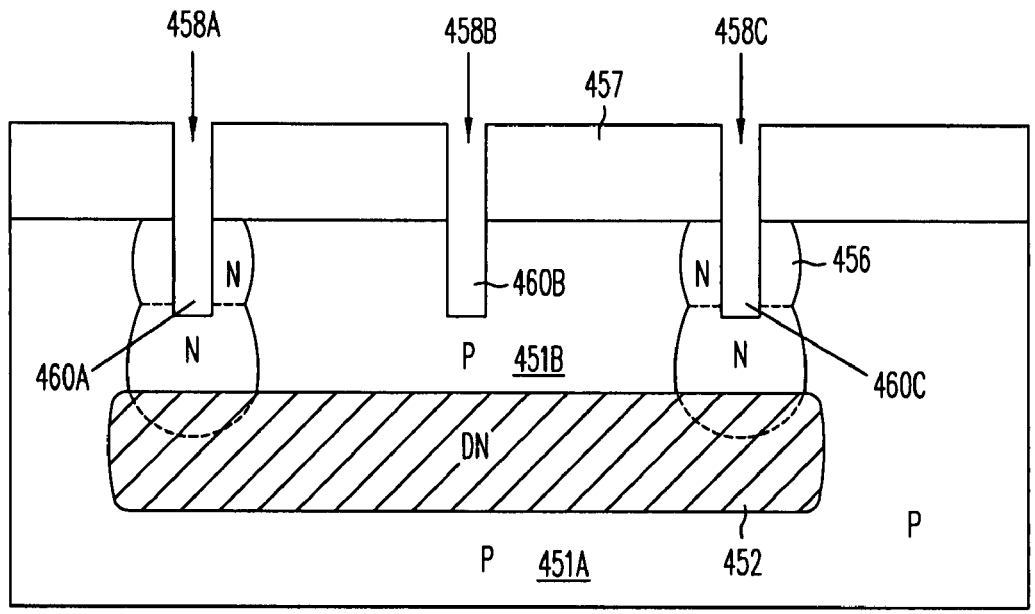
Figure 13D:
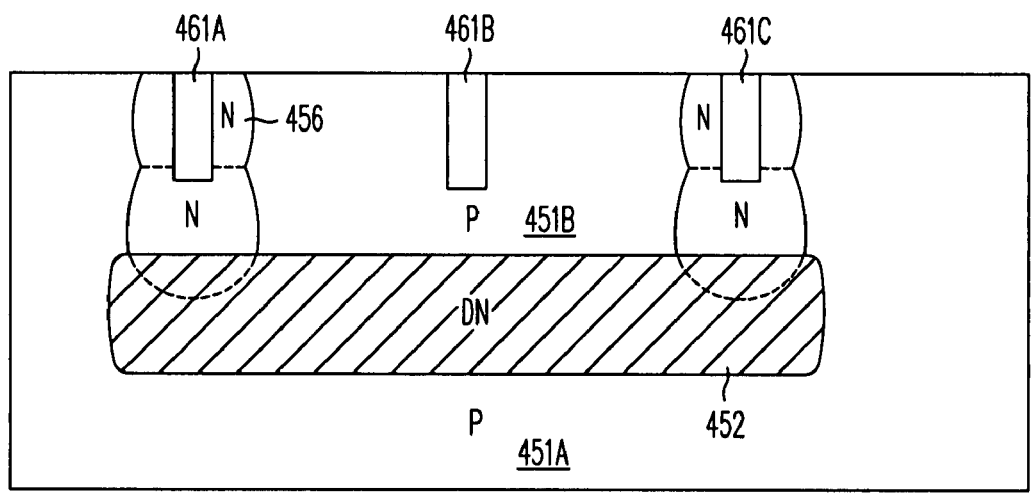

In FIG. 13C, trenches 460A, 460B, and 460C are etched through the windows in mask layer 457. After mask layer 457 is removed, trenches 460A, 460B, and 460C are filled with a dielectric material and planarized. FIG. 13D shows the resulting isolation structure 450. Regions 456 and 452 provide isolation of P-type region 451B from substrate 451A. Filled trenches 461A and 461C within or adjacent sidewall isolation regions 456, are optional but improve the isolating ability of the structure by completely eliminating the possibility of either majority carrier or minority carrier conduction near the surface. Filled trenches 461B provide surface isolation among devices within region 451B. By combining these process steps with the deep trench steps described in FIG. 22, above, it is possible to produce the structure of FIG. 17, which provides deep trench isolation between adjacent DN regions 562A and 562B. Since the deep and shallow trenches can share the same dielectric refill and planarization steps, the added process complexity is minimal.

Figure 23A:
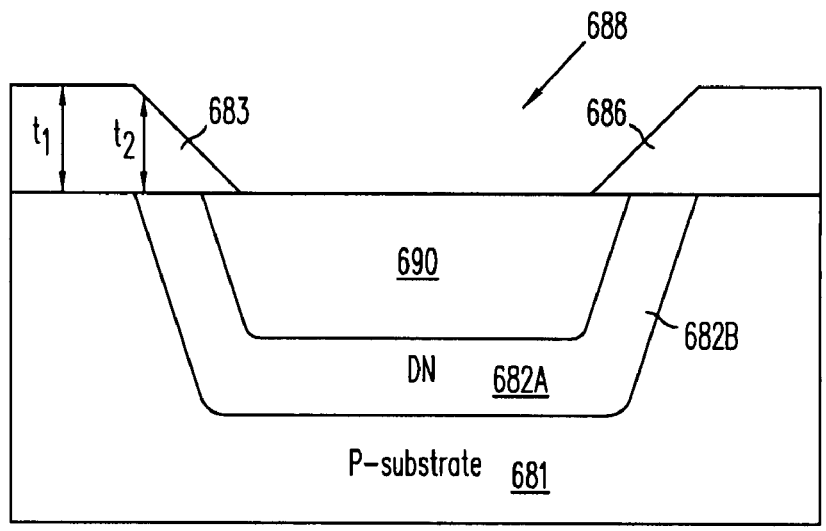
FIGS. 23A-23C show a Type-VI trench isolation process including a conformal implanted isolation layer.
Figure 23B:
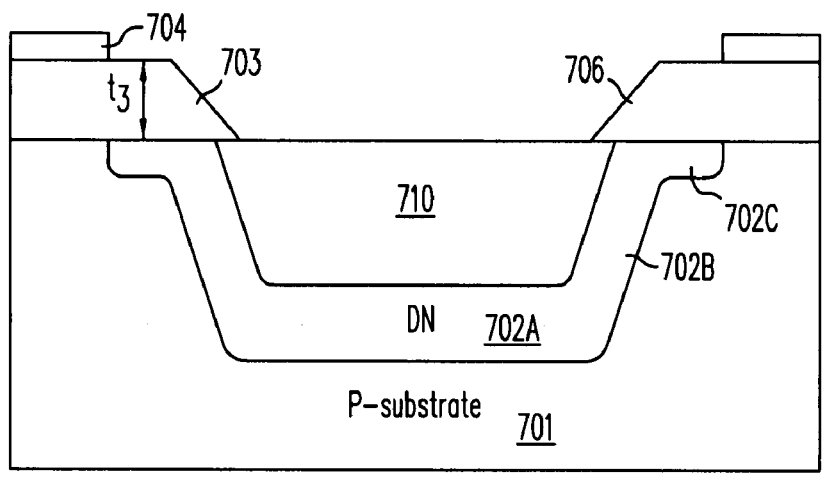
Figure 23C:
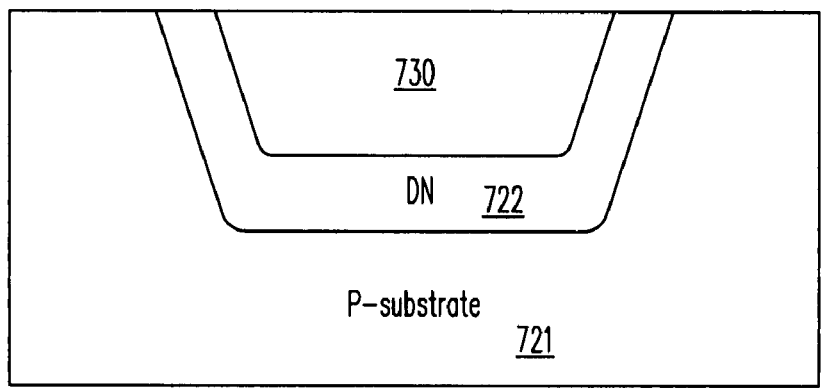

FIGS. 23A-23C illustrate the formation of Type VI isolation structures, which include conformal implanted DN regions. FIG. 23A shows one method of forming the conformal DN region 682. Mask layer 683 is deposited and patterned using a hard mask layer, such as oxide, or a soft mask layer such as photoresist. An opening 688 in mask layer 683 is formed with an intentionally sloped sidewall 686. As shown in FIG. 23A, mask layer 683 has a thickness $t_1$ at an outer periphery of the opening 688 and a thickness that is significantly less than $t_1$ at an inner periphery of the opening 688. The thickness at the inner periphery is shown to be zero in FIG. 23A, but in other embodiments the thickness may be greater than zero in this area. The outer periphery and inner periphery of opening 688 define the limits of the sloped sidewall 686. As shown in FIG. 23A, intermediate between the outer periphery and the inner periphery is a point where the thickness of mask layer 683 is $t_2$. Several possible techniques for this process step are described below. The total thickness $t_1$ of mask layer 683 is sufficient to completely prevent implantation of the DN layer. The mask layer 683 has a continuously decreasing thickness at the location of sidewall 686 such that the DN implant penetrates into the substrate 681 at continuously varying depths, conforming to the thickness profile of mask layer 683 at sidewall 686. When the thickness of the mask layer 683 is $t_2$ the DN implant just reaches through the sidewall 686 such that it is positioned at the surface of substrate 681. The depth of the DN implant reaches its maximum at the inner periphery end of the opening 688, where the thickness of mask layer 683 reaches its minimum and the implant goes the farthest into the substrate. Conformal DN region 682A, 682B completely isolates P-type pocket 690 from P-type substrate 681.

FIG. 23B shows another method of forming the conformal DN region 702. Mask layer 703 is deposited and patterned using a hard mask layer, such as oxide. A second mask layer 704, such as photoresist, is defined over portions of mask layer 703. The openings in mask layer 703 are formed with intentionally sloped sidewalls 706. The combined thickness of mask layers 703 and 704 is sufficient to completely prevent the N-type dopant used to form DN region 702 from penetrating mask layers 703 and 704 to reach substrate 701. However, the total thickness $t_3$ of mask layer 703 is designed to allow the N-type dopant to penetrate just below the surface of substrate 701, such that a surface portion 702C of DN region 702 is formed where the full thickness of mask layer 703 is exposed. In the area below sidewalls 706, mask layer 703 has a gradually decreasing thickness such that the N-type dopant used to form DN region 702 penetrates into the substrate 701 at continuously varying depths, conforming to the profile of sidewalls 706 so as to form a sloping portion 702B of DN region 702. In the opening of mask layer 703 between sidewalls 706, the N-type dopant used to form DN region 702 penetrates into substrate 701 to form a floor portion 702A of DN region 702. Conformal DN region 702 completely isolates P-type pocket 710 from P-type substrate 701.

FIG. 23C shows the Type VI isolation structure of FIG. 23A after removal of the masking layers. Conformal DN region 682 is saucer-shaped and forms both the floor isolation and the sidewall isolation, such that isolated P-type region 690 is completely junction isolated from P-substrate 681. Subsequent processing may include the formation of shallow trenches to provide surface isolation within each P-type pocket, and/or deep trenches between adjacent DN regions to prevent punch-through. These process steps may be, for example, the same as described in FIG. 22C. An example of a resulting Type VI isolation structure is shown in FIG. 19. In its simplest form (i.e. FIG. 23C), Type VI isolation requires only one mask step and a single implant to form complete junction isolation without epitaxy or high-temperature diffusions. However, it requires development of a mask process that provides for controlled sidewall angles to facilitate the conformal implant.

One method of forming a mask layer with controlled sidewall angles includes deposition of an oxide layer, masking with photoresist, and etching the oxide layer with one or more etching processes that etch the oxide layer laterally as well as vertically. For example, a single reactive ion etching (RIE) process may be optimized to provide such a controlled sidewall angle. This RIE process may comprise a sequence of sub-processes with various lateral and vertical etch rates. Alternatively, a sequence of wet etching steps and RIE steps may be employed to etch the oxide. Instead of oxide, a metal layer or polysilicon layer could be used as the mask layer, or a stack of different materials and different etching process could be employed. Moreover, a thick photoresist mask may be formed using a sequence of developing and baking procedures to produce controlled sidewall angles.

Figure 24A:
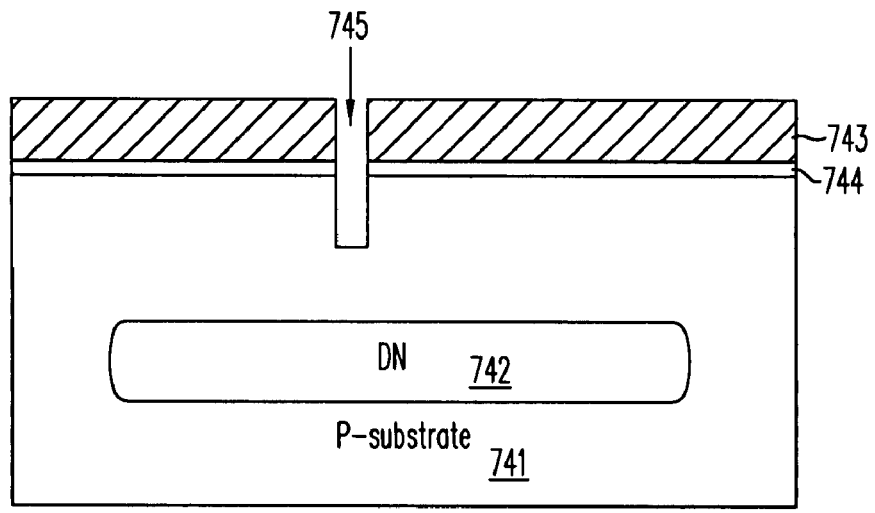
FIGS. 24A-24F show another Type-IV trench isolation process.

FIGS. 24A-24F illustrate the formation of Type IV isolation structures, which include implanted DN regions contacted by conductive trench refill regions. FIG. 24A shows the structure after formation of the DN region 742, as described above, and deposition and patterning of optional planarization etch-stop layer 744, made of silicon nitride or other suitable material, and mask layer 743, preferably a hard mask of deposited oxide or other suitable material. A shallow trench 745 is etched into P-substrate 741 through openings in mask 743. Trenches 745 are preferably compatible with standard STI of a given CMOS technology.

Figure 24B:
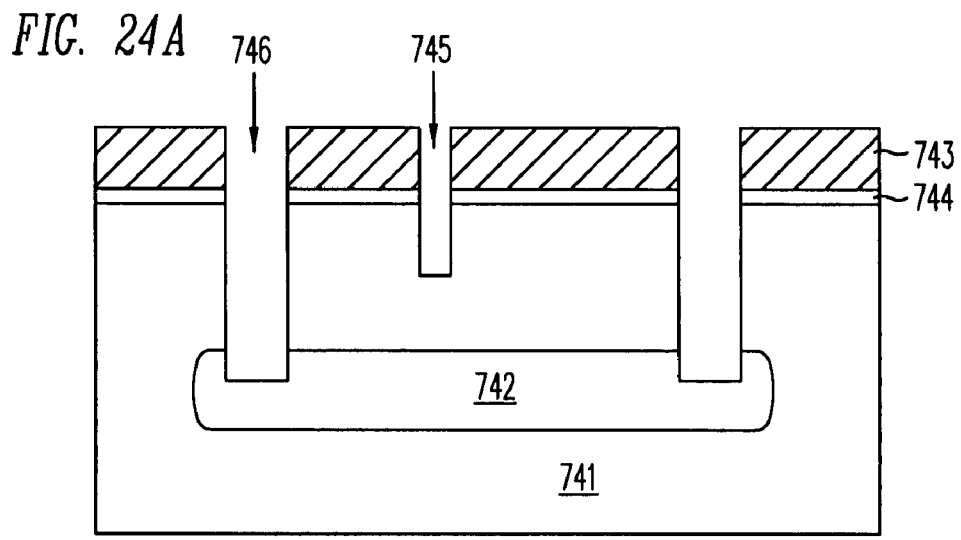

FIG. 24B shows the structure after patterning and etching of trenches 746. These trenches are deeper than trenches 745, and extend into the DN region 742. Trenches 746 are also wider than trenches 745, to allow formation of dielectric refill in trenches 745 and conductive/dielectric refill in trenches 746, as described below. By way of example, trenches 745 may be about 0.5 micron wide and 0.5 micron deep, while trenches 746 may be about 1 micron wide and 1.5 micron deep.

Figure 24C:
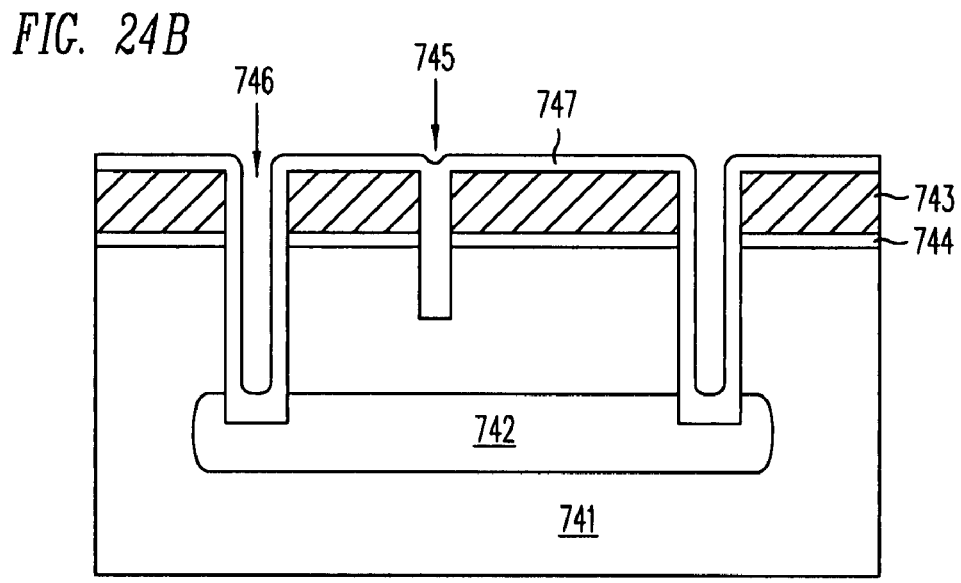

FIG. 24C shows the structure after deposition of a dielectric layer 747. The dielectric layer 747 preferably has good conformality, for example a TEOS deposited oxide may be used. The deposition thickness is designed to completely refill narrow trenches 745, but only cover the sidewalls of wider trenches 746. In the example given here, a 0.3 micron thickness could be used to completely refill the 0.5 um wide shallow trenches 745 and form a 0.3 micron layer on each sidewall of the deep trenches 746, leaving a 0.4 micron wide space in the deep trenches 746.

Figure 24D:
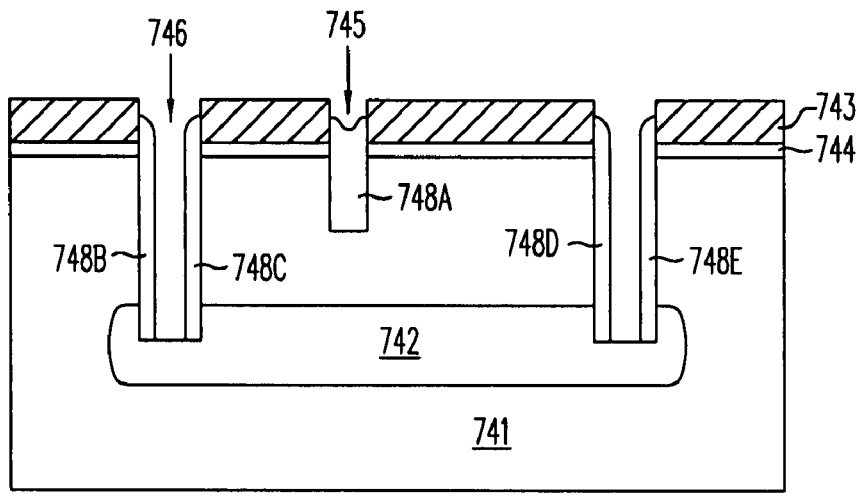

FIG. 24D shows the type IV structure after etchback of the dielectric layer 747. The etchback, preferably done by well-known reactive ion etching techniques, should entirely remove the dielectric 747 from the bottom of the deep trenches 746. In doing so, the dielectric 747 will likely also be removed from the surface, and the underlying mask layer 743 may also be etched, depending on the materials used and their relative etch rates. After this etchback step, sidewall dielectric layers 748B, 748C, 748D, and 748E remain in deep trenches 746, while shallow trenches 745 are completely filled by dielectric region 748A, which should extend above the original surface of substrate 741.

Figure 24E:
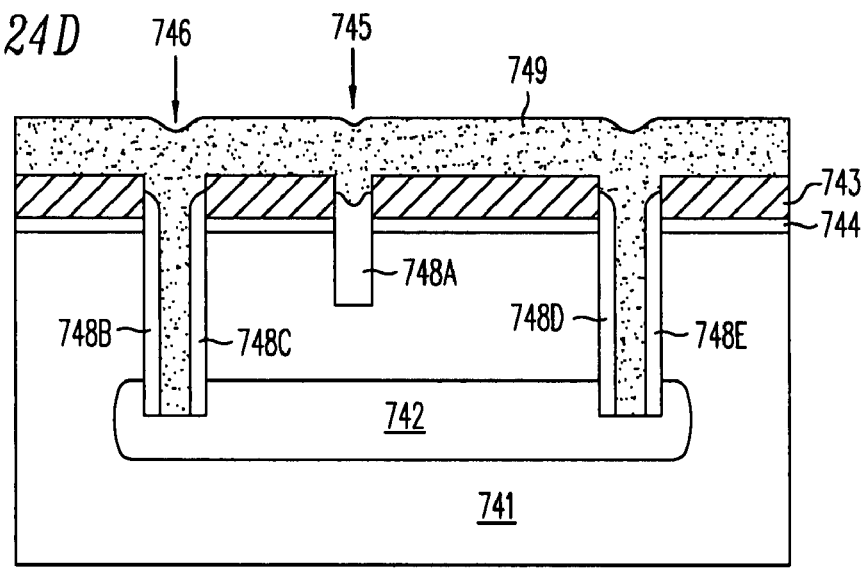

FIG. 24E shows the structure after deposition of a conductive layer 749, which is preferably highly conductive and conformal, such as in-situ doped polysilicon. The deposition thickness of layer 749 is designed to provide complete refill of deep trenches 746.

Figure 24F:
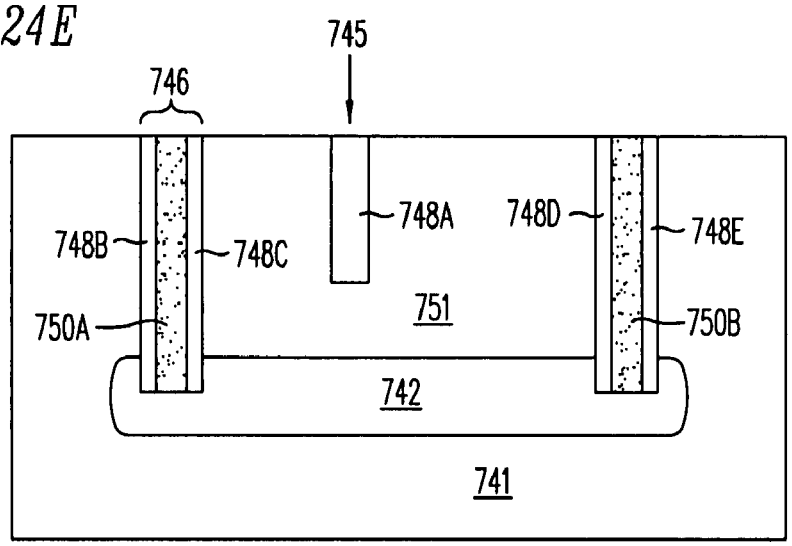

FIG. 24F shows the type IV isolation structure after planarization. In this example, the structure has been planarized back to the original surface of substrate 741. This is preferably accomplished by CMP and/or etchback processes. The final structure comprises isolated P-type region 751 which is isolated by DN 742 on the bottom and by refilled trenches 746 on the sides. Trenches 746 are filled by conductive material 750A and 750B which provide electrical contact to DN region 742. The conductive refill 750 is surrounded by dielectric 748, such that it is isolated from P-type region 751 and substrate 741.

Type IV isolation advantageously provides very compact electrical connections to the DN layer, via deep trenches with conductive refill. Moreover, the formation of these trenches shares many steps in common with the formation of standard STI isolation within each isolated P-type region, including dielectric deposition and planarization steps, so there is little added process complexity to achieve the DN layer contact.

Figure 25A:
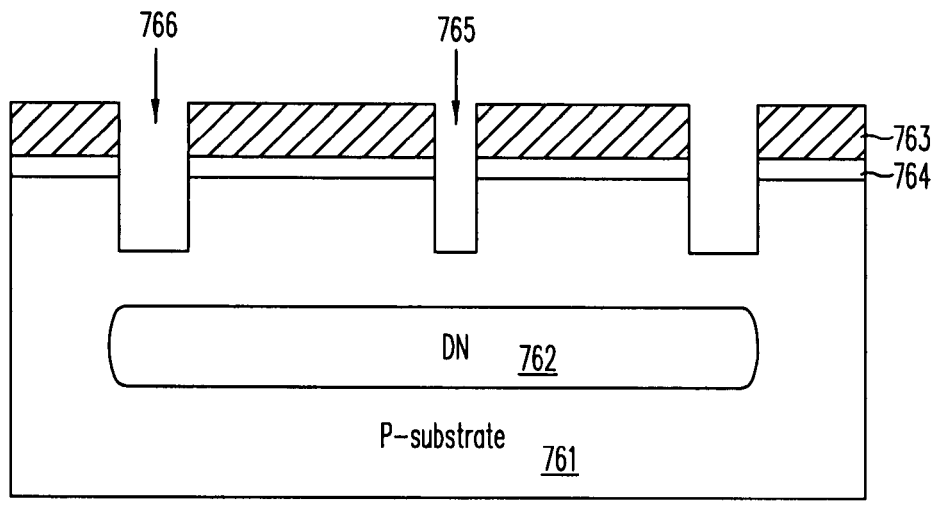
FIGS. 25A-25E show a Type-V trench isolation process.

FIGS. 25A-25E illustrate the formation of type V isolation structures, which include implanted DN regions contacted by conductive trench refill regions via implanted sidewall extensions. FIG. 25A shows the structure after formation of the DN region 762, as described above, and deposition and patterning of optional planarization etch-stop layer 764, made of silicon nitride or other suitable material, and mask layer 763, preferably a hard mask of deposited oxide or other suitable material. Shallow trenches 765 are etched into P-substrate 761 through openings in mask 763. Trenches 765 are preferably compatible with standard STI of a given CMOS technology. Trenches 766 are etched at the same time as trenches 765. These trenches are wider than trenches 765, to allow formation of dielectric refill in trenches 765 and conductive/dielectric refill in trenches 766, as described below. By way of example, trenches 765 may be about 0.5 micron wide and 0.5 micron deep, while trenches 766 may be about 1 micron wide and 0.5 micron deep. Compared to Type IV isolation described above, Type V has an advantage in that only a single trench mask and etch are required to form the STI and sidewall isolation trenches.

Figure 25B:
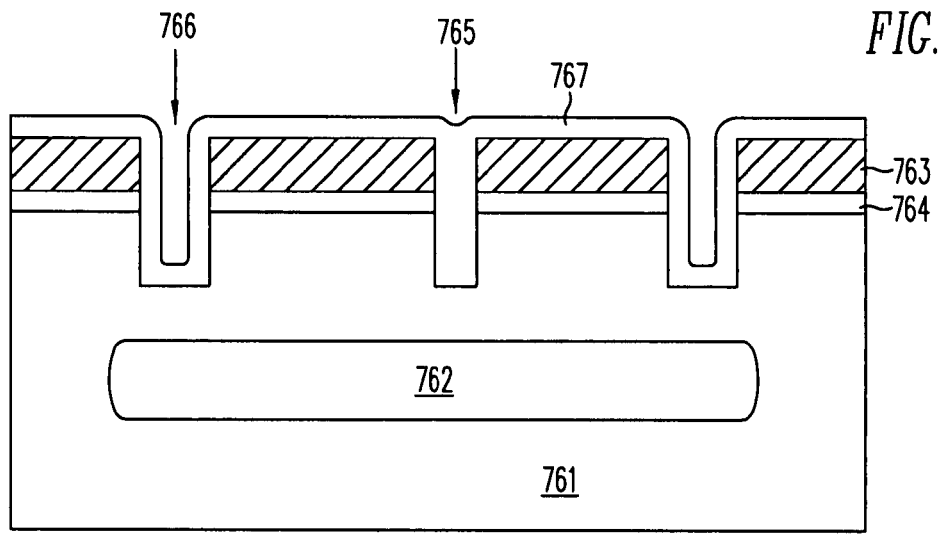

FIG. 25B shows the structure after deposition of a dielectric layer 767. The dielectric layer preferably has good conformality, for example a TEOS deposited oxide may be used. The deposition thickness is designed to completely refill narrow trenches 765, but only cover the sidewalls of wider trenches 766. In the example given here, a 0.3 micron thickness could be used to completely refill the 0.5 um wide shallow trenches 765 and form a 0.3 micron layer on each sidewall of the deep trenches 766, leaving a 0.4 micron wide space in the deep trenches 766.

Figure 25C:
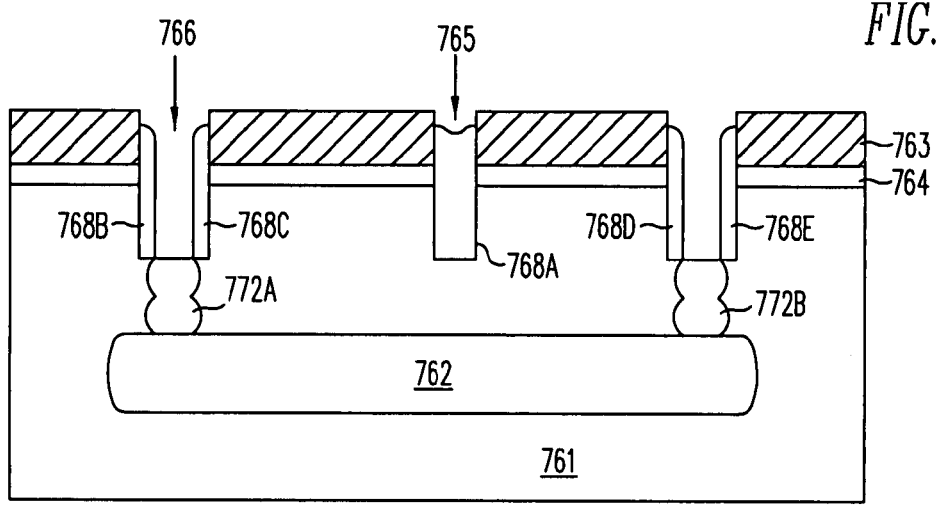

FIG. 25C shows the Type V structure after etchback of the dielectric layer 767. The etchback, preferably done by well-known reactive ion etching techniques, should entirely remove the dielectric 767 from the bottom of the wide trenches 766. In doing so, the dielectric 767 will likely also be removed from the surface, and the underlying mask layer 763 may also be etched, depending on the materials used and their relative etch rates. After this etchback step, sidewall dielectric layers 768B, 768C, 768D, and 768E remain in deep trenches 766, while shallow trenches 765 are completely filled by dielectric region 768A, which should extend above the original surface of substrate 761. Implantation of NI regions 772A and 772B is preferably done at this point so that these implants are self-aligned to and extend directly below trenches 766, without the need for an additional masking step. One or more implants are performed to provide a continuous region of N-type doping connecting the bottom of trenches 766 to DN region 762. Since these implants are performed directly into the trench bottom, the energy required is minimized, which provides a further benefit in that a high-current (high-dose) implant may be used to provide heavily-doped NI regions. Since these NI regions are fairly narrow, heavy doping is helpful in preventing punch-through. In alternative embodiments, NI region implants could be performed at a different stage of the process, such as before etchback of the dielectric layer 767 (as in FIG. 25B), and still retain their self-alignment.

Figure 25D:
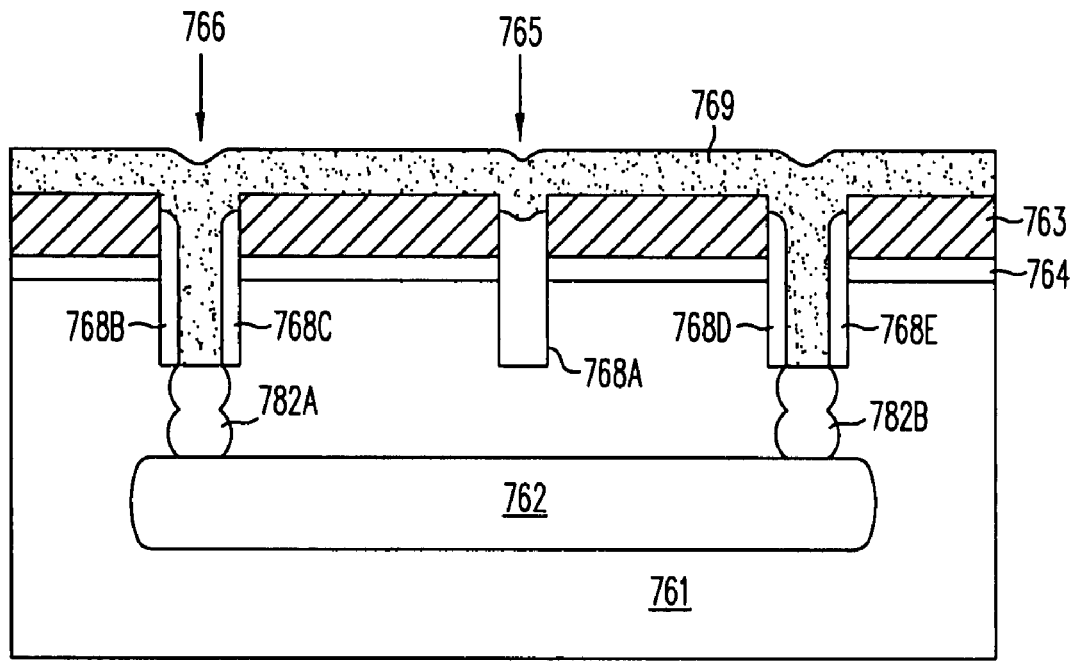

FIG. 25D shows the structure after deposition of a conductive layer 769, which is preferably highly conductive and conformal, such as in-situ doped polysilicon. The deposition thickness of layer 769 is designed to provide complete refill of deep trenches 766.

Figure 25E:
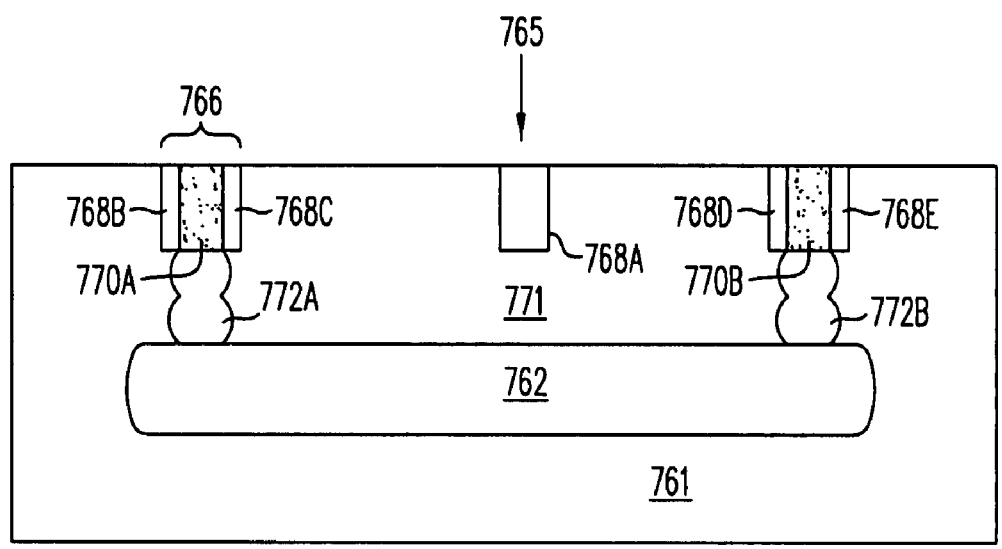

FIG. 25E shows the Type V isolation structure after planarization. In this example, the structure has been planarized back to the original surface of substrate 761. This is preferably accomplished by CMP and/or etchback processes. The final structure comprises isolated P-type region 771 which is isolated by DN region 762 on the bottom and by refilled trenches 766 in combination with NI regions 772A and 772B on the sides. Trenches 766 are filled by conductive material 770A and 770B which provide electrical contact to DN region 762 via conductive NI regions 772A and 772B. The conductive refill 770A and 770B is surrounded by dielectric 768B, 768C, 768D and 768E, such that it is isolated from P-type region 771 and substrate 761.

Type V isolation advantageously provides very compact electrical connections to the DN layer, via deep trenches with conductive refill. Moreover, the formation of these trenches shares many steps in common with the formation of standard STI isolation within each isolated P-type region, including trench masking and etching, dielectric deposition, and planarization steps, so there is little added process complexity to achieve the DN layer contact. A further benefit of this isolation structure is the self-alignment of the NI regions to the conductive trench fill, which minimizes the area consumed by eliminating misalignment problems, and also insures that the conductive layer is isolated from the substrate and isolated P-type region.

Figure 14A:
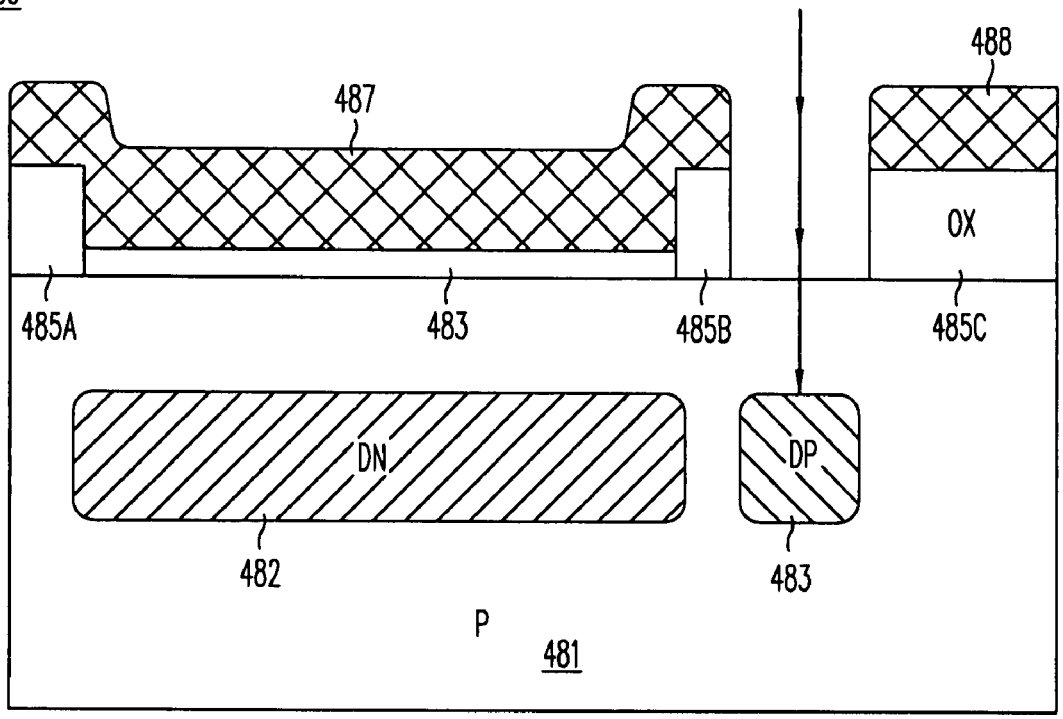
FIGS. 14A and 14B illustrate a Type II trench isolation process with implanted deep P region.

The formation of a deep P-type region DP, like many of the process operations described in this disclosure, may be performed prior to or subsequent to any of the other isolation processes. As illustrated in FIG. 14A, the formation of deep P-type region 483 uses high-energy ion implantation similar to the formation of DN region 482. P-type substrate 481 containing high-energy implanted DN floor isolation region 482 is masked by photoresist 488 and implanted with boron at a high energy to form DP region 483.

The DP process may use photoresist to define the implant, or etched thick oxide or a combination of both. For example in FIG. 14A, oxide layers 485A, 485B, and 485C represent oxide layers remaining from prior processing steps used in forming DN region 482. Photoresist layer 488 is first used to mask and etch through thick oxide layer 485 to form layers 485B and 485C. The photoresist must remain during implantation to prevent unwanted penetration of the boron through thin oxide layer 483 over the DN region 482. Alternatively, the oxide layers from previous processes may be removed and re-grown uniformly before masking and implantation of the DP region 483. If the re-grown oxide layer is thin, e.g. a few hundred angstroms, then a photoresist layer may need to be present during implantation. If the re-grown oxide layer is thick, e.g. several microns, then the oxide layer may be masked and etched and optionally the photoresist layer may be removed prior to implantation.

Figure 14B:
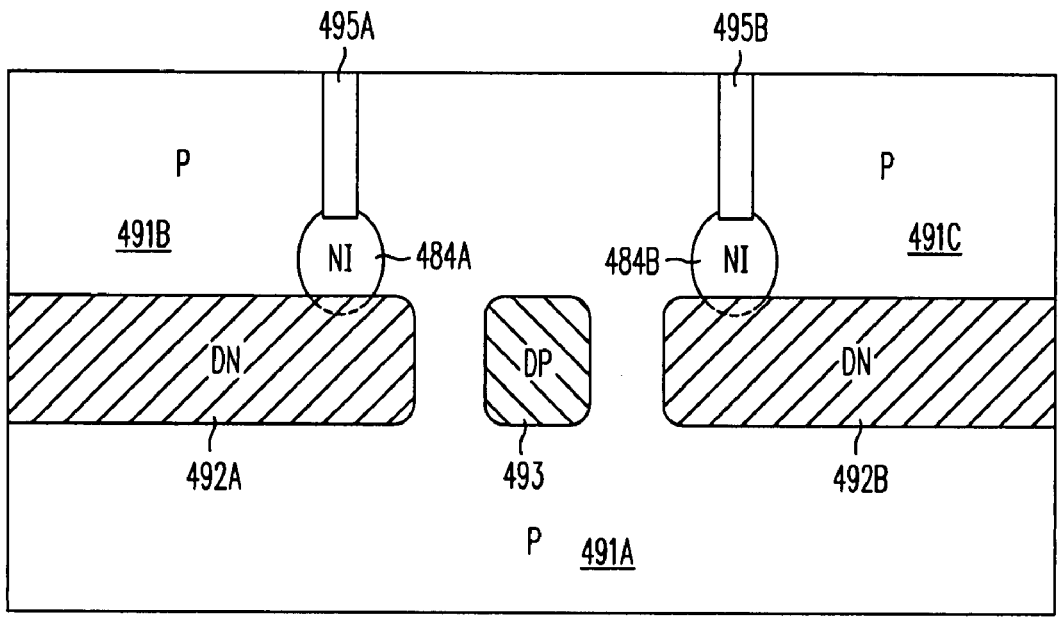

The resulting deep P-type region may be used to reduce the risk of punch-through breakdown between adjacent isolation regions. For example, the Type II isolation structure 490 in FIG. 14B includes DN regions 492A and 492B formed in P-type substrate 491A. Floor isolation DN region 492A is overlapped by NI sidewall isolation region 484A and NI sidewall isolation region 484A is overlapped by trench sidewall isolation 495A to form floating P-type region 491B. Similarly, floor isolation DN region 492B is overlapped by NI sidewall isolation region 484B and NI sidewall isolation region 484B is overlapped by trench sidewall isolation 495B to form floating P-type region 491C. In this example, DN layers 492A and 492B may potentially be biased to different potentials during operation. Their minimum spacing is reduced by the introduction of DP region 493, interposed between the two DN layers 492A and 492B. To understand this benefit, the impact of punch-through breakdown must be considered.

Figure 14C:
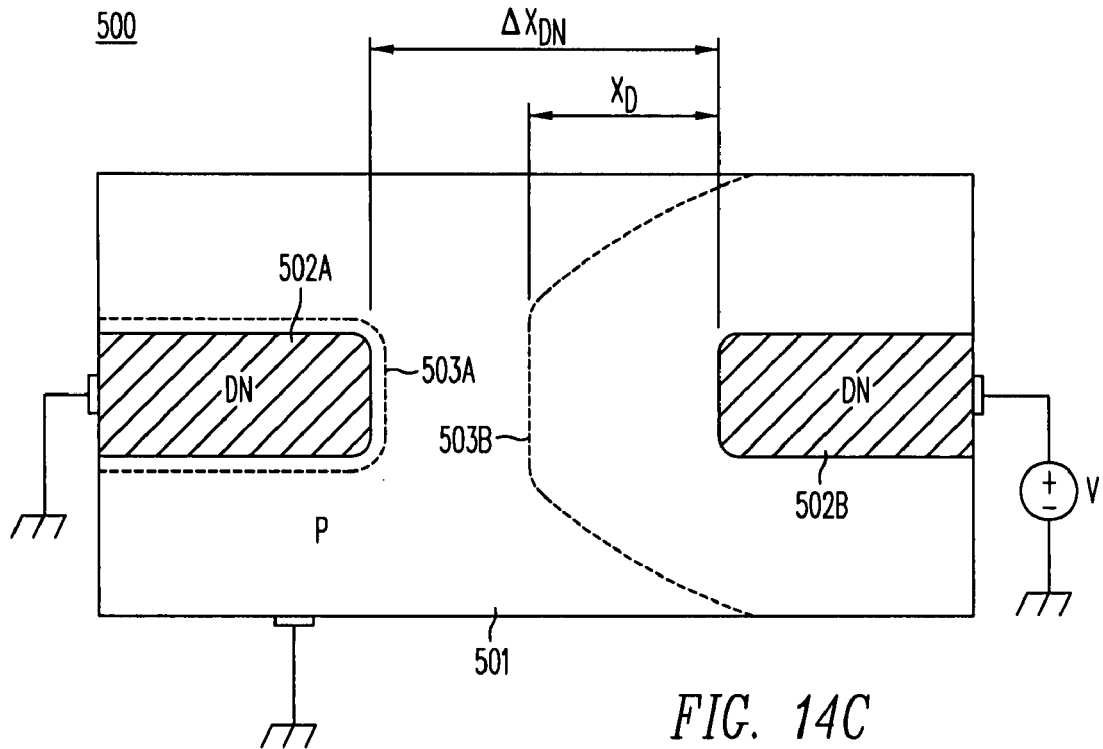
FIGS. 14C and 14D show the design rules of the device shown in FIGS. 14A and 14B with and without a deep P region.

In the cross-sectional view of FIG. 14C, two DN regions 502A and 502B are separated by P-type substrate 501 at a distance $\Delta x_{DN}$. Assume DN layer 502A and P-type substrate 501 are both grounded. With zero bias, only a small depletion region 503A develops around the P-N junction formed between the DN region 502A and the substrate 501. DN region 502B, however, is biased at a potential +V and thus forms a much wider depletion region 503B extending into the lightly-doped substrate side of the junction by a distance XD depending on the doping concentration of P-type substrate 501 and the applied voltage V. As long as the depletion region does not extend across the entire distance, i.e. $\Delta x_{DN} > x_D$, then no current will flow between the two DN regions 502A and 502B. As such, the two DN regions 502A and 502B may be considered isolated from one another. If however, the two DN regions 502A and 502B are placed too closely to one another, that is whenever $\Delta x_{DN} \approx x_D$, punch-through breakdown will occur and unwanted current will flow between the two DN regions 502A and 502B. Punch-through breakdown is not actually a breakdown mechanism, but represents a barrier lowering phenomena of an N-I-N junction and exhibits an increase of leakage having a "soft breakdown" current-voltage characteristic.

Figure 14D:
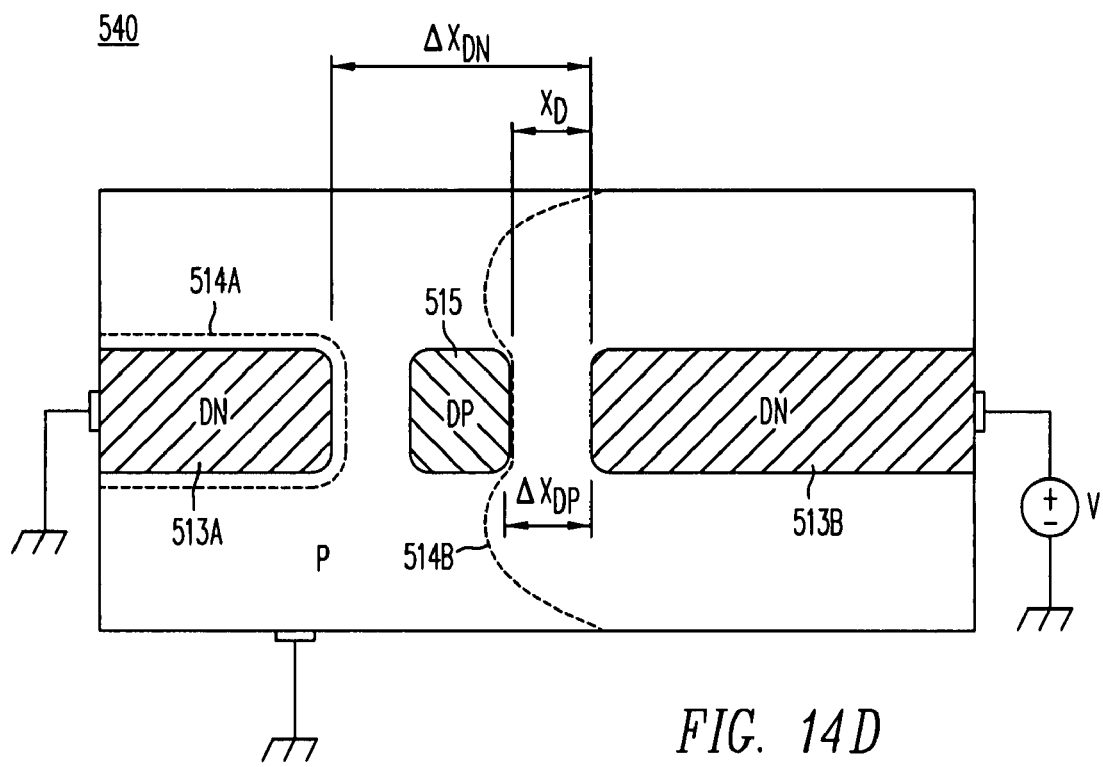

In FIG. 14D, grounded DN region 513A and P-type substrate 511 are separated from DN region 513B biased at a potential +V by a distance $\Delta x_{DN}$. P-type implanted DP region 515 having a concentration higher than that of substrate 511, is formed between the two DN regions 513A and 513B at a distance $\Delta x_{DP}$ from biased DN layer 513B. At the voltage where depletion region 514B extends to the edge of the DP region 515, i.e. $\Delta x_{DP} \approx x_D$, the depletion region becomes pinned to a fixed dimension. Beyond that condition, the electric field continues to increase with increasing potential, concentrating between the DP and DN regions, until at some voltage avalanche breakdown occurs. Since this P-I-N like junction reach-through avalanche occurs in the bulk, the electric field at breakdown occurs in the range of 25 MV/cm to 35 MV/cm—exhibiting avalanche at a voltage far higher than the onset of punch-through that would occur if DP region 515 were absent.

The DP region therefore suppresses punch-through breakdown and allows adjacent DN floor isolation regions 513A and 513B to be more closely packed without suffering high leakage and punch-through. This technique is generally applicable to all of the isolation structures described herein. Alternatively, a deep trench may be formed between adjacent DN regions to allow them to be closely packed without suffering high leakage and punch-through, as shown by way of example in FIG. 17 and FIG. 18.

Figure 15A:
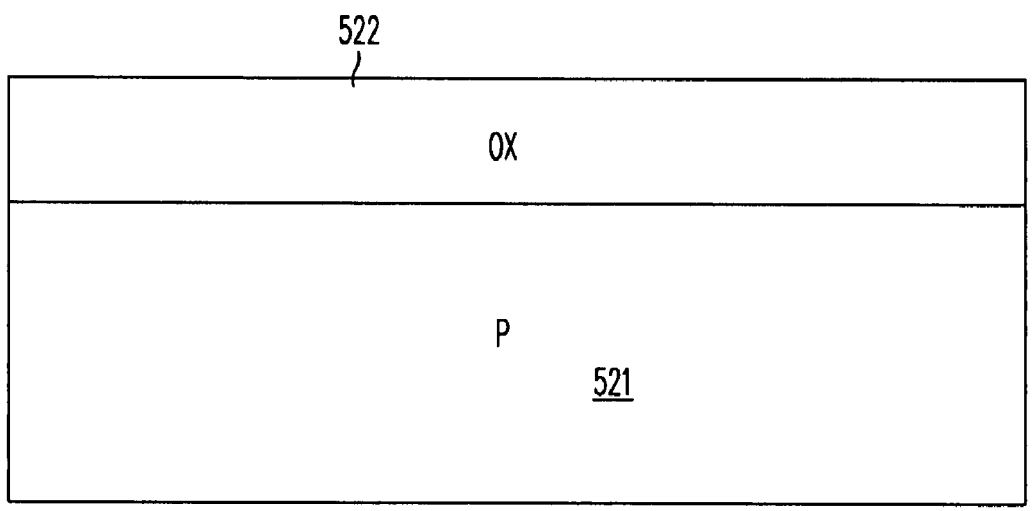
FIGS. 15A-15F illustrate an alternative Type-III trench isolation process.
Figure 15B:
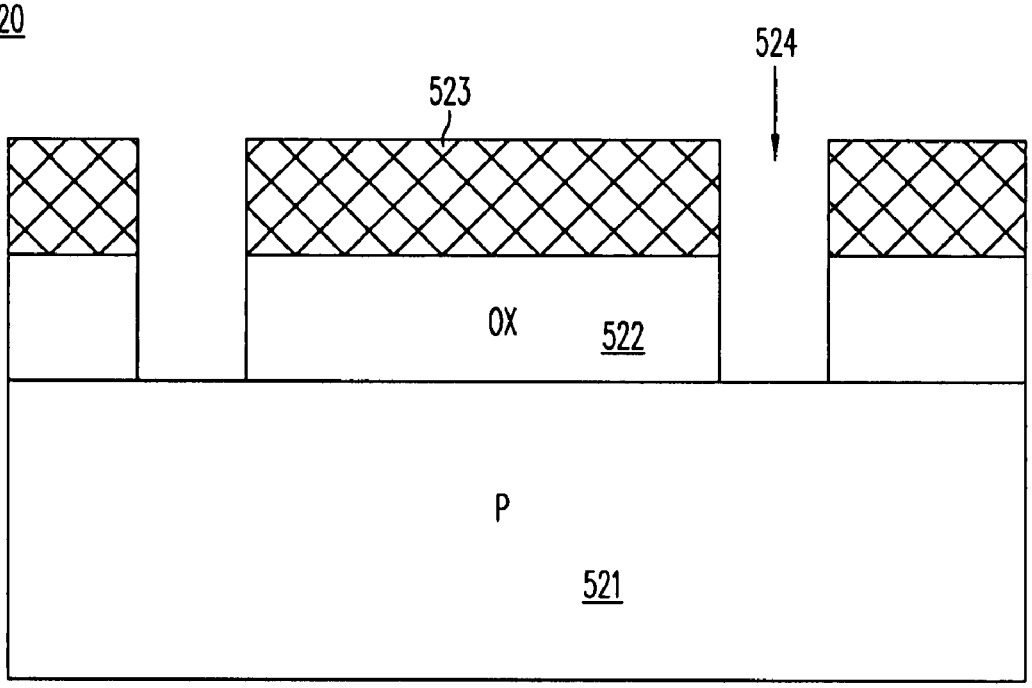
Figure 15C:
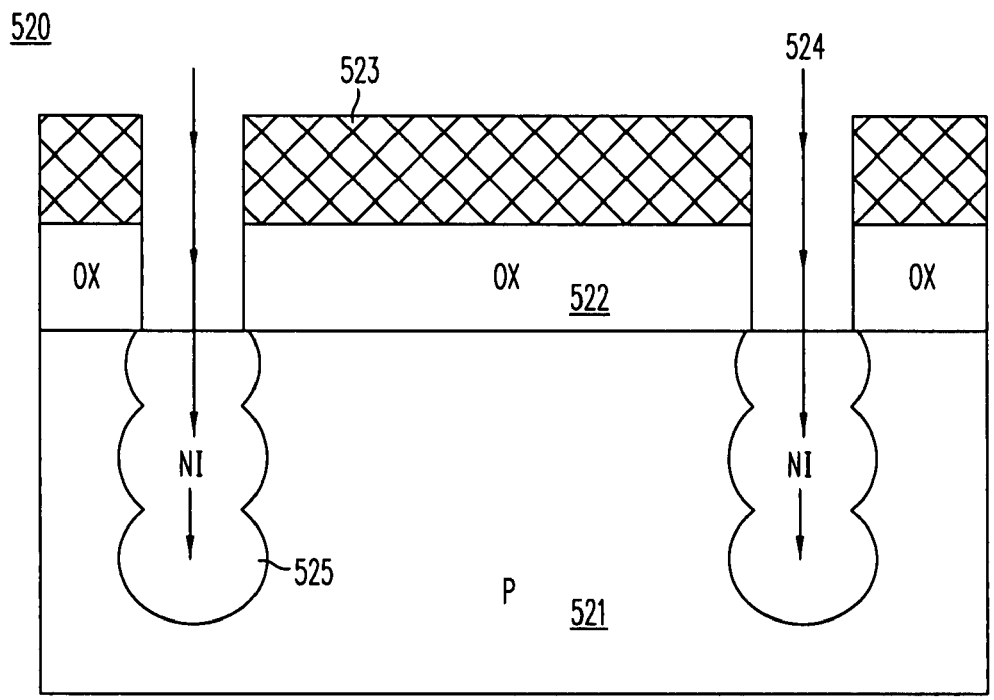

FIGS. 15A-15F illustrate that the sequence of the implants in the methods described herein may be re-ordered without substantially changing the resulting isolation structure. For example, in FIG. 15A, oxide layer 522 in grown atop P-type substrate 521, and subsequently masked by photoresist layer 523 and etched to form opening 524 as shown in FIG. 15B. A phosphorus chain-implant comprising a sequence of implants of varying doses and energies is then implanted through opening 524 to form NI sidewall isolation regions 525, as shown in FIG. 15C.

Figure 15D:
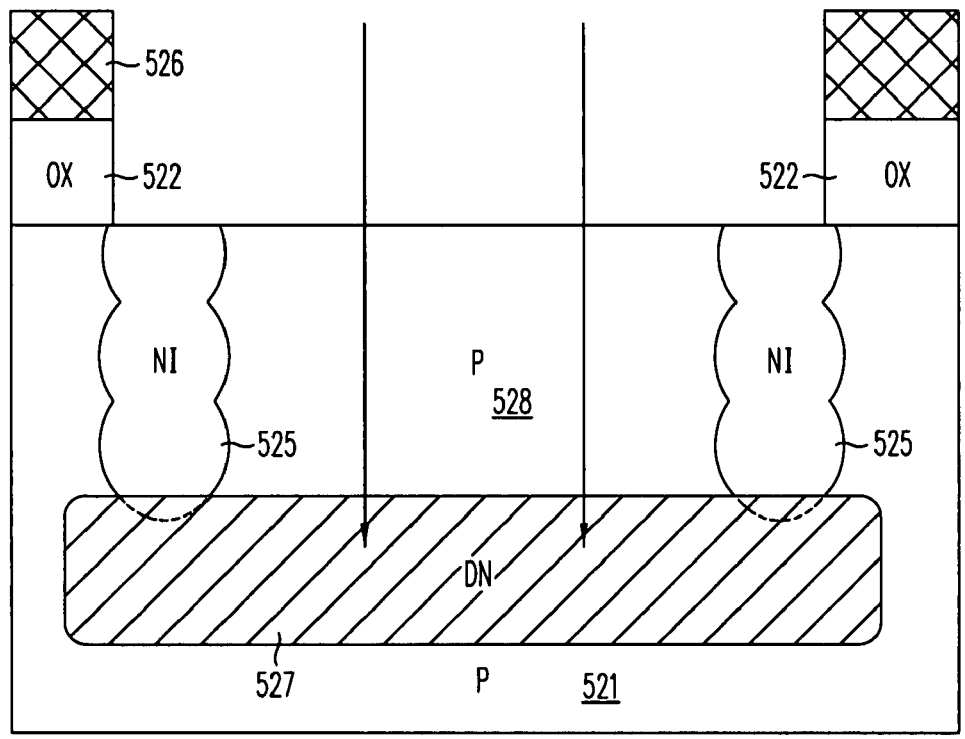
Figure 15E:
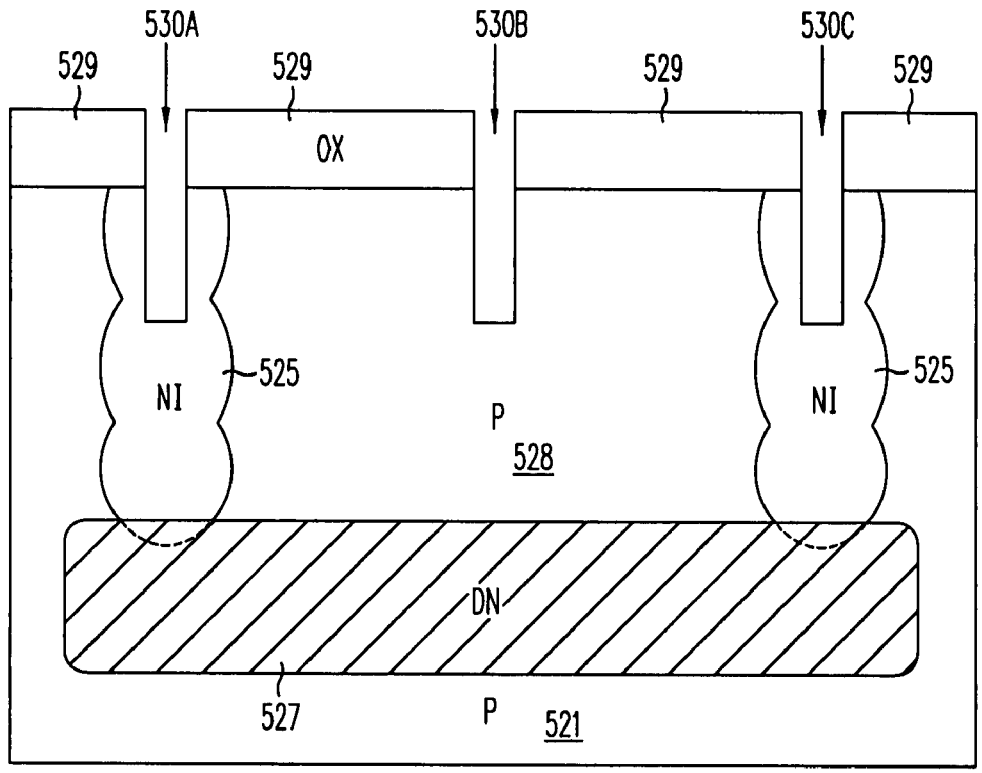
Figure 15F:
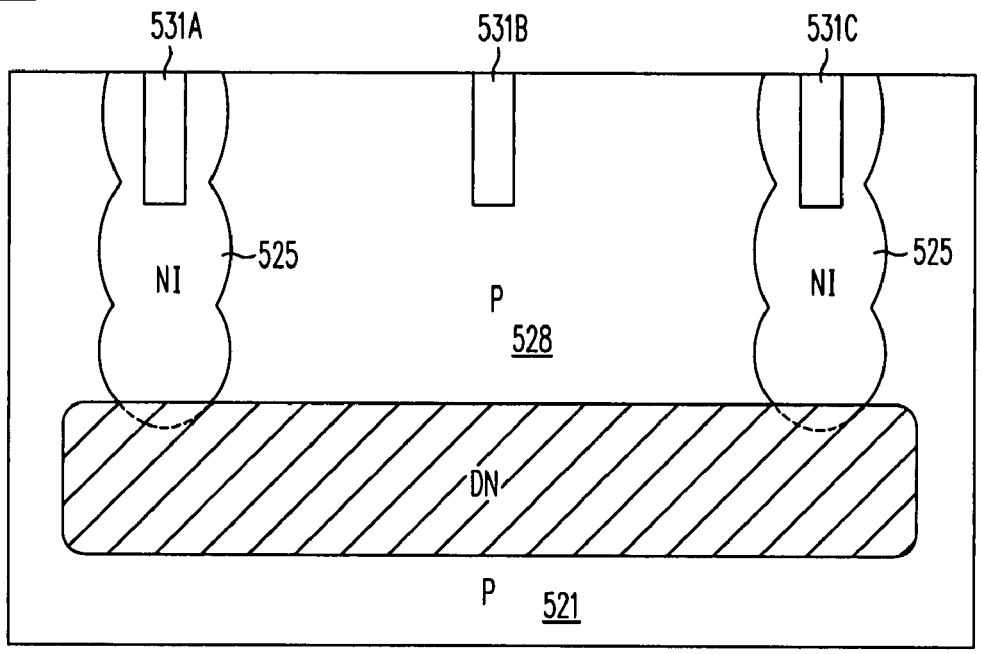

In FIG. 15D, oxide layer 522 is masked by a photoresist layer 526, and its center portion is removed, allowing a high energy implant to penetrate deep into substrate 521 to form DN floor isolation region 527, which is self-aligned to and overlapped by NI sidewall isolation regions 525, thereby isolating P-type region 528 from substrate 521. As shown in FIG. 15E, substrate 521 is then covered with an oxide layer 529, which is patterned to form openings 530A, 530B, and 530C. Substrate 521 is etched to form trenches 531A-531C. The trenches 531A-531C are filled with dielectric material and planarized, as shown in FIG. 15F. The resulting structure includes dielectric-filled trenches 531A and 531C located within NI sidewall isolation regions 525, and a dielectric-filled trench 531B within isolated region 528. It will be understood that other trenches, similar to 531B, could readily be formed during the same process in other regions of substrate 521. The resulting structure 520 is nearly identical to the structure 450 shown in FIG. 13D, despite its differing fabrication sequence.

While the resulting structure shown in FIG. 15F illustrates a Type III isolation structure, those skilled in the art can change the fabrication sequence of the other isolation processes in a similar manner with minimal impact electrically.

Figure 16:
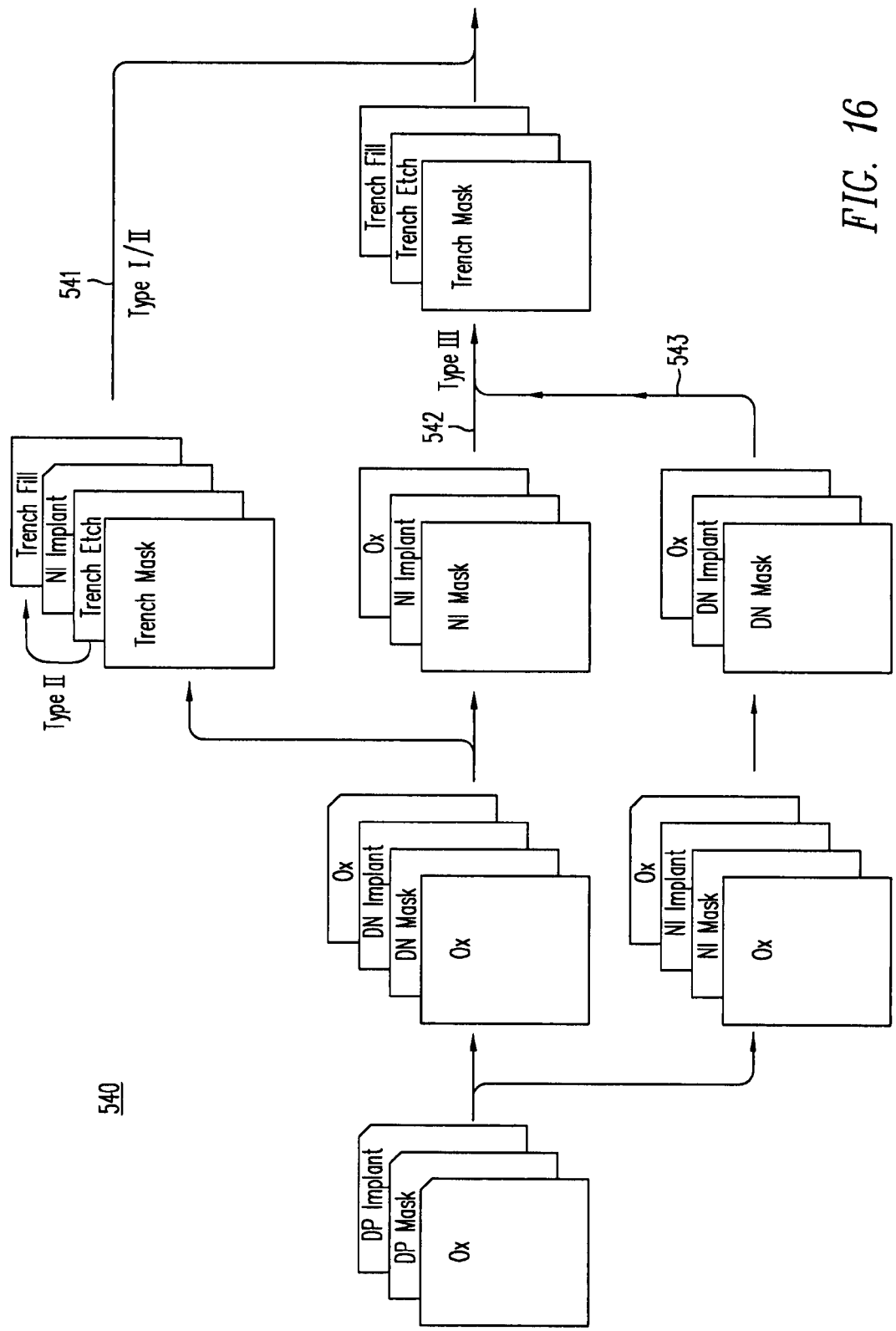
FIG. 16 illustrates various trench isolation processes.

This flexibility is exemplified by various process sequences illustrated in flow chart 540 shown in FIG. 16. In the flow chart 540, cards shown with clipped corners represent optional process steps. Process flow 541 is capable of implementing either Type I or Type II isolation, depending on whether the NI implant step is performed or skipped. Process flows 542 and 543 represent two different ways to implement Type III isolation.

It should be noted that not every possible process flow is represented in flow chart 540. For example, the DP region may be introduced after or before either the DN floor isolation implant and also before or after the NI isolation sidewall chain implant steps. In other options, deep trench steps may be included, a second shallow trench may be included, and some trenches may be filled with a combination of conductive and dielectric material.

While specific embodiments of this invention have been described, it should be understood that these embodiments are illustrative only, and not limiting. Many additional or alternative embodiments in accordance with the broad principles of this invention will be apparent to those of skill in the art.

We claim:

1. An isolation structure formed in a semiconductor substrate of a first conductivity type, the substrate not comprising an epitaxial layer, the structure comprising:
   a floor isolation region of a second conductivity type opposite to the first conductivity type submerged in the substrate;
   an annular trench extending downward from a surface of the substrate at least to the floor isolation region, walls of the trench being lined with a dielectric material, the trench containing a conductive material, the conductive material in the trench being in electrical contact with the floor isolation region, wherein the floor isolation region and trench together enclose an isolated pocket of the substrate;
   a second floor isolation region of the second conductivity type spaced apart laterally from the floor isolation region;
   a second annular trench extending downward from the surface of the substrate at least to the second floor isolation region, walls of the second annular trench being lined with the dielectric material, the second annular trench containing the conductive material, the conductive material in the second annular trench being in electrical contact with the second floor isolation region, wherein the second floor isolation region and second annular trench together enclose a second isolated pocket of the substrate; and
   a region of the first conductivity type located laterally between the floor isolation region and the second floor isolation region, a doping concentration of the region of the first conductivity type being greater than a doping concentration of the substrate.

2. The isolation structure of claim 1 further comprising a dielectric-filled trench located in the isolated pocket, a bottom of the dielectric-filled trench being located above the floor isolation region.

3. The isolation structure of claim 1 wherein the conductive material comprises doped polysilicon.

* * * * *